(12) United States Patent
Onuma et al.

(10) Patent No.: US 10,332,866 B2
(45) Date of Patent: Jun. 25, 2019

(54) LIGHT SOURCE DEVICE AND LIGHT EMITTING APPARATUS

(71) Applicant: SHARP KABUSHIKI KAISHA, Sakai, Osaka (JP)

(72) Inventors: Hiroaki Onuma, Sakai (JP); Makoto Matsuda, Sakai (JP); Kiyoto Gotoh, Sakai (JP); Toshio Hata, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/550,377

(22) PCT Filed: Feb. 4, 2016

(86) PCT No.: PCT/JP2016/053366
§ 371 (c)(1),
(2) Date: Aug. 11, 2017

(87) PCT Pub. No.: WO2016/129495
PCT Pub. Date: Aug. 18, 2016

(65) Prior Publication Data
US 2018/0076181 A1    Mar. 15, 2018

(30) Foreign Application Priority Data

Feb. 13, 2015 (JP) ................... 2015-026746

(51) Int. Cl.
*H01L 33/00* (2010.01)
*H01L 25/075* (2006.01)
(Continued)

(52) U.S. Cl.
CPC ........ *H01L 25/0753* (2013.01); *H01L 33/507* (2013.01); *H01L 33/508* (2013.01);
(Continued)

(58) Field of Classification Search
CPC .. H01L 25/0753; H01L 33/504; H01L 33/507
(Continued)

(56) References Cited

U.S. PATENT DOCUMENTS

2010/0142189 A1    6/2010  Hong et al.
2011/0221330 A1    9/2011  Negley et al.
(Continued)

FOREIGN PATENT DOCUMENTS

JP    H10-022525 A    1/1998
JP    2004-235546 A   8/2004
(Continued)

*Primary Examiner* — David S Blum
(74) *Attorney, Agent, or Firm* — ScienBiziP, P.C.

(57) ABSTRACT

There is provided a light source device which includes at least one kind of light emitting elements of which the number is one or more, and a phosphor excited by output light of the light emitting element. In a case where all light emitting elements mounted before the phosphor is mounted in the light source device emit light, the light source device has a peak wavelength of output light in a first wavelength region of longer than 440 nm and 490 nm or shorter, and has a peak wavelength of output light in a second wavelength region of 380 nm to 440 nm. Thus, it is possible to provide a light source device which can cause the white color, the dark-blue color, and the black color to simultaneously look vivid when an irradiation target (for example, clothes or the like) is irradiated.

6 Claims, 13 Drawing Sheets

(51) Int. Cl.
*H01L 33/50* (2010.01)
*H01L 33/54* (2010.01)
*F21Y 115/10* (2016.01)

(52) U.S. Cl.
CPC .......... *H01L 33/54* (2013.01); *F21Y 2115/10* (2016.08); *H01L 33/504* (2013.01)

(58) Field of Classification Search
USPC .......................................................... 257/89
See application file for complete search history.

(56) References Cited

U.S. PATENT DOCUMENTS

| | | |
|---|---|---|
| 2012/0300432 A1 | 11/2012 | Matsubayashi et al. |
| 2013/0249389 A1 | 9/2013 | Ishiwata et al. |
| 2015/0049459 A1 | 2/2015 | Peeters et al. |
| 2016/0149094 A1 | 5/2016 | Onuma et al. |

FOREIGN PATENT DOCUMENTS

| | | | | |
|---|---|---|---|---|
| JP | 2007-305703 A | | 11/2007 | |
| JP | 2010-209311 A | | 9/2010 | |
| JP | 2013-201274 A | | 10/2013 | |
| JP | 2014-107501 A | | 6/2014 | |
| JP | 2014107501 A | * | 6/2014 | ............ C09K 11/08 |
| WO | 2011/108203 A1 | | 9/2011 | |
| WO | 2013/150470 A1 | | 10/2013 | |
| WO | WO201420389 | * | 6/2014 | ............ H01L 33/48 |
| WO | 2014/203839 A1 | | 12/2014 | |

\* cited by examiner (a)

(b)

FIG. 3
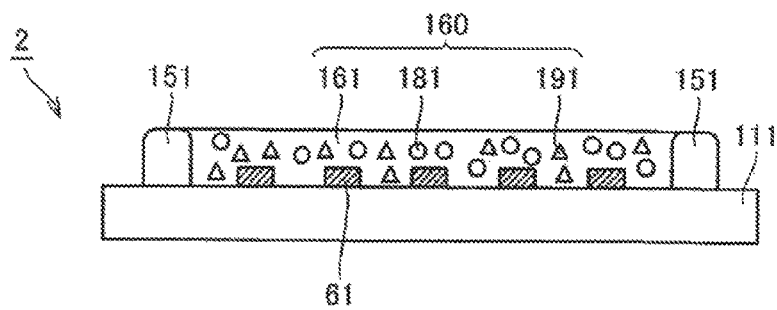
FIG. 4
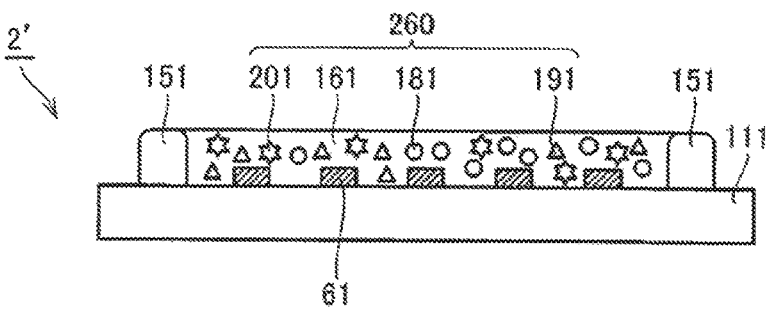
FIG. 5
(a)
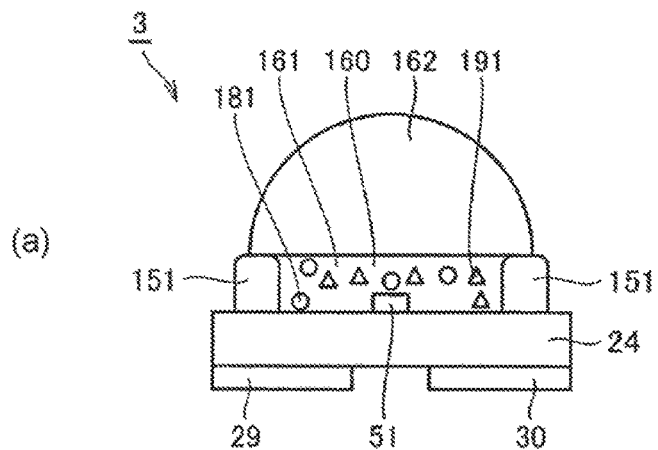
(b)
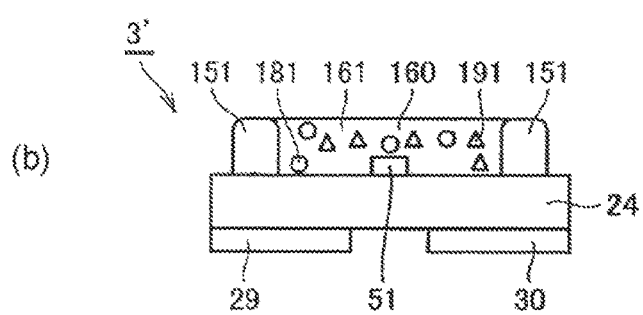

FIG. 8
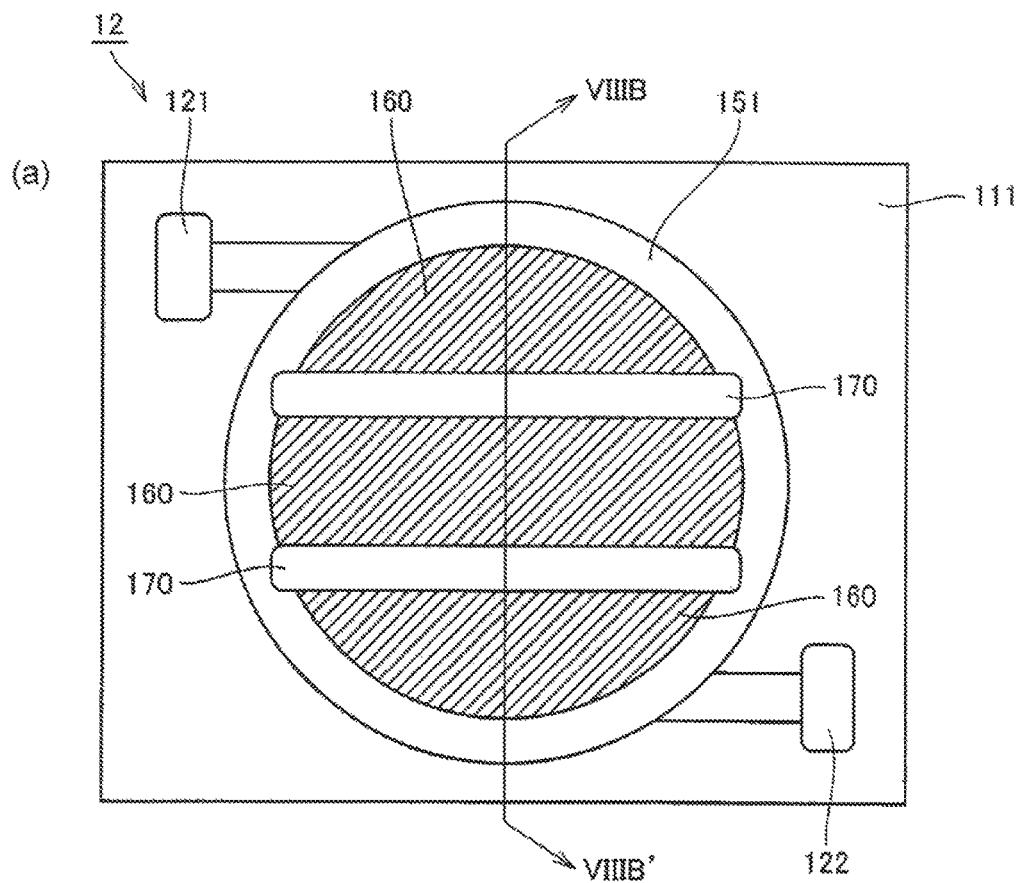
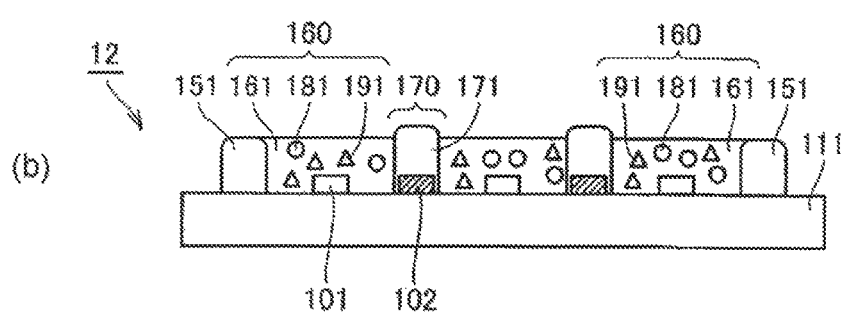

FIG. 10
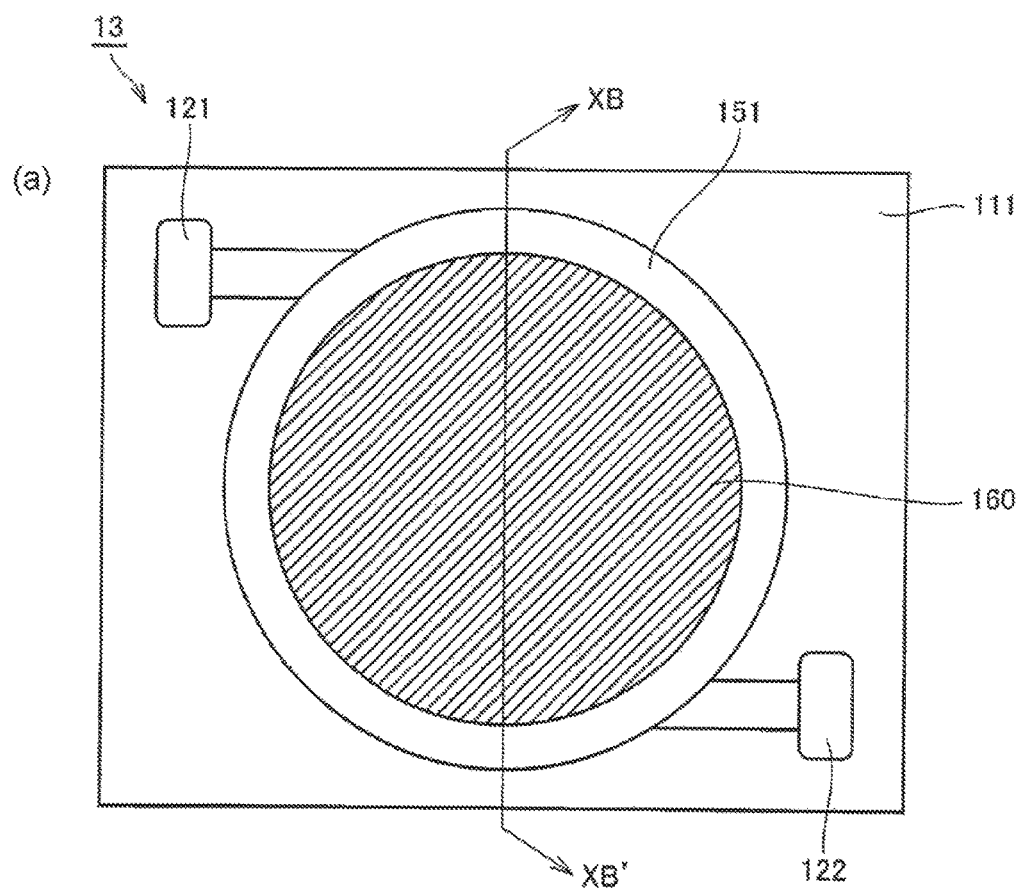
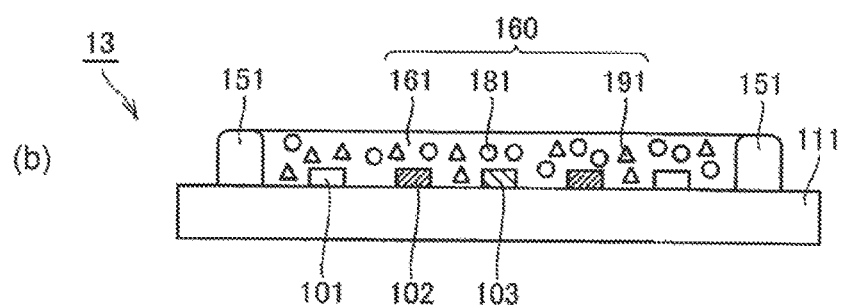

FIG. 12
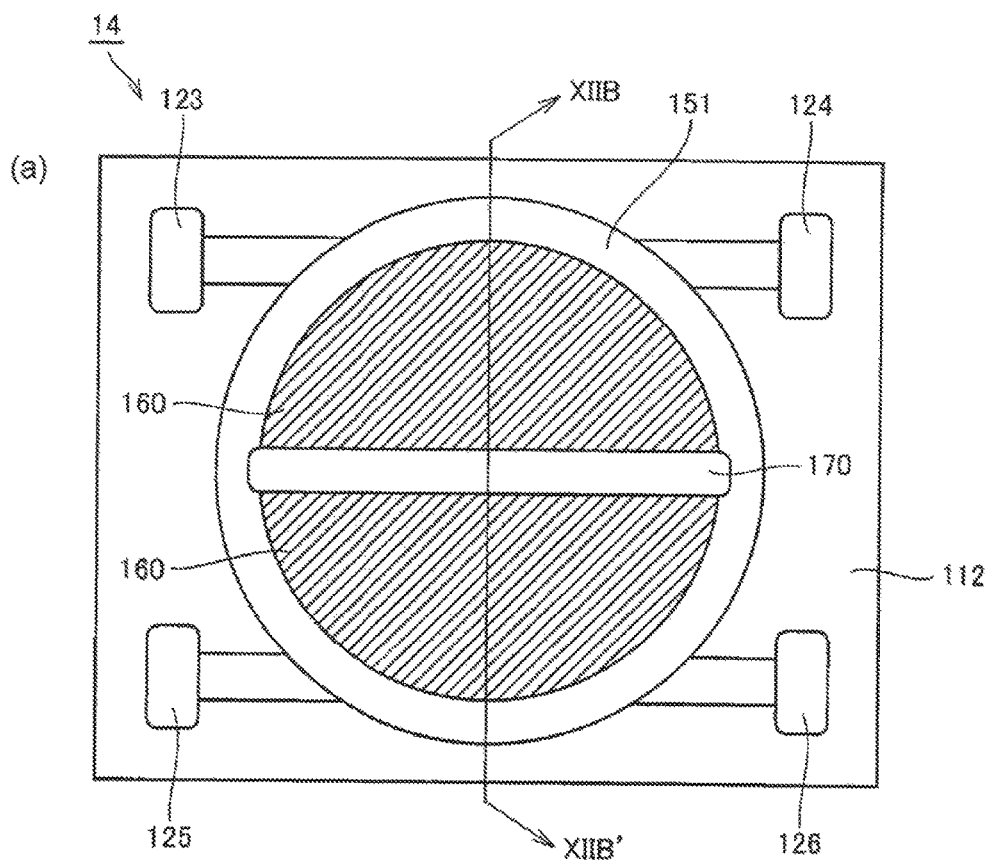
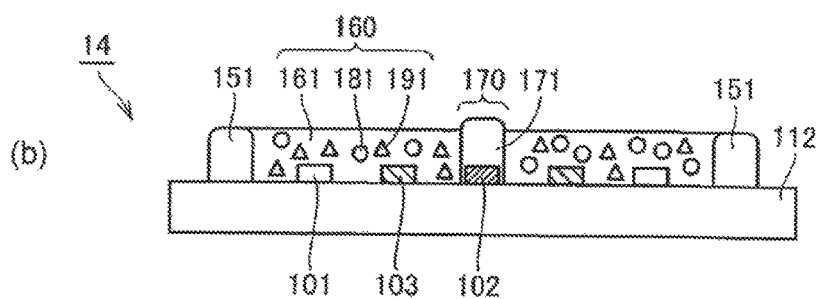

LIGHT SOURCE DEVICE AND LIGHT EMITTING APPARATUS

TECHNICAL FIELD

The present invention relates to a light source device and a light emitting apparatus including the light source device. In particular, the present invention relates to a light source device including a light emitting element (for example, light emitting diode (LED)) which is able to cause the color of an irradiation target to vividly appear.

BACKGROUND ART

A light source device including a light emitting element and a phosphor attracts attention as the next-generation light source device whose low power consumption, reduced size, high luminance, and wide-range color reproducibility are desired, and has been extensively researched and developed. Generally, primary light emitted from the light emitting element has a peak wavelength in a range of a near-ultraviolet region to a blue region. For example, the primary light has peak wavelength in a wavelength region of 380 nm to 490 nm. Light source devices which include various phosphors suitable for respective applications have also been proposed.

For example, a variety of light source devices to be used as a light source of an illumination apparatus have been researched and developed, and a lot of techniques for improving output performance of such a light source device are examined. Generally, a phosphor which has high visibility and has the main emission peak in a complementary color region of the blue (that is, yellow region, green region, or red region) is used for improving output performance of a light source device. It is required that a light source device usable as a light source of general illumination equipment have improved output performance and high color rendering properties ("having high color rendering properties" basically means that an average color rendering index Ra is equal to or greater than 80).

Here, the color rendering index is an index indicating a color shift which occurs when a light source which is a target of measuring the color rendering properties illuminates a color chip for color rendering evaluation. If the color rendering index is high, an occurrence of the color shift is small. That is, a light source which has a high color rendering index and is a measurement target emits light which is able to cause the color of an irradiation target to accurately appear. The color rendering index has R1 to R15 ratings and thus 15 kinds of color chips for color rendering evaluation are provided. The average color rendering index Ra is generally used as an index indicating the color rendering properties, and is an average value of color rendering indices R1 to R8 among color rendering indices R1 to R15.

Measures of improving tone of an irradiation target are provided in order to cause a light source device used as a light source of an illumination apparatus to satisfy the above requirements. For example, International Publication No. 2011/108203 (PTL 1) describes an LED lamp which includes an LED light source and a filter. The LED light source described in PTL 1 includes a blue LED, a green or yellow phosphor, and a red phosphor. The blue LED has the main emission peak in a wavelength region of 440 nm to 460 nm. The green or yellow phosphor is excited by light emitted from the blue LED. The red phosphor is excited by light emitted from at least one of the blue LED and the green or yellow phosphor. The filter described in PTL 1 reduces at least a portion of radiant intensity of light having a wavelength region of 570 nm to 590 nm emitted from the LED light source.

PTL 1 describes that by using the filter that reduces radiant intensity of light having a specific wavelength and the LED light source that includes red phosphor, it is possible to cause a neutral tint in PTL 1, the neutral tint is defined to be test colors of R1 to R8 at middle chroma) and vivid red color to look natural. However, the LED lamp described in PTL 1 includes the filter. Thus, the number of works in a production process of the LED lamp increases and production costs for the LED lamp increases. Since at least a portion of radiant intensity of light having a wavelength region of 570 nm to 590 nm is reduced by the filter, power efficiency of the illumination apparatus is reduced.

International Publication No. 2013/150470 (PTL 2) describes that it is possible to provide "dazzling white" by a light emitting module which includes a light emitting element that emits light having an emission peak in a wavelength region of 400 to 440 nm and a light emitting element that emits light having an emission peak in a wavelength region of 440 to 460 nm. The reason is because the light having an emission peak in a wavelength region of 400 to 440 nm excites a fluorescent agent adhering to clothes and thus blue light is emitted. That is, in a case where clothes or the like is irradiated with output light of the light emitting module in PTL 2, light reflected by the clothes or the like includes a blue-light component stronger than the output light of the light emitting module, and thus is caused to look whiter than the output light of the light emitting module.

CITATION LIST

Patent Literature

PTL 1: International Publication No. 2011/108203
PTL 2: International Publication No. 2013/150470

SUMMARY OF INVENTION

Technical Problem

However, in the light emitting module in PTL 2, light emission intensity in a wavelength region (blue region) of 440 to 460 nm is strong. Thus, if a dark-blue or black object (irradiation target) is irradiated with the output light of the light emitting module in PTL 2, light reflected by the dark-blue or black irradiation target is caused to look bluish. Thus, there is a problem in that the irradiation target is not viewed to be vivid dark-blue or black. The spectrum of output light of a light source (for example, halogen bulb and the like) using thermal radiation is close to the spectrum of light of the sun. Thus, if a dark-blue or black irradiation target is irradiated with output light of the light source, it is possible to view the irradiation target to be vividly dark-blue or black.

The similar situation may also occur in a case where the irradiation target is irradiated with output light of an LED in the related art. In a spectrum of output light of an illumination equipment which includes an LED in the related art as a light source, a peak shown in the blue region is significantly high in comparison to a spectrum of output light of a light source in the related art (for example, halogen bulb, high intensity discharge lamp, or the like). Thus, in a case of using the illumination equipment which includes an LED in the related art as a light source, the dark-blue or black irradiation target is viewed to be more bluish.

Thus, a light source device used, for example, for sales at products in a clothing industry has a demand to ensure brightness and a demand to put a high value on the method of viewing an irradiation target in many cases. For example, a lot of products having a white color, a dark-blue color, and a black color are produced in the clothing industry, and it is desirable that these colors simultaneously look vivid.

The white color, the dark-blue color, and the black color are not included in a test color used for evaluating the color rendering indices R1 to R15. Thus, in a method of evaluating the color rendering properties in the related art, evaluating the tone of an irradiation target is not possible in a case where the irradiation target is white, dark-blue, or black. Accordingly, a situation in which the tone of the irradiation target is not vivid even if the color rendering index is high may occur.

Although many fibers used for clothes are colored with a fluorescent agent, an influence of coloring by the fluorescent agent becomes weaker with time. However, since many laundry detergents include the fluorescent agent, the fluorescent agent adheres to clothes when the clothes are washed. Thus, in many cases, the fluorescent agent adheres to clothes. As the fluorescent agent, umbelliferon, bis(triazinyl amide)stilbene disulfonic acid, coumarin derivative, pyrazoline derivative, or the like is used.

Considering the above problems, an object of the present invention is to provide a light source device which is able to cause the white color, the dark-blue color, and the black color to simultaneously look vivid when an irradiation target (for example, clothes or the like) is irradiated.

Solution to Problem

According to the present invention, there is provided a light source device which includes at least one kind of light emitting elements of which the number is one or more, and a phosphor to be excited by output light of the light emitting element. The light source device according to the present invention has a peak wavelength of the output light in a first wavelength region of longer than 440 nm and 490 nm or shorter and has a peak wavelength of the output light in a second wavelength region of 380 nm to 440 nm, in a case where all of the light emitting elements which have been mounted therein before the phosphor is mounted emit light.

In the light source device according to the present invention, in a case where all of the light emitting elements which have been mounted therein before the phosphor is mounted emit light, a peak wavelength of the output light is preferably provided in a wavelength region of 460 nm to 490 nm in the first wavelength region of longer than 440 nm and 490 nm or shorter.

The light source device according to the present invention may have one or more peak wavelengths of the output light in each of two wavelength regions which are a region of longer than 440 nm and shorter than 460 nm and a region of 460 nm to 490 nm in the first wavelength region of longer than 440 nm and 490 nm or shorter, in a case where all of the light emitting elements which have been mounted therein before the phosphor is mounted emit light.

In a case where a difference between emission peak wavelengths in each of the wavelength regions is small, even if all of the light emitting elements which have been mounted therein before the phosphor is mounted emit light, there is a probability of not being able to observe emission peaks which are clearly separated from each other in each of the wavelength regions. Thus, integrated intensity in each of the wavelength regions in addition to an emission wavelength peak is an important index.

In order to achieve causing the color of an irradiation target to look vivid, as the purpose of this application, Characteristic A and Characteristic B which will be described later are preferably satisfied. That is, an emission spectrum is preferably obtained from all of the light emitting elements which have been mounted therein before the phosphor is mounted, so as to cause satisfying of Characteristic A and Characteristic B to be effective.

Thus, a spectrum of light emitted in a case where all of the light emitting elements mounted in the light source device according to the present invention are caused to turn on in a state where the phosphor is not sealed with a resin, preferably has the following Characteristic $\alpha$. It is more preferable that the spectrum has Characteristic $\beta$ in addition to Characteristic $\alpha$. This is because, although Characteristic A and Characteristic B are satisfied by a combination with another material such as a phosphor, Characteristic $\alpha$ and Characteristic $\beta$ are satisfied, and thus Characteristic A and Characteristic B are easily satisfied.

Characteristic $\alpha$: integrated intensity of light in a wavelength region of 380 nm to 440 nm is 3% to 200% with respect to integrated intensity of light in a wavelength region of longer than 440 nm and 490 nm or shorter. More preferably, the integrated intensity of light in the wavelength region of 380 nm to 440 nm is 5% to 100% with respect to the integrated intensity of light in the wavelength region of longer than 440 nm and 490 nm or shorter.

Characteristic $\beta$: a ratio of integrated intensity of light in a wavelength region of 460 nm to 490 nm to integrated intensity of light in a wavelength region of longer than 440 nm and shorter than 460 nm is 20% to 200%. More preferably, the ratio of the integrated intensity of light in the wavelength region of 460 nm to 490 nm to the integrated intensity of light in the wavelength region of longer than 440 nm and shorter than 460 nm is 30% to 100%.

For example, the light source device according to the present invention includes two kinds or more of light emitting elements which have peak wavelengths of output light, which are different from each other, and two kinds or more of phosphors which are excited by the output light of at least one kind of the light emitting element so as to emit light. The two kinds or more of the light emitting elements include one kind or more of light emitting element which has a peak wavelength of the output light in a first wavelength region of longer than 440 nm and 490 nm or shorter, and one kind or more of light emitting element which has a peak wavelength of the output light in a second wavelength region of 380 nm to 440 nm.

The one kind or more of the light emitting element having a peak wavelength of the output light in the first wavelength region preferably includes a light emitting element having a peak of output light in a wavelength region of 460 nm to 490 nm, and may include a light emitting element having a peak of output light in the wavelength region of 460 nm to 490 nm and a light emitting element having a peak of output light in a wavelength region of longer than 440 nm and shorter than 460 nm.

In a case where one kind of light emitting elements of which the number is plural are mounted, at least one light emitting element is preferably sealed by a resin layer including at least one kind of phosphors, and at least one light emitting element among the remaining light emitting elements may be sealed by a resin layer which does not include a phosphor.

In a case where two kinds or more of light emitting elements are provided, at least one kind of light emitting element is preferably sealed by a resin layer including at least one kind of phosphor, and at least one kind of light emitting element among the remaining light emitting elements may be sealed by a resin layer which does not include a phosphor. An input circuit of a signal for a second light emitting element (which will be described later) may be different from an input circuit of a signal for a light emitting element having a different kind from the second light emitting element.

As a method of achieving the above-described light emission characteristic, one kind of light emitting element having an emission peak in each of a plurality of wavelength regions may be used. Plural kinds of light emitting elements having one emission peak in a single wavelength region may be combined. A light emitting element having an emission peak in each of a plurality of wavelength regions and a light emitting element having one emission peak in a single wavelength region may be combined.

In a case where plural kinds of light emitting elements having one emission peak in a single wavelength region are combined, it is possible to more finely control an emission spectrum of the light source device by adjusting a combination of the light emitting elements, and it is easy to obtain an emission spectrum which is approximate to the desired emission spectrum.

In a case where one kind of light emitting element having an emission peak in each of a plurality of wavelength regions is used, the light source device is configured by one kind of light emitting element. Thus, there is an advantage in that it is possible to simplify the manufacturing process of the light source device.

In a light source device including a plurality of light emitting elements, a plurality of light emission points is provided in the light source device. In a case where a plurality of light emitting elements having different wavelengths is used, a probability that light having different intensity or a different color is emitted from the light emission points is high, and color irregularity easily occurs on an irradiation surface by a difference in the color or light emission intensity of emitted light at each of the light emission points, a difference in the distances between the light emission points (variation of a fixed position of a chip on a substrate), or the like. The influence varies depending on an optical system of illumination equipment such as a reflector or a lens. In particular, the influence is significantly applied to illumination equipment having a narrow irradiation angle. In a case of a light source device using one kind of light emitting element, which has an emission peak in each of a plurality of wavelength regions, all light emission points exhibit the same light emission characteristic. Thus, even in a case of a light source device in which light emitting elements having different wavelengths are simultaneously mounted, an optical design of illumination equipment is easily performed and an occurrence of luminance irregularity or color irregularity on an irradiation surface is easily suppressed. That is, light is emitted at a constant light quantity and a uniform light color from light emitting elements in the light source device, and thus light having high quality, that is, less frequent occurrence of luminance irregularity or color irregularity on the irradiation surface is obtained.

As described above, the light source device is configured by using one kind of light emitting element having an emission peak in each of the plurality of wavelength regions, and thus it is possible to obtain effects in that the manufacturing process is simplified and excellent optical characteristics are obtained without an occurrence of luminance irregularity or color irregularity because all of the light emitting elements in the light source device have the same characteristics.

Although the light emitting element generally exhibits emission of light in a single wavelength region, a light emitting element which is able to exhibit emission of light in a plurality of wavelength regions in a single light emitting element may be also provided. For example, an InGaN-based light emitting diode can exhibit emission of light in a plurality of wavelength regions in a single light emitting element. The InGaN-based light emitting diode includes a plurality of light-emitting layers in the structure thereof. The concentration of In in each of the light layers is adjusted, and thus it is possible to design a light emission wavelength from each of the light-emitting layers. The plurality of light-emitting layers is layered to be perpendicular to a light emission surface of the light emitting element. Thus, it is possible to obtain uniform light having no difference in a spectrum, on the light emission surface of the light emitting element. In this manner, it is possible to obtain a light emitting element having an emission peak in each of a plurality of wavelength regions, and it is possible to realize a light source device having a simpler manufacturing process or a light source device in which luminance irregularity or color irregularity occurs less frequently, by using the above light emitting element.

The spectrum of light emitted by the light source device according to the present invention preferably has the following Characteristic A and the following Characteristic B.

Characteristic A: a ratio of integrated intensity of light in a wavelength region of 380 nm to 430 nm to integrated intensity of light in a wavelength region of 380 nm to 780 nm is equal to or greater than 2%.

Characteristic B: a ratio of integrated intensity of light in a wavelength region of 460 nm to 490 nm to integrated intensity of light in a wavelength region of longer than 440 nm and shorter than 460 nm is equal to or greater than 100%.

The present invention also provides a light emitting apparatus including the light source device according to the present invention. The light emitting apparatus in the present invention includes an illumination apparatus, a backlight apparatus, or the like.

Advantageous Effects of Invention

According to the present invention, it is possible to cause the white color, the dark-blue color, and the black color to simultaneously look vivid when an irradiation target (for example, clothes or the like) is irradiated.

BRIEF DESCRIPTION OF DRAWINGS

FIG. 3 is a cross-sectional view illustrating a light source device 2 according to Embodiment 2 of the present invention.

FIG. 4 is a cross-sectional view illustrating a light source device 2' of a modification example in Embodiment 2 illustrated in FIG. 3.

FIG. 5(a) is a cross-sectional view illustrating a light source device 3 according to Embodiment 3 of the present invention, and FIG. 5(b) is a cross-sectional view illustrating a light source device 3' of a modification example of FIG. 5(a).

FIG. 1(b) is a cross-sectional view taken along line VIB-VIB' illustrated in FIG. 6(a).

FIG. 8(a) is a plan view illustrating a light source device 12 according to Embodiment 5 of the present invention, and FIG. 8(b) is a cross-sectional view taken along line VIIIB-VIIIB' illustrated in FIG. 8(a).

FIG. 10(a) is a plan view illustrating a light source device 13 according to Embodiment 6 of the present invention, and FIG. 10(b) is a cross-sectional view taken along line XB-XB' illustrated in FIG. 10(a).

FIG. 12(a) is a plan view illustrating a light source device 14 according to Embodiment 7 of the present invention, and FIG. 12(b) is a cross-sectional view taken along line XIIB-XIIB' illustrated in FIG. 12(a).

DESCRIPTION OF EMBODIMENTS

Figure 1:
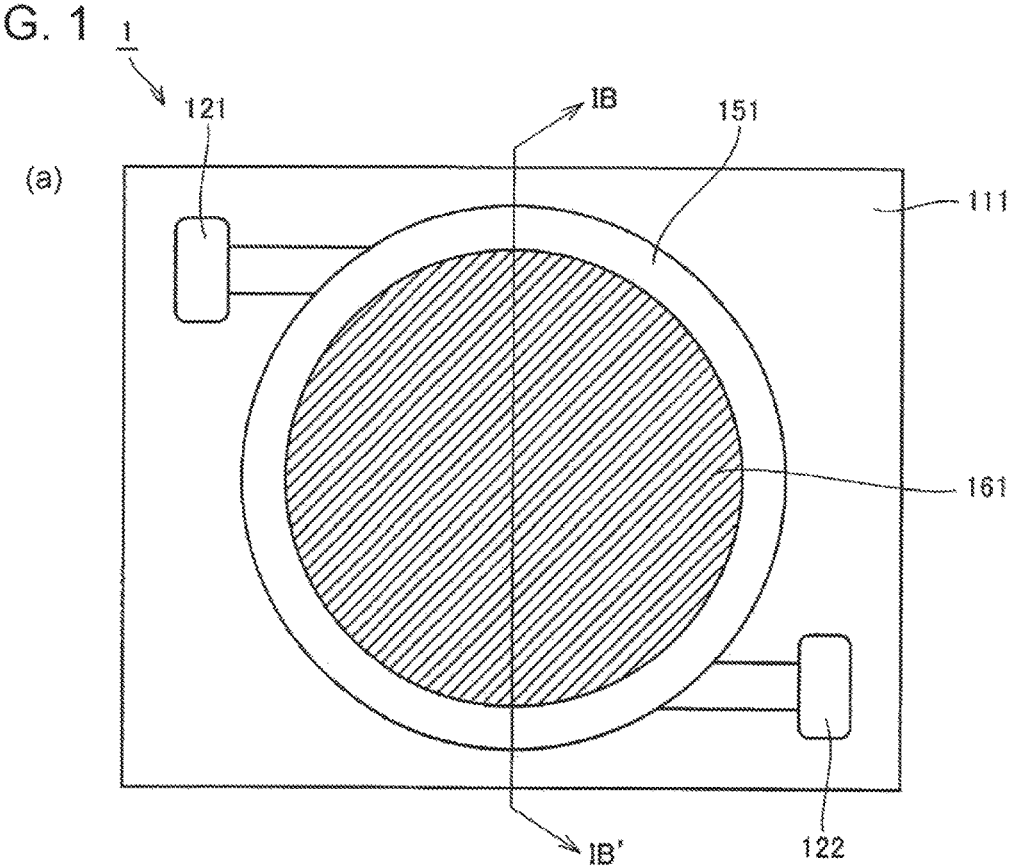
FIG. 1(a) is a plan view illustrating a light source device 1 according to Embodiment 1 of the present invention.
FIG. 1(b) is a cross-sectional view taken along line IB-IB' illustrated in FIG. 1(a).

Hereinafter, the present invention will be described with reference to the drawings. In the drawings of the present invention, the same reference sign indicates the same portion or the corresponding portion. Dimension relationships of the length, the width, the thickness, the depth, and the like are appropriately changed for clarifying and simplifying the Illustrations and do not indicate practical dimension relationships.

Embodiment 1

[Configuration of Light Source Device]

FIG. 1(a) is a plan view illustrating a configuration of a light source device 1 according to Embodiment 1 of the present invention. FIG. 1(b) is a cross-sectional view taken along line IB-IB illustrated in FIG. 1(a).

A light source device 1 in the embodiment includes a substrate 111, a light emitting element 51, a dam ring (resin frame) 151, and a resin layer including a phosphor (in the following descriptions, simply described as "a first phosphor-containing resin layer) 160. The light emitting element 51 exhibits emission of light having a plurality of emission peaks which have peak wavelengths of output light, which are different from each other.

The substrate 111 is preferably a substrate formed of ceramics and preferably has a shape of a rectangle in plan view. The light emitting element 51, the dam ring (resin frame) 151, and the first phosphor-containing resin layer 160 are provided on one surface of the substrate 111 (in the following descriptions, described as "an upper surface of the substrate 111"). Further, a first electrode land 121 and a second electrode land 122 are provided on the surface thereof.

The dam ring 151 is a member configured to define an appearance of the first phosphor-containing resin layer 160 (the first phosphor-containing resin layer 160 includes resin 161, a green phosphor 181, and a red phosphor 191). The dam ring 151 functions as a dam (damming member) for preventing leakage of the resin 161 to an outside of the dam ring 151 when the first phosphor-containing resin layer 160 is formed.

The first electrode land 121 and the second electrode land 122 are provided on the outside of the dam ring 151 in the upper surface of the substrate 111. Preferably, the first electrode land 121 and the second electrode land 122 are provided at the corner of the upper surface of the substrate 111. More preferably, the electrode lands are provided on a diagonal line of the substrate 111. Each of the surfaces of the first electrode land 121 and the second electrode land 122 is exposed, and thus the first electrode land 121 and the second electrode land 122 are allowed to be connected to an external terminal. That is, one of the first electrode land 121 and the second electrode land 122 functions as an anode electrode for external connection and the other thereof functions as a cathode electrode for the external connection.

(Light Emitting Element)
(Arrangement Form and Connection Form)

The light emitting element 51 is preferably an LED and more preferably an LED chip. It is preferable that light emitting elements 51 are electrically connected to each other through a wire (not illustrated). The wire is preferably connected to the first electrode land 121 and the second electrode land 122. Thus, external power applied from the external terminal to the first electrode land 121 or the second electrode land 122 is supplied to the light emitting elements 51 through the wire. Accordingly, the light emitting element 51 emits light.

The arrangement form of the light emitting elements 51 is not particularly limited. However, it is preferable that the light emitting elements 51 are arranged at an equal interval in a region surrounded by the dam ring 151 on the upper surface of the substrate 111. Thus, it is possible to reduce the occurrence of luminance irregularity of an irradiation surface, which occurs by light emitted from the light source device 1. Accordingly, it is possible to maintain high optical characteristics of the light source device 1.

As described above, the arrangement form of the light emitting elements 51 is not particularly limited. However, it is necessary that the light emitting elements 51 are arranged so as to show a peak in a wavelength region of 380 nm to 440 nm in the emission spectrum of the light source device 1.

The connection form of the light emitting elements 51 is not particularly limited. However, in a case where an element row is configured by connecting the light emitting elements 51 in series and a plurality of element rows is formed, it is preferable that the light emitting elements 51 are electrically connected so as to cause the number of series connections of the light emitting elements 51 in one row to be the same as that in another row. Thus, an equivalent current (current value is the same) can flow in all light emitting elements included in the light source device 1. Accordingly, it is possible to maintain high optical characteristics of the light source device 1.

(Optical Characteristics of Light Emitting Element)

In the light source device 1, in a case where all of the light emitting elements 51 mounted before the phosphor is mounted emit light, the light emitting elements 51 have a peak wavelength of output light in two wavelength regions and have a peak of the output light in a wavelength region of 460 nm to 490 nm and in a wavelength region of 380 nm to 440 nm (for example, the peak wavelength of the output light is 470 nm and 405 nm). That is, each of the light emitting elements 51 is preferably a light emitting diode. Thus, at least a portion of the output light of the light emitting elements 51 constitutes a portion (for example, blue component) of light (for example, white light) from the light source device 1.

In addition, the output light of the light emitting elements 51 also includes a light emission component in a wavelength region of 380 nm to 440 nm. Here, as will be described later, a light emitting element in which the peak wavelength of output light is in a wavelength region of 380 nm to 440 nm, generally includes a light emission component in a wavelength region of 430 nm or shorter. Thus, the output light of the light emitting elements 51 is able to excite a fluorescent agent adhering to clothes. Since light from the light source device 1 includes the output light, of the light emitting elements 51, the light from the light source device 1 allows whiteness of the clothes to significantly appear.

As described above, the light source device 1 includes the light emitting element 51 as a light emitting element which has a peak wavelength of output light in a wavelength region (first wavelength region) of longer than 440 nm and 490 nm or shorter and in a wavelength region (second wavelength region) of 380 nm to 440 nm.

A portion of the output light of the light emitting elements 51 excites green phosphors 181 so as to generate green light (peak wavelength is longer than 490 nm and 580 nm or shorter). A portion of the remainder of the output light of the light emitting elements 51 excites red phosphors 191 so as to generate red light (peak wavelength is longer than 580 nm and 780 nm or shorter). That is, the portion of the output light of the light emitting elements 51 constitutes a green component of light (for example, white light) from the light source device 1 by the green phosphors 181. A portion of the remainder of the output light of the light emitting elements 51 constitutes a red component of the light (for example, white light) from the light source device 1 by the red phosphors 191.

Light having a peak wavelength of 460 nm has visibility which is about 58% higher than that of light having a peak wavelength of 450 nm (generally, output light of a blue LED). Thus, if light having a peak wavelength of 460 nm is used, it is possible to maintain high visibility of blue light even if peak intensity of a peak in a blue region (wavelength region of 380 nm to 490 nm) in the spectrum of white light, in comparison to a case where light having a peak wavelength of 450 nm is used. For example, in a case where the correlated color temperature of light emitted by the light source device 1 is 3000 K, it is possible to maintain high visibility of blue light even if integrated intensity of the light in a wavelength region of 460 nm to 490 nm is larger than integrated intensity of the light in a wavelength region of longer than 440 nm and shorter than 460 nm in the spectrum of the light emitted by the light source device 1. Thus, if a lower limit value of a peak wavelength of light in the first wavelength region in the output light of the light emitting elements 51 is set to 460 nm, it is possible to suppress the occurrence of a situation in which a dark-blue or black irradiation target is viewed to be more bluish, in a state of maintaining the high color rendering properties. Accordingly, it is preferable that the lower limit value of the peak wavelength of light in the first wavelength region in the output light of the light emitting elements 51 is 460 nm. More preferably, the lower limit value of the peak wavelength of light in the first wavelength region in the output light of the light emitting elements 51 is 465 nm.

An upper limit value of a wavelength of light which is caused to look blue in a single color is 490 nm. Thus, it is preferable that the upper limit value of the peak wavelength of the output light of the light emitting elements 51 is 490 nm. More preferably, the upper limit value of the peak wavelength of the output light of the light emitting elements 51 is 480 nm.

The lower limit value of a wavelength of light which is caused to look blue in a single color is 380 nm. Thus, it is preferable that the lower limit value of the peak wavelength of the output light of the light emitting elements 51 is 380 nm.

Regarding the fluorescent agent adhering to clothes, excitation characteristics of light become better as the wavelength of the light is shorter. An upper limit value of a wavelength of light which is able to excite the fluorescent agent is 430 nm. Absorption intensity on a short wavelength side from 400 nm as a boundary is increased. Here, generally, a light emitting element sufficiently includes light emission components in a wavelength region of ±(half width) based on the peak wavelength of output light thereof as the center. In a light emitting element having a peak wavelength of output light in a wavelength region of 380 nm to 490 nm, the half width is equal to or greater than 10 nm. Thus, the light emitting element having a peak wavelength of output light in a wavelength region of 380 nm to 490 nm sufficiently includes light emission components in at least a wavelength region of ±10 nm based on the peak wavelength as the center. For example, a light emitting element in which the peak wavelength of output light is 430 nm and the half width thereof is 12 nm sufficiently includes light emission components in a wavelength region of 418 nm to 442 nm. With the above descriptions, from a viewpoint in that a first light emitting element 51 sufficiently includes a light emission component (light emission component in a wavelength region of 430 nm or shorter) which is able to excite a fluorescent agent adhering to clothes, it is preferable that the upper limit value of the peak wavelength of the output light in the second wavelength region of the light emitting elements 51 is 440 nm. Since the absorption intensity of the fluorescent agent is stronger on the wavelength side which is shorter than 400 nm, it is more preferable that the upper limit value of the peak wavelength in the second wavelength region in the output light of the light emitting elements 51 is 410 nm. The half width means a half width of a peak (emission peak of a light emitting element) of output light of the light emitting element.

The light source device 1 may further include a light emitting element having a peak of output light in a wavelength region of longer than 440 nm and shorter than 460 nm, as the light emitting element having a peak wavelength of output light in the first wavelength region.

Preferably, in a case where all of the light emitting elements mounted in the light source device 1 are caused to turn on in a state where the phosphor is not sealed by resin, it is preferable that the characteristics and the number of the light emitting elements and mounting arrangement of the light emitting elements are selected so as to satisfy Characteristic α and Characteristic β which are described above. Thus, it is easy to satisfy Characteristic A and Characteristic B, and it is possible to achieve causing the color of an irradiation target to look vivid, as the purpose of this application.

(First Phosphor-Containing Resin Layer)

The first phosphor-containing resin layer 160 includes the resin 161, the green phosphor 181, and the red phosphor 191. The first phosphor-containing resin layer 160 is preferably formed in a manner that a region surrounded by the dam ring 151 on the upper surface of the substrate 111 is filled with the resin 161, the green phosphor 181, and the red phosphor 191, and then the resin 161 is cured. The first phosphor-containing resin layer 160 is preferably provided so as to bury the light emitting elements 51 which are arranged in the region surrounded by the dam ring 151 on the upper surface of the substrate 111. That is, in the embodiment, the light emitting elements 51 are sealed all together by the first phosphor-containing resin layer 160. In this specification, "being sealed all together" means being sealed by the same resin.

The resin 161 included in the first phosphor-containing resin layer 160 is preferably resin having excellent light-transmitting properties. More preferably, the resin 161 is resin which is able to transmit the output light of the light emitting elements 51, green light emitted by the green phosphor 181, and red light emitted by the red phosphor 191. The resin 161 is not particularly limited as long as the resin 161 is resin able to be used as a sealing resin which is included in a resin-sealed type light source device. For example, it is preferable that the resin 161 is dimethyl-based silicone resin, phenyl-based silicon resin, epoxy resin, or the like.

The green phosphor 181 is preferably β type SiAlON which has activated bivalent europium. The red phosphor 191 is preferably $Sr_xCa_{1-x}AlSiN_3:Eu^{2+}$. The green phosphor 181 and the red phosphor 191 are not limited thereto and may be phosphors described below. It is preferable that a combination of a light emitting element and a phosphor is selected so as to obtain the optimum condition considering the excitation characteristics of the phosphor.

The first phosphor-containing resin layer 160 may include only one of the green phosphor 181 and the red phosphor 191. Two kinds or more of green phosphors 181 may be used as the green phosphor 181 and two kinds or more of red phosphors 191 may be used as the red phosphor 191. However, if the first phosphor-containing resin layer 160 includes one kind or more of green phosphors 181 and one kind or more of red phosphors 191, the light source device 1 can function as a white light source device.

(Green Phosphor)

The green phosphor 181 is a phosphor which is excited by the output light of the light emitting element 51 so as to emit light of a green color. For example, the green phosphor 181 is preferably the following (1) to (7). Any one of the following (1) to (7) may be used as the green phosphor 181 or a combination of two or more of the following (1) to (7) may be used.

(1) β type SiAlON represented by a general formula of $Eu_{a1}Si_{b1}Al_{c1}O_{d1}N_{e1}$ (0.001≤a1≤0.2) (oxynitride phosphor which has activated bivalent europium)

(2) Phosphor which is represented by $(MI)_{3-x2}Ce_{x2}(MII)_5O_{12}$ (MI indicates at least one of Lu, Y, La, and Gd. MII indicates at least one of Al and Ga. 0.005≤x2≤0.3) and has a garnet type crystal structure (oxide phosphor which has activated trivalent cerium)

(3) Phosphor represented by $(MIII)_{2-x3}Eu_{x3}SiO_4$ (MIII indicates at least one of Mg, Ca, Sr, and Ba. 0.005≤x3≤0.4) (silicate phosphor which has activated bivalent europium)

(4) Phosphor represented by $(MIII)_{3-x4}Ce_{x4}(MIV)_2Si_3O_{12}$ (MIII indicates at least one of Mg, Ca, Sr, and Ba. MIV indicates at least one of Li, Na, K, Cs, Rb, Mg, Ca, Ba, Al, Ga, In, Sc, Y, La, Gd, and Lu. 0.005≤x4≤0.3) (silicate phosphor which has activated trivalent cerium)

(5) Phosphor represented by $(MI)_{3-x5}Ce_{x5}Si_6N_{11}$ (MI indicates at least one of Lu, Y, La, and Gd. 0.005≤x5≤0.2) (nitride phosphor which has activated trivalent cerium)

(6) Phosphor represented by $(MV)_{1-a6}Eu_{a6}Mg_{1-x6}Al_{10-y6}Mn_{x6+y6}O_{17}$ (MV indicates at least one of Sr and Ba. 0.005≤a6≤0.2, 0.005≤x6+y6≤0.2) (aluminate phosphor which has bivalent europium and bivalent manganese which have been activated)

(7) Phosphor represented by $(MV)_{3-a7}Eu_{a7}Si_6O_{12}N_2$ (MV indicates at least one of Sr and Ba. 0.005≤a7≤0.2) (silicate phosphor which has bivalent europium and bivalent manganese which have been activated)

(Red Phosphor)

The red phosphor 191 is a phosphor which is excited by the output light of the light emitting element 51 so as to emit light of a red color. For example, the red phosphor 191 is preferably the following (11) to (15). Any one of the following (11) to (15) may be used as the red phosphor 191 or a combination of two or more of the following (11) to (15) may be used.

(11) Phosphor represented by $(MIII)_{1-x11}Eu_{x11}(MVI)SiN_3$ (MIII indicates at least one of Mg, Ca, Sr, and Ba. MVI indicates at least one of Al, Ga, In, Sc, Y, La, Gd, and Lu. 0.005≤x11≤0.2) (nitride phosphor which has activated bivalent europium)

(12) Phosphor represented by $(MIII)_{2-x12}Eu_{x12}Si_5N_8$ (MIII indicates at least one of Mg, Ca, Sr, and Ba. 0.005≤x12≤0.2) (nitride phosphor which has activated bivalent europium)

(13) α type SiAlON represented by $Eu_f(MVII)_gSi_hAl_iO_jN_k$ (MVII indicates at least one of Li, Na, K, Rb, Cs, Mg, Ca, Sr, Ba, Sc, Y, La, and Gd. 0.001≤f≤0.2) (oxynitride phosphor which has activated bivalent europium)

(14) Phosphor represented by $(MVIII)_2((MIX)_{1-x14}Mn_{x14})F_6$ (MVIII indicates at least one of Li, Na, K, Rb, and Cs. MIX indicates at least one of Ge, Si, Sn, Ti, and Zr. 0.005≤x14≤0.3) (fluoride metal salt phosphor which has activated tetravalent manganese)

(15) Phosphor represented by $(MX)_{2-x15}Eu_{x15}O_{3-y15}S_{y15}$ (MX indicates at least one of Y, La, and Gd. $0.005 \leq x15 \leq 0.4$, $0.0 \leq y15 \leq 2.0$) (sulfate phosphor which has activated trivalent europium)

(Blue Phosphor)

Figure 2:
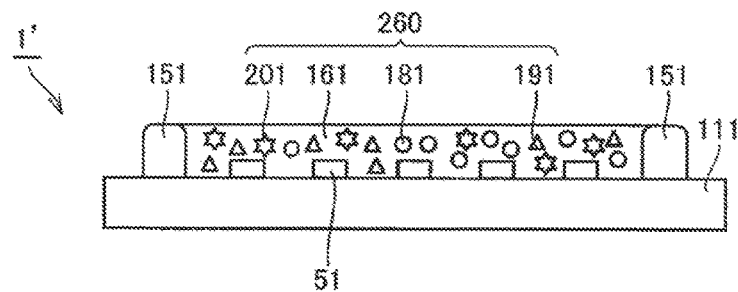
FIG. 2 is a cross-sectional view illustrating a light source device 1' of a modification example in Embodiment 1 illustrated in FIG. 1.

FIG. 2 is a cross-sectional view illustrating a light source device 1' of a modification example in Embodiment 1. As illustrated in FIG. 2, a light source device 1' in Embodiment 1 may use a second phosphor-containing resin layer 260 instead of the first phosphor-containing resin layer 160. The second phosphor-containing resin layer 260 further includes a blue phosphor 201 in addition to the resin 161, the green phosphor 181, and the red phosphor 191. In order to improve the color rendering properties of the light source device 1', it is advantageous that the spectrum of light emitted by the light source device 1' has a broad band. Here, the spectrum of output light of the light emitting element has a band broader than that of the emission spectrum of the phosphor. Thus, it is easy to improve the color rendering properties of the light source device 1' by using the blue phosphor 201. The fact that the second phosphor-containing resin layer 260 may be used instead of the first phosphor-containing resin layer 160 will also be described in each embodiment which will be described later.

The blue phosphor 201 is a phosphor excited by the light emitting element 51 so as to emit blue light. The blue phosphor 201 may be halophosphorus oxide which is represented by the following (21) and has activated bivalent europium. The blue phosphor 201 may be aluminum oxide which is represented by the following (22) and has activated bivalent europium. The blue phosphor 201 may be nitride which is represented by the following (23) and has activated trivalent cerium. Any one of the following (21) to (23) may be used as the blue phosphor 201 or a combination of two or more of the following (21) to (23) may be used.

(21) Phosphor represented by $(MXI)_{5-x21}Eu_{x21}(PO_4)_3(MXII)$ (MXI indicates at least one of Ca, Sr, and Ba. MXII indicates at least one of F, Cl, and Br. $0.1 \leq x21 \leq 1.5$) (phosphorus oxide phosphor which has activated bivalent europium)

(22) Phosphor represented by $(MXIII)_{1-a22}Eu_{a22}MgAl_{10}O_{17}$ (MXIII indicates at least one of Sr and Ba. $0.005 \leq a22 \leq 0.2$) (aluminum oxide phosphor which has activated bivalent europium)

(23) Phosphor represented by $(MI)_{1-x23}Ce_{x23}Si_3N_5$ (MI indicates at least one of Lu, Y, La, and Gd. $0.005 \leq x23 \leq 0.2$) (nitride phosphor which has activated trivalent cerium)

[Optical Characteristics of Light Source Device]

As described above, the light source devices 1 and 1' include the light emitting elements 51. Thus, blue light saving high visibility in blue light is included as a portion of a blue component of light (for example, white light) emitted by the light source devices 1 and 1'. Thus, even in a case where the maximum intensity of the blue component included in the light emitted by the light source devices 1 and 1' is reduced to be small, it is possible to maintain the high color rendering properties of the light source devices 1 and 1'. Accordingly, it is possible to view a dark-blue or black irradiation target to be vividly dark-blue or black. If clothes are irradiated with light emitted by the light source devices 1 and 1', the fluorescent agent adhering to the clothes is excited to emit light. Thus, it is possible to view the clothes to be white more vividly.

As described above, since the light source devices 1 and 1' include the light emitting elements 51, if an irradiation target (for example, clothes or the like) is irradiated with light emitted by the light source devices 1 and 1', it is possible to cause the white color, the dark-blue color, and the black color to simultaneously look vivid.

Preferably, the spectrum of light emitted by the light source devices 1 and 1' has the following Characteristic A and the following Characteristic B. Thus, if an irradiation target (for example, clothes or the like) is irradiated with light emitted by the light source devices 1 and 1', it is possible to cause the white color, the dark-blue color, and the black color to simultaneously look more vivid. The spectrum of light emitted by the light source devices 1 and 1' is measured by using a commercial visible ultraviolet absorption photometer. Thus, it can be checked whether or not the spectrum of light emitted by the light source devices 1 and 1' has the following Characteristic A and the following Characteristic B.

Characteristic A: a ratio of integrated intensity of light in a wavelength region of 380 nm to 430 nm to integrated intensity of light in a wavelength region of 380 nm to 780 nm is equal to or greater than 2%.

Characteristic B: a ratio of integrated intensity of light in a wavelength region of 460 nm to 490 nm to integrated intensity of light in a wavelength region of longer than 440 nm and shorter than 460 nm is equal to or greater than 100%.

(Characteristic A)

"Integrated intensity of light in a wavelength region of 380 nm to 780 nm" means the area (total area of peaks in a case where two peaks or more are shown in the wavelength region) of a peak shown in the wavelength region of 380 nm to 780 nm in the spectrum of light, emitted by the light source devices 1 and 1'. In this specification, the area of a peak means the area of a region surrounded by a peak and a baseline, that is, means a peak area after baseline correction.

Similarly, "integrated intensity of light in a wavelength region of 380 nm to 430 nm" means the area (total area of peaks in a case where two peaks or more are shown in the wavelength region) of a peak shown in the wavelength region of 380 nm to 430 nm in the spectrum of light emitted by the light source devices 1 and 1'.

The integrated intensity can be obtained in a manner that the spectrum of light emitted by the light source devices 1 and 1' is measured by using the commercial visible ultraviolet absorption photometer and baseline correction is performed on the obtained spectrum. In a case where the ratio of the integrated intensity of light in the wavelength region of 380 nm to 430 nm to the integrated intensity of light in the wavelength region of 380 nm to 780 nm is equal to or greater than 2%, Characteristic A is satisfied. The ratio is more preferably equal to or greater than 3%, and further preferably equal to or greater than 4%. The ratio is preferably equal to or smaller than 30%.

(Characteristic B)

"Integrated intensity of light in a wavelength region of longer than 440 nm and shorter than 460 nm" means the area (total area of peaks in a case where two peaks or more are shown in the wavelength region) of a peak shown in the wavelength region of longer than 440 nm and shorter than 460 nm in the spectrum of light emitted by the light source devices 1 and 1'.

Similarly, "integrated intensity of light in a wavelength region of 460 nm to 490 nm" means the area (total area of peaks in a case where two peaks or more are shown in the wavelength region) of a peak shown in the wavelength region of 460 nm to 490 nm in the spectrum of light emitted by the light source devices 1 and 1'.

The integrated intensity can be obtained in a manner that the spectrum of light emitted by the light source devices 1 and 1' is measured by using the commercial visible ultraviolet absorption photometer and baseline correction is performed on the obtained spectrum. In a case where the ratio of the integrated intensity of light in the wavelength region of 460 nm to 490 nm to the integrated intensity of light in the wavelength region of longer than 440 nm and shorter than 460 nm is equal to or greater than 100%, Characteristic B is satisfied. The ratio is preferably equal to or smaller than 500%, and more preferably equal to or smaller than 300%.

[Evaluation Method of Light Source Device]

An evaluation method of the light source devices 1 and 1' includes a process of determining whether or not the light source devices 1 and 1' have Characteristic A and Characteristic B, a process of evaluating the light source device to have fair quality in a case where it is determined that the spectrum of light emitted by the light source devices 1 and 1' has Characteristic A and Characteristic B. The light source device which is evaluated to have fair quality has Characteristic A and Characteristic B. Thus, if an irradiation target (for example, clothes and the like) is irradiated with light emitted by the light source device which is evaluated to have fair quality, it is possible to cause the white color, the dark-blue color, and the black color to simultaneously look more vivid.

[Application of Illumination Apparatus, Backlight Apparatus, or the Like to Light Emitting Apparatus]

Since the light source devices 1 and 1' have the optical characteristics, the light source devices 1 and 1' can be used as a light source of a light emitting apparatus (examples of the light emitting apparatus include an illumination apparatus or a backlight apparatus). That is, the light emitting apparatus in the embodiment includes the light source devices 1 and 1'. Thus, it is possible to provide the light emitting apparatus such as an illumination apparatus or a backlight apparatus, which has the optical characteristics. In the illumination apparatus or the backlight apparatus in the embodiment, components other than a light source device can be used without being limited to a configuration of a known illumination apparatus or a known backlight apparatus in the related art.

Embodiment 2

In Embodiment 2 according to the present invention, as illustrated in FIG. 3, a light source device 2 includes one kind of light emitting element 61 which has emission peaks in three kinds of wavelength regions. In the following descriptions, difference from Embodiment 1 will be mainly described.

The light source device 2 in the embodiment includes a substrate 111, a light emitting element 61, a dam ring (resin frame) 151, and a resin layer including a phosphor (in the following descriptions, simply described as "a first phosphor-containing resin layer) 160. The light emitting element 61 exhibits emission of light having a plurality of emission peaks which have different peak wavelengths of output light from each other.

(Light Emitting Element)
(Arrangement Form and Connection Form)

The light emitting element 61 is preferably an LED and more preferably an LED chip, similarly to the light emitting element 51 in Embodiment 1. It is preferable that light emitting elements 61 are electrically connected to each other through a wire (not illustrated). The wire is preferably connected to the first electrode land 121 and the second electrode land 122. Thus, external power applied from the external terminal to the first electrode land 121 or the second electrode land 122 is supplied to the light emitting elements 61 through the wire. Accordingly, the light emitting element 61 emits light.

The arrangement form of the light emitting elements 61 is not particularly limited. The connection form of the light emitting elements 61 is not particularly limited. However, it is preferable that the light emitting elements 61 are arranged at an equal interval in a region surrounded by the dam ring 151 on the upper surface of the substrate 111. Thus, since output light of the light emitting elements 61 is easily uniformalized, it is possible to reduce the occurrence of luminance irregularity. Accordingly, it is possible to maintain high optical characteristics of the light source device 2.

(Optical Characteristics of Light Emitting Element)

In the light source device 2, in a case where all of the light emitting elements 61 mounted before the phosphor is mounted emit light, the light emitting elements 61 have two peak wavelengths of output light in the first wavelength region. One peak wavelength is provided in a wavelength region of 460 nm to 490 nm (for example, the peak wavelength of output light is 470 nm), and the other peak wavelength is provided in a wavelength region of longer than 440 nm and shorter than 460 nm. Further, the light emitting element 61 has a peak wavelength of output light, which is provided in a wavelength region of 380 nm to 440 nm in the second wavelength region. Thus, at least a portion of the output light of the light emitting elements 61 constitutes a portion (for example, blue component) of light (for example, white light) from the light source device 2. Since the output light of the light emitting elements 61 has a peak wavelength of 380 nm to 440 nm, the light from the light source device 2 allows whiteness of the clothes to significantly appear.

A portion of the output light of the light emitting elements 61 excites the green phosphors 181 so as to generate green light. A portion of the remainder of the output light of the light emitting elements 61 excites the red phosphors 191 so as to generate red light. That is, the portion of the output light of the light emitting elements 61 constitutes the green component of light (for example, white light) from the light source device 2 by the green phosphors 181. A portion of the remainder of the output light of the light emitting elements 61 constitutes the red component of the light (for example, white light) from the light source device 2 by the red phosphors 191.

FIG. 4 is a cross-sectional view illustrating a light source device 2' of a modification example in Embodiment 2. As illustrated in FIG. 4, a light source device 2' in Embodiment 2 may use a second phosphor-containing resin layer 260 instead of the first phosphor-containing resin layer 160. The second phosphor-containing resin layer 260 further includes a blue phosphor 201 in addition to the resin 161, the green phosphor 181, and the red phosphor 191. In order to improve the color rendering properties of the light source device 2', it is advantageous that the spectrum of light emitted by the light source device 2' has a broad band. Here, the spectrum of output light of the light emitting element has a band broader than that of the emission spectrum of the phosphor. Thus, it is easy to improve the color rendering properties of the light source device 2' by using the blue phosphor 201.

If the peak wavelength of the output light of the light emitting elements 61 is provided in a wavelength region of longer than 440 nm and shorter than 460 nm, it is possible to maintain high emission efficiency of green light even in a case where the green phosphor 181 (for example, $Lu_3Al_5O_{12}:Ce^{3+}$, $Y_3Al_5O_{12}:Ce^{3+}$, or the like) which has difficulty in excitation by the output light of the light emitting elements 61 is used. Thus, it is possible to further improve emission efficiency of the light source devices 2 and 2'.

If it is possible to maintain high emission efficiency of green light even in a case where the green phosphor 181 (for example, $Lu_3Al_5O_{12}:Ce^{3+}$, $Y_3Al_5O_{12}:Ce^{3+}$, or the like) which has difficulty in excitation by output light in a wavelength region of 380 nm to 440 nm and a wavelength region of 460 nm to 490 nm among rays of the output light from the light emitting elements 61 is used, various known materials in the related art which have been used as the green phosphor can be used as the green phosphor 181 without limitation. Thus, a choice for the green phosphor 181 becomes wider. Accordingly, since the material of the green phosphor 181 can be selected in accordance with the purpose for using the light source devices 2 and 2', performance of the light source devices 2 and 2' is caused to be closer to the desired performance.

With the above descriptions, it is preferable that the light emitting elements 61 have a peak of output light in the wavelength region of longer than 440 nm and shorter than 460 nm.

[Optical Characteristics of Light Source Device]

As described above, in the light source devices 2 and 2' which include the light emitting elements 61, similarly to the light source devices 1 and 1' which include the light emitting elements 51 in Embodiment 1, it is possible to maintain the color rendering properties of the light source devices 2 and 2' even in a case where the maximum intensity of the blue component included in light emitted by the light source devices 2 and 2' is reduced to be small. Accordingly, it is possible to view a dark-blue or black irradiation target to be vividly dark-blue or black (see Embodiment 1). If clothes are irradiated with light emitted by the light source devices 2 and 2', the fluorescent agent adhering to the clothes is excited to emit light. Thus, it is possible to view the clothes to be white more vividly (see Embodiment 1). With the above descriptions, if an irradiation target (for example, clothes or the like) is irradiated with light emitted by the light source devices 2 and 2', it is possible to cause the white color, the dark-blue color, and the black color to simultaneously look vivid (see Embodiment 1).

Preferably, in a case where all of the light emitting elements mounted in the light source devices 2 and 2' are caused to turn on in a state where the phosphor is not sealed by resin, it is preferable that the characteristics and the number of the light emitting elements and mounting arrangement of the light emitting elements are selected so as to satisfy Characteristic α and Characteristic β which are described above. Thus, it is easy to satisfy Characteristic A and Characteristic B, and it is possible to achieve causing the color of an irradiation target to look vivid, as the purpose of this application.

Preferably, the spectrum of light emitted by the light source devices 2 and 2' has Characteristic A and Characteristic B, similarly to the spectrum of the light emitted by the light source devices 1 and 1' in Embodiment 1. Thus, if an irradiation target (for example, clothes or the like) is irradiated with light emitted by the light source devices 2 and 2', it is possible to cause the white color, the dark-blue color, and the black color to simultaneously look more vivid (see Embodiment 1).

Further, in the embodiment, the light source devices 2 and 2' include the light emitting elements 61 which also have a peak of output light in the wavelength region of longer than 440 nm and shorter than 460 nm. Thus, it is possible to maintain high emission efficiency of green light even in a case where the green phosphor 181 (for example, $Lu_3Al_5O_{12}:Ce^{3+}$, $Y_3Al_5O_{12}:Ce^{3+}$, or the like) which has difficulty in excitation by the output light of the light emitting elements 61 is used. Thus, it is possible to further improve emission efficiency of the light source devices 2 and 2'. Various known materials in the related art which have been used as the green phosphor can be used as the green phosphor 181 without limitation. Thus, since the choice for the green phosphor 181 becomes wider, it is possible to select the material of the green phosphor 181 in accordance with the purpose for using the light source devices 2 and 2', and performance of the light source devices 2 and 2' is caused to be closer to the desired performance.

[Evaluation Method of Light Source Device]

An evaluation method of the light source devices 2 and 2' includes a process of determining whether or not the light source devices 2 and 2' have Characteristic A and Characteristic B, a process of evaluating the light source device to have fair quality in a case where it is determined that the spectrum of light emitted by the light source devices 2 and 2' has Characteristic A and Characteristic B. The light source device which is evaluated to have fair quality has Characteristic A and Characteristic B. Thus, if an irradiation target (for example, clothes and the like) is irradiated with light emitted by the light source device which is evaluated to have fair quality, it is possible to cause the white color, the dark-blue color, and the black color to simultaneously look more vivid (see Embodiment 1).

[Application of Illumination Apparatus, Backlight Apparatus, or the Like to Light Emitting Apparatus]

Since the light source devices 2 and 2' have the optical characteristics, the light source devices 2 and 2' can be used as a light source of a light emitting apparatus. That is, the light emitting apparatus in the embodiment includes the light source devices 2 and 2'. Thus, it is possible to provide the light emitting apparatus such as an illumination apparatus or a backlight apparatus, which has the optical characteristics. In the illumination apparatus or the backlight apparatus in the embodiment, components other than a light source device can be used without being limited to a configuration of a known illumination apparatus or a known backlight apparatus in the related art.

Embodiment 3

Here, FIG. 5(a) is a cross-sectional view illustrating a light source device 3 according to Embodiment 3 of the present invention. FIG. 5(b) is a cross-sectional view illustrating a light source device 3' of a modification example thereof. In Embodiment 3 according to the present invention, the light source devices 3 and 3' include at least one of the light emitting elements 51 in Embodiment 1 or the light emitting elements 61 in Embodiment 2, which have emission peaks in two kinds of wavelength regions. In addition, the light source devices 3 and 3' include both of the light emitting elements 51 and 61 of which the number is at least one or more. FIGS. 5(a) and 5(b) illustrate a case where the light emitting elements 51 in Embodiment 1 are mounted, as an example.

As illustrated in FIG. 5, in the light source devices 3 and 3' in the embodiment, at least one of light emitting elements 51 is mounted on a substrate 24. The first phosphor-containing resin layer 160 is provided around the light emitting elements 51 so as to cover the light emitting elements 51. In the first phosphor-containing resin layer 160, the green phosphors 181 and the red phosphors 191 are dispersed or precipitated in the resin 161. In a case of the light source device 3 illustrated in FIG. 5(a), a transparent silicone resin layer 162 is provided so as to cover the first phosphor-containing resin layer 160 and to have a lens shape which protrudes in a direction of being separated from the substrate 24. Thus, the light source device 3 in the example illustrated in FIG. 5(a) has a package in which the light emitting element 51 is doubly sealed on the substrate 24 by the first phosphor-containing resin layer 160 and the silicone resin layer 162.

Although FIG. 5 illustrates the light source devices 3 and 3' in which one light emitting element 51 is mounted on the substrate 24, it is not necessarily limited thereto. One light emitting element 61 in Embodiment 2 may be mounted on the substrate 24 or a plurality of light emitting elements 51 and 61 may be mounted on the substrate 24.

The substrate 24 is formed of a ceramic base material, for example. Thus, it is possible to provide the substrate 24 having high heat-dissipation performance.

In the substrate 24, electrodes 29 and 30 are provided on the back surface. Thus, the light emitting element 51 mounted on the substrate 24 is connected to the electrodes 29 and 30 through a through electrode (not illustrated) for the supply of power. However, it is not necessarily limited to the through electrode. For example, the electrodes 29 and 30 may be formed on side surfaces of the substrate 24.

As described above, in the light source devices 3 and 3' in the embodiment, the first phosphor-containing resin layer 160 in which the green phosphors 181 and the red phosphors 191 are dispersed or precipitated is provided so as to cover the light emitting element 51. In the first phosphor-containing resin layer 160, the resin 161 in which the green phosphors 181 and the red phosphors 191 are dispersed or precipitated is formed of transparent silicone resin.

The light emitting element 51, the dam ring 151, and the first phosphor-containing resin layer 160 are provided on one surface of the substrate 24 (in the following descriptions, described as "an upper surface of the substrate 24"). The first phosphor-containing resin layer 160 seals the light emitting element 51 and is provided in a region surrounded by the dam ring 151 on the upper surface of the substrate 24.

As illustrated in FIGS. 5(a) and 5(b), an inner circumferential surface of the dam ring 151 may be perpendicular to the upper surface of the substrate 24. However, the inner circumferential surface of the dam ring 151 is preferably inclined from the upper surface of the substrate 24, so as to cause the diameter of an opening of the dam ring 151 to be increased from the upper surface of the substrate 24 toward the upper surface of the first phosphor-containing resin layer 160. Thus, it is possible to extract light with high efficiency.

The dam ring 151 may not be provided. For example, if resin having high thixotropy is used as the resin 161, it is possible to prevent flowing of the resin 161 toward the peripheral edge of the upper surface of the substrate 24 even though the dam ring 151 is not provided. A surface mount type light source unit may be configured not by using the substrate (FIG. 5) having a shape of a rectangle in plan view, but a substrate (for example, lead frame substrate) having a bathtub shape, as the substrate 24.

[Optical Characteristics of Light Source Device]

As described above, similarly to the light source devices 1 and 1' in Embodiment 1 and the light source devices 2 and 2' in Embodiment 2, the light source devices 3 and 3' include the light emitting elements 51 in Embodiment 1 or the light emitting elements 61 in Embodiment 2. In addition, the light source devices 3 and 3' include both of the light emitting elements 51 and 61. Thus, it is possible to maintain the color rendering properties of the light source devices 3 and 3' even in a case where the maximum intensity of the blue component included in light emitted by the light source devices 3 and 3' is reduced to be small. Accordingly, it is possible to view a dark-blue or black irradiation target to be vividly dark-blue or black (see Embodiment 1). If clothes are irradiated with light emitted by the light source devices 3 and 3', the fluorescent agent adhering to the clothes is excited to emit light. Thus, it is possible to view the clothes to be white more vividly (see Embodiment 1). With the above descriptions, if an irradiation target (for example, clothes or the like) is irradiated with light emitted by the light source devices 3 and 3', it is possible to cause the white color, the dark-blue color, and the black color to simultaneously look vivid (see Embodiment 1).

Preferably, in a case where all of the light emitting elements mounted in the light source devices 3 and 3' are caused to turn on in a state where the phosphor is not sealed by resin, it is preferable that the characteristics and the number of the light emitting elements and mounting arrangement of the light emitting elements are selected so as to satisfy Characteristic α and Characteristic β which are described above. Thus, it is easy to satisfy Characteristic A and Characteristic B, and it is possible to achieve causing the color of an irradiation target to look vivid, as the purpose of this application.

Preferably, the spectrum of light emitted by the light source devices 3 and 3' has Characteristic A and Characteristic B, similarly to the spectrum of the light emitted by the light source devices 1 and 1' in Embodiment 1 and the spectrum of the light emitted by the light source devices 2 and 2' in Embodiment 2. Thus, if an irradiation target (for example, clothes or the like) is irradiated with light emitted by the light source devices 3 and 3', it is possible to cause the white color, the dark-blue color, and the black color to simultaneously look more vivid (see Embodiment 1).

[Evaluation Method of Light Source Device]

An evaluation method of the light source devices 3 and 3' includes a process of determining whether or not the light source devices 3 and 3' have Characteristic A and Characteristic B, a process of evaluating the light source device to have fair quality in a case where it is determined that the spectrum of light emitted by the light source devices 3 and 3' has Characteristic A and Characteristic B. The light source device which is evaluated to have fair quality has Characteristic A and Characteristic B. Thus, if an irradiation target (for example, clothes and the like) is irradiated with light emitted by the light source device which is evaluated to have fair quality, it is possible to cause the white color, the dark-blue color, and the black color to simultaneously look more vivid (see Embodiment 1).

[Different Form of Light Source Device]

The light source devices 3 and 3' may further include components as follows.

The light emitting element 61 may be used instead of the light emitting element 51. The light emitting element 51 has an emission peak in a wavelength region of longer than 440 nm and shorter than 460 nm. Thus, a variety of combination of the light emitting elements is increased and the choice for the phosphor becomes wider. More specifically, it is possible to maintain high emission efficiency of green light even in a case where resin including the green phosphor 181 (for example, $Lu_3Al_5O_{12}:Ce^{3+}$, $Y_3Al_5O_{12}:Ce^{3+}$, or the like) which has difficulty in excitation by the output light of the light emitting elements 51 is used. Thus, it is possible to further improve emission efficiency of the light source devices 3 and 3'. Thus, it is possible to realize various emission spectra. Accordingly, it is possible to improve the degree of freedom for the design of the emission spectrum, and thus it is easier to obtain a desired emission spectrum in the light source devices 3 and 3'.

Although the transparent silicone resin layer 162 may not be disposed (FIG. 5(*b*)), as in the example illustrated in FIG. 5(*a*), the transparent silicone resin layer 162 is provided, and thus a lens effect is obtained. Accordingly, it is possible to expect improved light extraction efficiency or to narrow an angle of alignment characteristics in emission of light. In a case where the manufacturing process is desired to be more simplified or the alignment characteristics in emission of light are desired to have a wide angle, it is desirable that the transparent silicone resin layer 162 is not disposed. In addition, in a case where the silicone resin layer 162 is assumed to simultaneously include the green phosphors 181 or the red phosphors 191 in addition to the blue phosphors 201, it is also possible to change the alignment characteristics in emission of light. As described above, it is possible to improve the degree of freedom for the design of the light source devices 3 and 3' in accordance with whether or not the transparent silicone resin layer 162 is disposed or whether or not the silicone resin layer 162 contains the phosphor. Thus, it is easier to obtain desired light emission characteristics in the light source devices 3 and 3'.

[Application of Illumination Apparatus, Backlight Apparatus, or the Like to Light Emitting Apparatus]

Since the light source devices 3 and 3' have the optical characteristics, the light source devices 3 and 3' can be used as a light source of a light emitting apparatus. That is, the light emitting apparatus in the embodiment includes the light source devices 3 and 3'. Thus, it is possible to provide the light emitting apparatus such as an illumination apparatus or a backlight apparatus, which has the optical characteristics. In the illumination apparatus or the backlight apparatus in the embodiment, components other than a light source device can be used without being limited to a configuration of a known illumination apparatus or a known back light apparatus in the related art.

Embodiment 4

[Configuration of Light Source Device]

Figure 6:
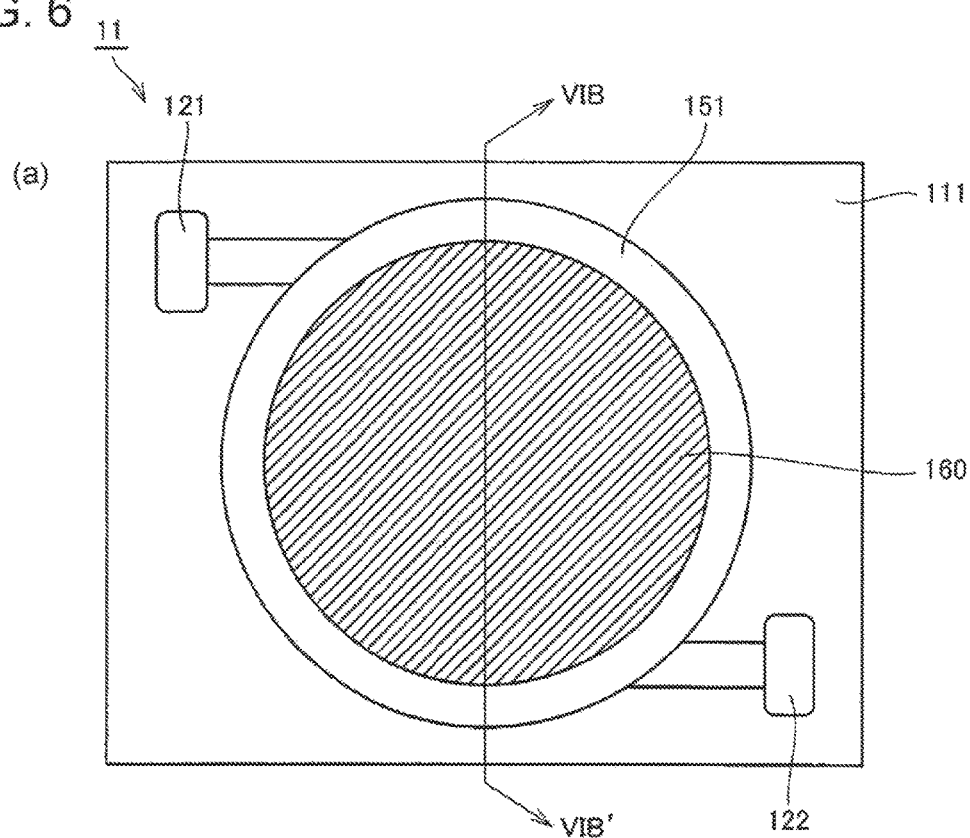
FIG. 6(a) is a plan view illustrating a light source device 11 according to Embodiment 4 of the present invention.

FIG. 6(*a*) is a plan view illustrating a configuration of a light source device according to Embodiment 4 of the present invention. FIG. 6(*b*) is a cross-sectional view taken along line VIB-VIB' illustrated in FIG. 6(*a*).

The light source device 11 in the embodiment includes a substrate 111, first light emitting element 101, a second light emitting element 102, a dam ring (resin frame) 151, and a resin layer including a phosphor (in the following descriptions, simply described as "a first phosphor-containing resin layer) 160. The first light emitting element 101 and the second light emitting element 102 have peak wavelengths of output light, which are different from each other. That is, the light source device 11 includes two kinds of light emitting elements.

The substrate 111 is preferably a substrate formed of ceramics and preferably has a shape of a rectangle in plan view. The first light emitting element 101, the second light emitting element 102, the dam ring (resin frame) 151, and the first phosphor-containing resin layer 160 are provided on one surface of the substrate 111 (in the following descriptions, described as "an upper surface of the substrate 111"). Further, the first electrode land 121 and the second electrode land 122 are provided on the surface thereof.

The first light emitting element 101 and the second light emitting element 102 are provided in a region surrounded by the dam ring 151 on the upper surface of the substrate 111, and are sealed by the first phosphor-containing resin layer 160. As described above, if two kinds of light emitting elements (first light emitting element 101 and second light emitting element 102) are provided on the upper surface of the substrate 111, the mixing state (mixing state of colors) of the output light of the first light emitting element 101 and the output light of the second light emitting element 102 is better than that in a case where a light source device is formed by arranging a plurality of LED packages in which one kind of light emitting elements are provided on the upper surface of the substrate, in parallel with each other.

The dam ring 151 is a member configured to define an appearance of the first phosphor-containing resin layer 160 (the first phosphor-containing resin layer 160 includes resin 161, a green phosphor 181, and a red phosphor 191). The dam ring 151 functions as a dam (damming member) for preventing leakage of the resin 161 to an outside of the dam ring 151 when the first phosphor-containing resin layer 160 is formed.

The first electrode land 121 and the second electrode land 122 are provided on the outside of the dam ring 151 in the upper surface of the substrate 111. Preferably, the first electrode land 121 and the second electrode land 122 are provided at the corner of the upper surface of the substrate 111. More preferably, the electrode lands are provided on a diagonal line of the substrate 111. Each of the surfaces of the first electrode land 121 and the second electrode land 122 is exposed, and thus the first electrode land 121 and the second electrode land 122 are allowed to be connected to an external terminal. That is, one of the first electrode land 121 and the second electrode land 122 functions as an anode electrode for external connection and the other thereof functions as a cathode electrode for the external connection.

(Light Emitting Element)
(Arrangement Form and Connection Form)

The first light emitting element 101 and the second light emitting element 102 are preferably LEDs and more preferably LED chips. It is preferable that the first light emitting element 101 and the second light emitting element 102 are electrically connected to each other through a wire (not illustrated). The wire is preferably connected to the first electrode land 121 and the second electrode land 122. Thus, external power applied from the external terminal to the first electrode land 121 or the second electrode land 122 is supplied to the first light emitting element 101 and the second light emitting element 102 through the wire. Accordingly, the first light emitting element 101 and the second light emitting element 102 emit light.

The arrangement form of the first light emitting element 101 and the second light emitting element 102 is not particularly limited. However, it is preferable that the first light emit element 101 and the second light emitting element 102 are arranged at an equal interval in the region surrounded by the dam ring 151 on the upper surface of the substrate 111. Thus, the mixing state (mixing state of colors) of the output light of the first light emitting element 101 and the output light of the second light emitting element 102 is easily uniformalized. Accordingly, it is possible to reduce the occurrence of the luminance irregularity. Accordingly, it possible to maintain high optical characteristics of the light source device 11.

As described above, the arrangement form of the first light emitting element 101 and the second light emitting element 102 is not particularly limited. However, it is necessary that the first light emitting element 101 and the second light emitting element 102 are arranged so as to show a peak in a wavelength region of 380 nm to 440 nm in the emission spectrum of the light source device 11.

The connection form of the first light emitting element 101 and the second light emitting element 102 is not particularly limited. However, it is preferable that first light emitting elements 101 and second light emitting elements 102 are electrically connected so as to form a plurality of element rows. Each of the element rows is configured by connecting the first light emitting elements 101 and the second light emitting elements 102 in series at a specific content ratio. Thus, even in a case where various electrical characteristics of the first light emitting element 101, such as forward voltage are different from those of the second light emitting element 102, it is possible to cause the equivalent current (current value is the same) to flow in all of the light emitting elements included in the light source device 11. Accordingly, it is possible to maintain high optical characteristics of the light source device 11. The element rows are preferably connected in parallel with each other.

(Optical Characteristics of Light Emitting Element)

In the light source device 11, in a case where all of the light emitting elements (first light emitting element 101 and second light emitting element 102) mounted before the phosphor is mounted emit light, the first light emitting element 101 has a peak wavelength of output light, which is provided in a wavelength region of 460 nm to 490 nm (for example, the peak wavelength of output light is 470 nm). The is, the first light emitting element 101 is a blue light emitting element and is preferably a blue light emitting diode. Thus, at least a portion of the output light of the first light emitting element 101 constitutes a portion (for example, blue component) of light (for example, white light) from the light source device 11.

In the light source device 11, in a case where all of the light emitting elements (first light emitting element 101 and second light emitting element 102) mounted before the phosphor is mounted emit light, the second light emitting element 102 has a peak wavelength of output light, which is provided in a wavelength region of 380 nm to 440 nm (for example, the peak wavelength of output light is 405 nm). That is, the second light emitting element 102 is a blue emitting element and is preferably a blue light emitting diode. Thus, at least a portion of the output light of the second light emitting element 102 constitutes a portion (for example, blue component) of light (for example, white light) from the light source device 11.

In addition, the output light of the second light emitting element 102 has a peak wavelength of 380 nm to 440 nm. Here, as will be described later, a light emitting element in which the peak wavelength of output light is in a wavelength region of 380 nm to 440 nm, generally includes a light emission component in a wavelength region of 430 nm or shorter. Thus, the output light of the second light emitting element 102 is able to excite a fluorescent agent adhering to clothes. Since light from the light source device 11 includes the output light of the second light emitting element 102, the light from the light source device 11 allows whiteness of the clothes to significantly appear.

As described above, the light source device 11 includes the first light emitting element 101 as a light emitting element having a peak wavelength of output light in a wavelength region (first wavelength region) of longer than 440 nm and 490 nm or shorter, and includes the second light emitting element 102 as a light emitting element having a peak wavelength of output light in a wavelength region (second wavelength region) of 380 nm to 440 nm.

A portion of the output light of the first light emitting element 101 and the output light of the second light emitting element 102 excites the green phosphors 181 so as to generate green light (peak wavelength is longer than 490 nm and 580 nm or shorter). A portion of the remainder of the output light of the first light emitting element 101 and the output light of the second light emitting element 102 excites the red phosphors 191 so as to generate red light (peak wavelength is longer than 580 nm and 780 nm or shorter). That is, the portion of the output light of the first light emitting element 101 and the output light of the second light emitting element 102 constitutes the green component of light (for example, white light) from the light source device 11 by the green phosphors 181. A portion of the remainder of the output light of the first light emitting element 101 and the output light of the second light emitting element 102 constitutes the red component of the light (for example, white light) from the light source device 11 by the red phosphors 191.

Light having a peak wavelength of 460 nm has visibility which is about 58% higher than that of light having a peak wavelength of 450 nm (generally, output light of a blue LED). Thus, if light having a peak wavelength of 460 nm is used, it is possible to maintain high visibility of blue light even if the peak intensity of a peak in a blue region (wavelength region of 380 nm to 490 nm) in the spectrum of white light is low, in comparison to a case where light having a peak wavelength of 450 nm is used. For example, in a case where the correlated color temperature of light emitted by the light source device 11 is 3000 K, it is possible to maintain high visibility of blue light even if integrated intensity of the light in a wavelength region of 460 nm to 490 nm is larger than integrated intensity of the light in a wavelength region of longer than 440 nm and shorter than 460 nm in the spectrum of the light emitted by the light source device 11. Thus, if the lower limit value of the peak wavelength of the output light of the first light emitting element 101 is set to 460 nm, it is possible to suppress the occurrence of a situation in which a dark-blue or black irradiation target is viewed to be more bluish, in a state of maintaining the high color rendering properties. Accordingly, the lower limit value of the peak wavelength of the output light of the first light emitting element 101 is preferably 460 nm. More preferably, the lower limit value of the peak wavelength of the output light of the first light emitting element 101 is 465 nm.

An upper limit value of a wavelength of light which is caused to look blue in a single color is 490 nm. Thus, the upper limit value of the peak wavelength of the output light of the first light emitting element 101 is preferably 490 nm. More preferably, the upper limit value of the peak wavelength of the output light of the first light emitting element 101 is 480 nm.

The lower limit value of a wavelength of light which is caused to look blue in a single color is 380 nm. Thus, the lower limit value of the peak wavelength of the output light of the second light emitting element 102 is preferably 380 nm.

The upper limit value of a wavelength of light which is able to excite the fluorescent agent adhering to clothes is 430 nm. Here, generally, a light emitting element sufficiently includes light emission components in a wavelength region of ±(half width) based on the peak wavelength of output light thereof as the center. In a light emitting element having a peak wavelength of output light in a wavelength region of 380 nm to 490 nm, the half width is equal to or greater than 10 nm. Thus, the light emitting element having a peak wavelength of output light in a wavelength region of 380 nm to 490 nm sufficiently includes light emission components in at least a wavelength region of ±10 nm based on the peak wavelength as the center. For example, a light emitting element in which the peak wavelength of output light is 430 nm and the half width thereof is 12 nm sufficiently includes light emission components in a wavelength region of 418 nm to 442 nm. With the above descriptions, from a viewpoint in that the second light emitting element 102 sufficiently includes a light emission component (light emission component in a wavelength region of 430 nm or shorter) which is able to excite the fluorescent agent adhering to clothes, it is preferable that the upper limit value of the peak wavelength of the output light of the second light emitting element 102 is 440 nm. More preferably, the upper limit value of the peak wavelength of the output light of the second light emitting element 102 is 420 nm. The half width means a half width of a peak (emission peak of a light emitting element) of output light of the light emitting element.

The light source device 11 may further include a light emitting element having a peak of output light in a wavelength region of longer than 440 nm and shorter than 460 nm, as the light emitting element having a peak wavelength of output light in the first wavelength region (Embodiment 6 which will be described later).

(First Phosphor-Containing Resin Layer)

The first phosphor-containing resin layer 160 includes the resin 161, the green phosphor 181, and the red phosphor 191. The first phosphor-containing resin layer 160 is preferably formed in a manner that a region surrounded by the dam ring 151 on the upper surface of the substrate 111 is filled with the resin 161, the green phosphor 181, and the red phosphor 191, and then the resin 161 is cured. It is preferable that the first phosphor-containing resin layer 160 is provided to bury the first light emitting element 101 and the second light emitting element 102 which have been arranged in the region surrounded by the dam ring 151 on the upper surface of the substrate 111. That is, in the embodiment, the first light emitting element 101 and the second light emitting element 102 are sealed all together by the first phosphor-containing resin layer 160. In the specification, "being sealed all together" means being sealed by the same resin.

The resin 161 included in the first phosphor-containing resin layer 160 is preferably a resin having excellent light-transmitting properties. More preferably, the resin 161 is a resin which is able to transmit the output light of the first light emitting element 101, the output light of the second light emitting element 102, green light emitted by the green phosphor 181, and red light emitted by the red phosphor 191. The resin 161 is not particularly limited as long as the resin 161 is a resin able to be used as a sealing resin which is included in a resin-sealed type light source device. For example, it is preferable that the resin 161 is dimethyl-based silicone resin, phenyl-based silicon resin, epoxy resin, or the like.

The green phosphor 181 is preferably β type SiAlON which has activated bivalent europium. The red phosphor 191 is preferably $Sr_xCa_{1-x}AlSiN_3:Eu^{2+}$. The green phosphor 181 and the red phosphor 191 are not limited thereto and may be phosphors described below. It is preferable that a combination of a light emitting element and a phosphor is selected so as to obtain optimum condition considering the excitation characteristics of the phosphor.

The first phosphor-containing resin layer 160 may include only one of the green phosphor 181 and the red phosphor 191. Two kinds or more of green phosphors 181 may be used as the green phosphor 181 and two kinds or more of red phosphors 191 may be used as the red phosphor 191. However, if the first phosphor-containing resin layer 160 includes one or more kinds of green phosphors 181 and one or more kinds of red phosphors 191, the light source device 11 can function as a white light source device.

(Green Phosphor)

The green phosphor 181 is a phosphor which is excited by output light of the blue light emitting element (for example, at least one of the output light of the first light emitting element 101 and the output light of the second light emitting element 102) so as to emit green light. For example, the green phosphor 181 is preferably the following (1) to (7). Any one of the following (1) to (7) may be used as the green phosphor 181 or a combination of two or more of the following (1) to (7) may be used.

(1) β type SiAlON represented by a general formula of $Eu_{a1}Si_{b1}Al_{c1}O_{d1}N_{e1}$ (0.001≤a1≤0.2) (oxynitride phosphor which has activated bivalent europium)

(2) Phosphor represented by $(MI)_{3-x2}Ce_{x2}(MII)_5O_{12}$ (MI indicates at least one of Lu, Y, La, and Gd. MII indicates at least one of Al and Ga. 0.0055≤x2≤0.3) and has a garnet type crystal structure (oxide phosphor which has activated trivalent cerium)

(3) Phosphor represented by $(MIII)_{2-x3}Eu_{x3}SiO_4$ (MIII indicates at least one of Mg, Ca, Sr, and Ba. 0.005≤x3≤0.4) (silicate phosphor which has activated bivalent europium)

(4) Phosphor represented by $(MIII)_{3-x4}Ce_{x4}(MIV)_2Si_3O_{12}$ (MIII indicates at least one of Mg, Ca, Sr, and Ba. MIV indicates at least one of Li, Na, K, Cs, Rb, Mg, Ca, Ba, Al, Ga, In, Sc, Y, La, Gd, and Lu. 0.005≤x4≤0.3) (silicate phosphor which has activated trivalent cerium)

(5) Phosphor represented by $(MI)_{3-x5}Ce_{x5}Si_6N_{11}$ (MI indicates at least one of Lu, Y, La, and Gd. 0.005≤x5≤0.2) (nitride phosphor which has activated trivalent cerium)

(6) Phosphor represented by $(MV)_{1-a6}Eu_{a6}Mg_{1-x6}Al_{10-y6}Mn_{x6+y6}O_{17}$ (MV indicates at least one of Sr and Ba. 0.005≤a≤0.2, 0.005≤x6+y6≤0.2) (aluminate phosphor which has bivalent europium and bivalent manganese which have been activated)

(7) Phosphor represented by $(MV)_{3-a7}Eu_{a7}Si_6O_{12}N_2$ (MV indicates at least one of Sr and Ba. 0.005≤a7≤0.2) (silicate phosphor which has bivalent europium and bivalent manganese which have been activated)

(Red Phosphor)

The red phosphor 191 is a phosphor which is excited by output light of the blue light emitting element (for example, at least one of the output light of the first light emitting element 101 and the output light of the second light emitting element 102) so as to emit red light. For example, the red phosphor 191 is preferably the following (11) to (15). Any one of the following (11) to (15) may be used as the red phosphor 191 or a combination of two or more of the following (11) to (15) may be used.

(11) Phosphor represented by $(MIII)_{1-x11}Eu_{x11}(MVI)SiN_3$ (MIII indicates at least one of Mg, Ca, Sr, and Ba. MVI indicates at least one of Al, Ga, In, Sc, Y, La, Gd, and Lu. 0.005≤x11≤0.2) (nitride phosphor which has activated bivalent europium)

(12) Phosphor represented by $(MIII)_{2-x12}Eu_{x12}Si_5N_8$ (MIII indicates at least one of Mg, Ca, Sr, and Ba. 0.005≤x12≤0.2) (nitride phosphor which has activated bivalent europium)

(13) α type SiAlON represented by $Eu_f(MVII)_g Si_h Al_i O_j N_k$ (MVII indicates at least one of Li, Na, K, Rb, Cs, Mg, Ca, Sr, Ba, Sc, Y, La, and Gd. $0.001 \leq f \leq 0.2$) (oxynitride phosphor which has activated bivalent europium)

(14) Phosphor represented by $(MVIII)_2 ((MIX)_{1-x14} Mn_{x14}) F_6$ (MVIII indicates at least one of Li, Na, K, Rb, and Cs. MIX indicates at least one of Ge, Si, Sn, Ti, and Zr. $0.005 \leq x14 \leq 0.3$) (fluoride metal salt phosphor which has activated tetravalent manganese)

(15) Phosphor represented by $(MX)_{2-x15} Eu_{x15} O_{3-y15} S_{y15}$ (MX indicates at least one of Y, La, and Gd. $0.005 \leq x15 \leq 0.4$, $0.0 \leq y15 \leq 2.0$) (sulfate phosphor which has activated trivalent europium)

(Blue Phosphor)

Figure 7:
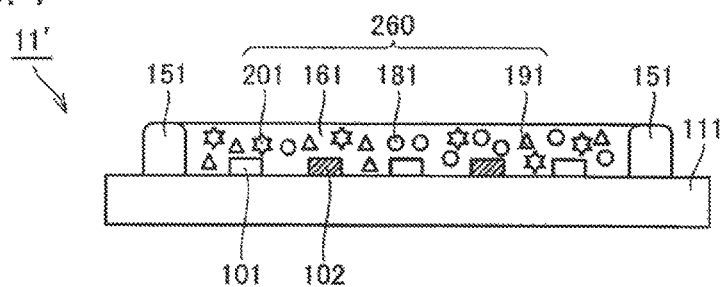
FIG. 7 is a cross-sectional view illustrating a light source device 11' of a modification example of Embodiment 4 illustrated in FIG. 6.

FIG. 7 is a cross-sectional view illustrating a light source device 11' of a modification example of Embodiment 4. The second phosphor-containing resin layer 260 which further includes the blue phosphor 201 in addition to the resin 161, the green phosphor 181, and the red phosphor 191 may be used instead of the first phosphor-containing resin layer 160 (FIG. 7). In order to improve the color rendering properties of the light source device 11, it is advantageous that the spectrum of light emitted by the light source device 11 has a broad band. Here, the spectrum of output light of the light emitting element has a band broader than that of the emission spectrum of the phosphor. Thus, it is easy to improve the color rendering properties of the light source device 11 by using the blue phosphor 201.

The blue phosphor 201 is a phosphor which is excited by output light of the blue light emitting element (for example, at least one of the output light of the first light emitting element 101 and the output light of the second light emitting element 102) so as to emit blue light. The blue phosphor 201 may be halophosphorus oxide which is represented by the following (21) and has activated bivalent europium, may be aluminum oxide which is represented by the following (22) and has activated bivalent europium, and may be nitride which is represented by the following (23) and has activated trivalent cerium. Any one of the following (21) to (23) may be used as the blue phosphor 201 or a combination of two or more of the following (21) to (23) may be used.

(21) Phosphor represented by $(MXI)_{5-x21} Eu_{x21} (PO_4)_3 (MXIII)$ (MXI indicates at least one of Ca, Sr, and Ba. MXII indicates at least one of F, Cl, and Br. $0.1 \leq x21 \leq 1.5$) (phosphorus oxide phosphor which has activated bivalent europium)

(22) Phosphor represented by $(MCIII)_{1-a22} Eu_{a22} MgAl_{10} O_{17}$ (MXIII indicates at least one of Sr and Ba. $0.005 \leq a22 \leq 0.2$) (aluminum oxide phosphor which has activated bivalent europium)

(23) Phosphor represented by $(MI)_{1-x23} Ce_{x23} Si_3 N_5$ (MI indicates at least one of Lu, Y, La, and Gd. $0.005 \leq x23 \leq 0.2$) (nitride phosphor which has activated trivalent cerium)

[Optical Characteristics of Light Source Device]

As described above, the light source devices 11 and 11' includes the first light emitting element 101. Thus, blue light having high visibility in blue light is included as a portion of the blue component of the light (for example, white light) emitted by the light source devices 11 and 11'. Thus, even in a case where the maximum intensity of the blue component included in the light emitted by the light source devices 11 and 11' is reduced to be small, it is possible to maintain the high color rendering properties of the light source devices 11 and 11'. Accordingly, it is possible to view a dark-blue or black irradiation target to be vividly dark-blue or black.

The light source devices 11 and 11' further include the second light emitting element 102. If clothes are irradiated with light emitted by the light source devices 11 and 11', the fluorescent agent adhering to the clothes is excited to emit light. Thus, it is possible to view the clothes to be white more vividly.

As described above, since the light source devices 11 and 11' include the first light emitting element 101 and the second light emitting element 102, if an irradiation target (for example, clothes or the like) is irradiated with light emitted by the light source devices 11 and 11', it is possible to cause the white color, the dark-blue color, and the black color to simultaneously look vivid.

Preferably, in a case where all of the light emitting elements mounted in the light source devices 11 and 11' are caused to turn on in a state where the phosphor is not sealed by resin, it is preferable that the characteristics and the number of the light emitting elements and mounting arrangement of the light emitting elements are selected so as to satisfy Characteristic α and Characteristic β which are described above. Thus, it is easy to satisfy Characteristic A and Characteristic B, and is possible to achieve causing the color of an irradiation target to look vivid, as the purpose of this application.

Preferably, the spectrum of light emitted by the light source devices 11 and 11' has the following Characteristic A and the following Characteristic B. Thus, if an irradiation target (for example, clothes or the like) is irradiated with light emitted by the light source devices 11 and 11', it is possible to cause the white color, the dark-blue color, and the black color to simultaneously look more vivid. It can be checked whether or not the spectrum of light emitted by the light source device 11 has the following Characteristic A and the following Characteristic B, in a manner that the spectrum of the light emitted by the light source devices 11 and 11' is measured by using the commercial visible ultraviolet absorption photometer.

Characteristic A: a ratio of integrated intensity of light in a wavelength region of 380 nm to 430 nm to integrated intensity of light in a wavelength region of 380 nm to 780 nm is equal to or greater than 2%.

Characteristic B: a ratio of integrated intensity of light in a wavelength region of 460 nm to 490 nm to integrated intensity of light in a wavelength region of longer than 440 nm and shorter than 460 nm is equal to or greater than 100%.

(Characteristic A)

"Integrated intensity of light in a wavelength region of 380 nm to 780 nm" means the area (total area of peaks in a case where two peaks or more are shown in the wavelength region) of a peak shown in the wavelength region of 380 nm to 780 nm in the spectrum of light emitted by the light source devices 11 and 11'. In this specification, the area of a peak means the area of a region surrounded by a peak and a baseline, that is, means a peak area after baseline correction.

Similarly, "integrated intensity of light in a wavelength region of 380 nm to 430 nm" means the area (total area of peaks in a case where two peaks or more are shown in the wavelength region) of a peak shown in the wavelength region of 380 nm to 430 nm in the spectrum of light emitted by the light source devices 11 and 11'.

The integrated intensity can be obtained in a manner that the spectrum of light emitted by the light source devices 11 and 11' is measured by using the commercial visible ultraviolet absorption photometer and baseline correction is performed on the obtained spectrum. In a case where the ratio of the integrated intensity of light in the wavelength region of 380 nm to 430 nm to the integrated intensity of light in the wavelength region of 380 nm to 780 nm is equal to or greater than 2%, Characteristic A is satisfied. The ratio is more preferably equal to or greater than 3%, and further preferably equal to or greater than 4%. The ratio is preferably equal to or smaller than 30%.

As a specific method for realizing Characteristic A, a method of causing the light source devices 11 and 11' to include together the second light emitting element 102 and the blue phosphor which is excited by the second light emitting element 102 so as to have an emission peak in a wavelength region of 460 nm to 490 nm and the like are exemplified in addition to a method of causing the light source devices 11 and 11' to include the first light emitting element 101 and the second light emitting element 102.
(Characteristic B)

"Integrated intensity of light in a wavelength region of longer than 440 nm and shorter than 460 nm" means the area (total area of peaks in a case where two peaks or more are shown in the wavelength region) of a peak shown in the wavelength region of longer than 440 nm and shorter than 460 nm in the spectrum of light emitted by the light source devices 11 and 11'.

Similarly, "integrated intensity of light in a wavelength region of 460 nm to 490 nm" means the area (total area of peaks in a case where two peaks or more are shown in the wavelength region) of a peak shown in the wavelength region of 460 nm to 490 nm in the spectrum of light emitted by the light source devices 11 and 11'.

The integrated intensity can be obtained in a manner that the spectrum of light emitted by the light source devices 11 and 11' measured by using the commercial visible ultraviolet absorption photometer and baseline correction is performed on the obtained spectrum. In a case where the ratio of the integrated intensity of light in the wavelength region of 460 nm to 490 nm to the integrated intensity of light in the wavelength region of longer than 440 nm and shorter than 460 cm is equal to or greater than 100%, Characteristic B is satisfied. The ratio is preferably equal to or smaller than 500%, and more preferably equal to or smaller than 300%.

As a specific method for realizing Characteristic B, for example, a method of causing the light source devices 11 and 11' to include the second light emitting element 102 and the blue phosphor, which is excited by the second light emitting element 102, together so as to have an emission peak in a wavelength region of 460 nm to 490 nm and the like are exemplified in addition to a method of causing the light source devices 11 and 11' to include the first light emitting element 101 and the second light emitting element 102.
[Evaluation Method of Light Source Device]

An evaluation method of the light source devices 11 and 11' includes a process of determining whether or not the light source devices 11 and 11' have Characteristic A and Characteristic B, a process of evaluating the light source device to have fair quality in a case where it is determined that the spectrum of light emitted by the light source devices 11 and 11' has Characteristic A and Characteristic B. The light source device which is evaluated to have fair quality has Characteristic A and Characteristic B. Thus, if an irradiation target (for example, clothes and the like) is irradiated with light emitted by the light source device which is evaluated to have fair quality, it is possible to cause the white color, the dark-blue color, and the black color to simultaneously look more vivid.
[Application of Illumination Apparatus, Backlight Apparatus, or the Like to Light Emitting Apparatus]

Since the light source devices 11 and 11' have the optical characteristics, the light source devices 11 and 11' can be used as a light source of a light emitting apparatus (examples of the light emitting apparatus include an illumination apparatus and a backlight apparatus). That is, the light emitting apparatus in the embodiment includes the light source devices 11 and 11'. Thus, it is possible to provide the light emitting apparatus such as an illumination apparatus or a backlight apparatus, which has the optical characteristics. In the illumination apparatus or the backlight apparatus in the embodiment, components other than a light source device can be used without being limited to a configuration of a known illumination apparatus or a known backlight apparatus in the related art.

Embodiment 5

In Embodiment 5 according to the present invention, the output light of the first light emitting element is used for exciting the green phosphors and the red phosphors, but the output light of the second light emitting element is not used for exciting the green phosphors and the red phosphors. In the following descriptions, difference from Embodiment 4 will be mainly described.
[Configuration of Light Source Device]

FIG. 8(a) is a plan view illustrating a configuration of a light source device according to this embodiment. FIG. 8(b) is a cross-sectional view taken along line VIIIB-VIIIB' illustrated in FIG. 8(a).

A light source device 12 in the embodiment includes the substrate 111, the first light emitting element 101, the second light emitting element 102, the dam ring 151, and the first phosphor-containing resin layer 160. The light source device 12 further includes a transparent resin layer 170. In the embodiment, the first light emitting element 101 is sealed by the first phosphor-containing resin layer 160, and the second light emitting element 102 is sealed by the transparent resin layer 170. Thus, it is preferable that an element row in which only the first light emitting elements 101 are arranged at an interval and an element row in which only the second light emitting elements 102 are arranged at an interval are preferably provided in the region surrounded by the dam ring 151 on the upper surface of the substrate 111.

In the light source devices 11 and 11' described in Embodiment 4, the first light emitting element 101 and the second light emitting element 102 are sealed all together by the first phosphor-containing resin layer 160. Thus, the light source devices 11 and 11' are easily manufactured. In the light source device 12 in Embodiment 5, the first light emitting element 101 is sealed by the first phosphor-containing resin layer 160 and the second light emitting element 102 is sealed by the transparent resin layer 170. Thus, it is possible to excite the green phosphor 181 or the red phosphor 191 only by using a light emitting element (in the embodiment, first light emitting element 101) which has high excitation efficiency for the green phosphor 181 or the red phosphor 191. Thus, it is possible to improve the emission efficiency of the light source device 12 in comparison to the emission efficiency of the light source device 11.
(Transparent Resin Layer)

The transparent resin layer 170 includes resin 171 having excellent light-transmitting properties, but does not include the phosphor (for example, green phosphor 181, red phosphor 191, and blue phosphor 201).

If the dam ring is formed between the first light emitting element 101 and the second light emitting element 102, it is possible to seal the first light emitting element 101 by using the resin 161 and to seal the second light emitting element 102 by using the resin 171, regardless of the degree of thixotropy of the resin 161 and the resin 171. That is, if the dam ring is formed between the first light emitting element 101 and the second light emitting element 102, it is possible to seal the first light emitting element 101 by using resin which has low thixotropy as the resin 161, and to seal the second light emitting element 102 by using resin which has low thixotropy as the resin 171.

However, if resin having high thixotropy is used as at least one of the resin 161 and the resin 171, it is possible to prevent mixing of the resin 161 and the resin 171 even though the dam ring is not formed between the first light emitting element 101 and the second light emitting element 102. That is, if one of the first light emitting element 101 and the second light emitting element 102 is sealed by using resin which has high thixotropy, it is possible to seal the other of the first light emitting element 101 and the second light emitting element 102 by performing drawing with an air type dispenser. That is, resin having high thixotropy is used as at least one of the resin 161 and the resin 171, and thus a process of forming a dam ring between the first light emitting element 101 and the second light emitting element 102 is not necessary. Thus, it is possible to further simplify the manufacturing process of the light source device 12. In a case where resin having high thixotropy is used as the resin 171, the first light emitting element 101 and the second light emitting element 102 can be sealed in accordance with a method as follows.

Firstly, a specific region (for example, element row in which only second light emitting elements 102 are arranged at an interval) on the upper surface of the substrate 111 is sealed by using a resin which has high thixotropy. Then, the resin is preliminarily cured. Then, a kneaded mixture is injected to a region surrounded by the dam ring 151 on the upper surface of the substrate 111. The kneaded mixture includes the resin 161 (the resin 161 is preferably resin having low thixotropy), the green phosphor 181, and the red phosphor 191. At this time, the resin which has been preliminarily cured and has high thixotropy functions as a dam ring for the kneaded mixture. Then, the resin 171 and the resin 161 including the kneaded mixture are cured. In this manner, the first light emitting element 101 and the second light emitting element 102 can be sealed. Even in a case where resin having high thixotropy is used as at least one of the resin 161 and the resin 171, the dam ring may be formed so as to surround an element row in which only the first light emitting elements 101 are arranged at an interval, or to surround an element row in which only the second light emitting elements 102 are arranged at an interval.

Figure 9:
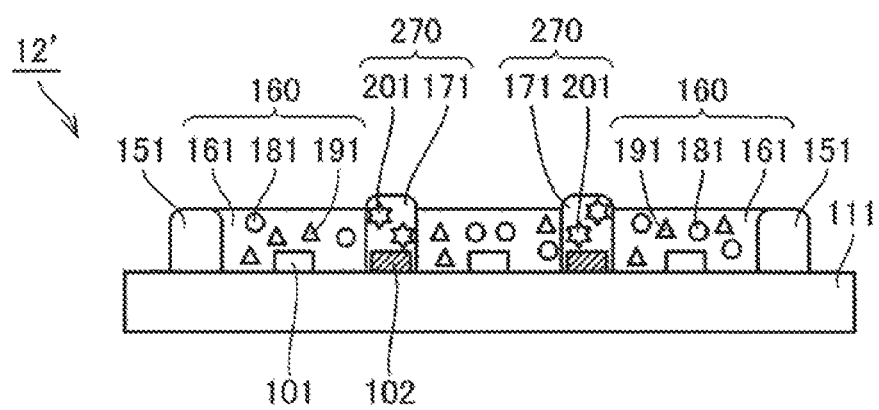
FIG. 9 is a cross-sectional view illustrating a light source device 12' of a modification example of Embodiment 5 illustrated in FIG. 8.

FIG. 9 is a cross-sectional view illustrating a light source device 12' of a modification example of Embodiment 5. A third phosphor-containing resin layer 270 which includes the resin 171 and the blue phosphor 201 may be used instead of the transparent resin layer 170 (FIG. 9). In addition, the resin layer 171 may include the green phosphor 181 and the red phosphor 191 together in addition to the blue phosphor 201. Thus, it is easy to improve the color rendering properties of the light source device 12' (see Embodiment 4). The material of the blue phosphor 201 is as described in Embodiment 4.

(Light Emitting Element)
(Arrangement Form and Connection Form)

The arrangement form of the first light emitting element 101 and the second light emitting element 102 is not particularly limited. The connection form of the first light emitting element 101 and the second light emitting element 102 is not particularly limited. However, in the embodiment, the first light emitting element 101 is sealed by the first phosphor-containing resin layer 160, and the second light emitting element 102 is sealed by the transparent resin layer 170. Thus, in the region surrounded by the dam ring 151 on the upper surface of the substrate 111, it is preferable that only the first light emitting elements 101 are arranged at an interval in a region portion of the above region, and it is preferable that only the second light emitting elements 102 are arranged at an interval in a region portion of the remainder thereof.

It is preferable that an element row configured by connecting the first light emitting elements 101 in series and an element row configured by connecting the second light emitting elements 102 in series are alternately arranged. Thus, even in a case where various electrical characteristics of the first light emitting element 101, such as a forward voltage are different from those of the second light emitting element 102, it is possible to cause the equivalent current (current value is the same) to flow in all of the light emitting elements included in the light source devices 12 and 12'. Accordingly, it is possible to maintain high optical characteristics of the light source devices 12 and 12'.

As described above, the arrangement form of the first light emitting element 101 and the second light emitting element 102 is not particularly limited. However, it is necessary that the first light emitting element 101 and the second light emitting element 102 are arranged so as to show a peak in a wavelength region of 380 nm to 440 nm in the emission spectrum of the light source devices 12 and 12'.

(Optical Characteristics of Light Emitting Element)

In the light source devices 12 and 12', in a case where all of the light emitting elements (first light emitting element 101 and second light emitting element 102) mounted before the phosphor is mounted emit light, the first light emitting element 101 has a peak wavelength of output light, which is provided in a wavelength region of 460 nm to 490 nm (for example, the peak wavelength of output light is 470 nm). Thus, a portion of the output light of the first light emitting element 101 constitutes a portion (for example, blue component) of light (for example, white light) from the light source devices 12 and 12'.

Since the first phosphor-containing resin layer 160 includes the green phosphors 181 and the red phosphors 191, a portion of the output light of the first light emitting element 101 excites the green phosphors 181 so as to generate green light. A portion of the remainder of the output light of the first light emitting element 101 excites the red phosphors 191 so as to generate red light. That is, the portion of the output light of the first light emitting element 101 constitutes the green component of light (for example, white light) from the light source devices 12 and 12' by the green phosphors 181. A portion of the remainder of the output light of the first light emitting element 101 constitutes the red component of the light (for example, white light) from the light source devices 12 and 12' by the red phosphors 191. The material of each of the green phosphor 181 and the red phosphor 191 and an effect which is obtained by adding the phosphors are as described in Embodiment 4.

The transparent resin layer 170 includes the resin 171 having excellent light-transmitting properties, but does not include the green phosphor 181 and the red phosphor 191. Thus, a portion of the output light of the second light emitting element 102 constitutes a portion (for example, blue component) of light (for example, white light) from the light source device 12. Since the output light of the second light emitting element 102 has a peak wavelength of 380 nm to 440 nm, the light from the light source device 12 allows whiteness of the clothes to significantly appear (see Embodiment 4).

As described above, the light source devices 12 and 12' include the first light emitting element 101 as a light emitting element having a peak wavelength of output light in the first wavelength region, and include the second light emitting element 102 as a light emitting element having a peak wavelength of output light in the second wavelength region.

The light source devices 12 and 12' may further include a light emitting element having a peak of output light in a wavelength region of longer than 440 nm and shorter than 460 nm, as a light emitting element having a peak wavelength of output light in the first wavelength region (Embodiment 6 which will be described later).

[Optical Characteristics of Light Source Device]

As described above, similarly to the light source devices 11 and 11', the light source devices 12 and 12' include the first light emitting element 101 and the second light emitting element 102. Thus, it is possible to maintain the color rendering properties of the light source devices 12 and 12' even in a case where the maximum intensity of the blue component included in light emitted by the light source devices 12 and 12' is reduced to be small. Accordingly, it is possible to view a dark-blue or black irradiation target to be vividly dark-blue or black (see Embodiment 4). If clothes are irradiated with light emitted by the light source devices 12 and 12', the fluorescent agent adhering to the clothes is excited to emit light. Thus, it is possible to view the clothes to be white more vividly (see Embodiment 4). With the above descriptions, if an irradiation target (for example, clothes or the like) is irradiated with light emitted by the light source devices 12 and 12', it is possible to cause the white color, the dark-blue color, and the black color to simultaneously look vivid (see Embodiment 4).

Preferably, in a case where all of the light emitting elements mounted in the light source devices 12 and 12' are caused to turn on in a state where the phosphor is not sealed by resin, it is preferable that the characteristics and the number of the light emitting elements and mounting arrangement of the light emitting elements are selected so as to satisfy Characteristic α and Characteristic β which are described above. Thus, it is easy to satisfy Characteristic A and Characteristic B, and it is possible to achieve causing the color of an irradiation target to look vivid, as the purpose of this application.

Preferably, the spectrum of light emitted by the light source devices 12 and 12' has Characteristic A and Characteristic B, similarly to the spectrum of the light emitted by the light source devices 11 and 11'. Thus, if an irradiation target (for example, clothes or the like) is irradiated with light emitted by the light source devices 12 and 12', it is possible to cause the white color, the dark-blue color, and the black color to simultaneously look more vivid (see Embodiment 4).

Further, in the embodiment, the output light of the second light emitting element 102 is not used as excitation light for the green phosphor 181 and the red phosphor 191. Here, the output light of the second light emitting element 102 has a short peak wavelength and large energy in comparison to the output light of the first light emitting element 101. Thus, a point as follows is advantageous energy: the output light of the second light emitting element 102 is emitted from the light source devices 12 and 12' without being used for exciting the phosphor and emitting light, the emitted light is used only for exciting the fluorescent agent adhering to clothes and emitting light, and only the output light of the first light emitting element 101 is used for exciting the phosphor and emitting light. Thus, it is possible to reduce the occurrence of stokes shift occurring by exciting the green phosphor 181 and emitting light, and to reduce the occurrence of stokes shift occurring by exciting the red phosphor 191 and emitting light. Thus, it is possible to improve the emission efficiency of the light source devices 12 and 12' in comparison to the emission efficiency of the light source devices 11 and 11'.

[Evaluation Method of Light Source Device]

An evaluation method of the light source devices 12 and 12' includes a process of determining whether or not the light source devices 12 and 12' have Characteristic A and Characteristic B, a process of evaluating the light source device to have fair quality in a case where it is determined that the spectrum of light emitted by the light source devices 12 and 12' has Characteristic A and Characteristic B. The light source device which is evaluated to have fair quality has Characteristic A and Characteristic B. Thus, if an irradiation target (for example, clothes and the like) is irradiated with light emitted by the light source device which is evaluated to have fair quality, it is possible to cause the white color, the dark-blue color, and the black color to simultaneously look more vivid (see Embodiment 4).

[Application of Illumination Apparatus, Backlight Apparatus, or the Like to Light Emitting Apparatus]

Since the light source devices 12 and 12' have the optical characteristics, the light source devices 12 and 12' can be used as a light source of a light emitting apparatus. That is, the light emitting apparatus in the embodiment includes the light source devices 12 and 12'. Thus, it is possible to provide the light emitting apparatus such as an illumination apparatus or a backlight apparatus, which has the optical characteristics. In the illumination apparatus or the backlight apparatus in the embodiment, components other than a light source device can be used without being limited to a configuration of a known illumination apparatus or a known backlight apparatus in the related art.

Embodiment 6

In Embodiment 6 according to the present invention, a light source device includes three kinds of light emitting elements. In the following descriptions, differences from Embodiment 4 will be mainly described.

[Configuration of Light Source Device]

FIG. 10(a) is a plan view illustrating a configuration of a light source device 13 according to Embodiment 6. FIG. 10(b) is a cross-sectional view taken along line XB-XB' Illustrated in FIG. 10(a).

A light source device 13 in the embodiment includes the substrate 111, the first light emitting element 101, the second light emitting element 102, the dam ring 151, and the first phosphor-containing resin layer 160. The light source device 13 further includes a third light emitting element 103. The third light emitting element 103 is provided on the upper surface of the substrate 111 along with the first light emitting element 101 and the second light emitting element 102, and is sealed together by the first phosphor-containing resin layer 160 along with the first light emitting element 101 and the second light emitting element 102. The first light emitting element 101, the second light emitting element 102, and the third light emitting element 103 have peak wavelengths of output light, which are different from each other.

(Light Emitting Element)

(Arrangement Form and Connection Form)

In the light source device 13, in a case where all of the light emitting elements (first light emitting element 101, second light emitting element 102, and third light emitting element 103) mounted before the phosphor is mounted emit light, the third light emitting element 103 is preferably an LED and more preferably an LED chip, similarly to the first light emitting element 101 and the second light emitting element 102. It is preferable that the first light emitting element 101, the second light emitting element 102, and the third light emitting element 103 are electrically connected to each other through wire (not illustrated). The wire is preferably connected to the first electrode land 121 and the second electrode land 122. Thus, external power applied from the external terminal to the first electrode land 121 or the second electrode land 122 is supplied to the first light emitting element 101, the second light emitting element 102, and the third light emitting element 103 through the wire. Accordingly, the first light emitting element 101, the second light emitting element 102, and the third light emitting element 103 emit light.

The arrangement form of the first light emitting elements 101, the second light emitting elements 102, and third light emitting elements 103 is not particularly limited. The connection form of the first light emitting element 101, the second light emitting element 102, and the third light emitting element 103 is not particularly limited. However, it is preferable that the first light emitting elements 101, the second light emitting elements 102, and the third light emitting elements 103 are alternately arranged at an equal interval in the region surrounded by the dam ring 151 on the upper surface of the substrate 111. Thus, the mixing state (mixing state of colors) of the output light of the first light emitting element 101, the output light of the second light emitting element 102, and the output light of the third light emitting element 103 is easily uniformalized. Accordingly, it is possible to reduce the occurrence of the luminance irregularity. Accordingly, it is possible to maintain high optical characteristics of the light source device 13.

It is preferable that the first light emitting elements 101, the second light emitting elements 102, and the third light emitting elements 103 are alternately arranged at an equal interval and are connected in series. Thus, even in a case where various electrical characteristics such as a forward voltage are different between the first light emitting element 101, the second light emitting element 102, and the third light emitting element 103, it is possible to cause the equivalent current (current value is the same) to flow in all of the light emitting elements included in the light source device 13. Accordingly, it is possible to maintain high optical characteristics of the light source device 13.

(Optical Characteristics of Light Emitting Element)

As described in Embodiment 4, the first light emitting element 101 has a peak wavelength of output light in the wavelength region of 460 nm to 490 nm (for example, the peak wavelength of output light is 470 nm). The second light emitting element 102 has a peak wavelength of output light in the wavelength region of 380 nm to 440 nm. Thus, at least a portion of the output light of the first light emitting element 101 constitutes a portion (for example, blue component) of light (for example, white light) from the light source device 13. At least a portion of the output light of the second light emitting element 102 constitutes a portion (for example, blue component) of light (for example, white light) from the light source device 13. Since the output light of the second light emitting element 102 has a peak wavelength of 380 nm to 440 nm, the light from the light source device 13 allows whiteness of the clothes to significantly appear.

The third light emitting element 103 has a peak wavelength of output light in the wavelength region of longer than 440 nm and shorter than 460 nm. Thus, at least a portion of the output light of the third light emitting element 103 constitutes a portion (for example, blue component) of light (for example, white light) from the light source device 13.

As described above, the light source device 13 includes the first light emitting element 101 and the third light emitting element 103 as a light emitting element having a peak wavelength of output light in the first wavelength region, and includes the second light emitting element 102 as a light emitting element having a peak wavelength of output light in the second wavelength region.

A portion of the output light of the first light emitting element 101, the output light of the second light emitting element 102, and the output light of the third light emitting element 103 excites the green phosphors 181 so as to generate green light. A portion of the remainder of the output light of the first light emitting element 101, the output light of the second light emitting element 102, and the output light of the third light emitting element 103 excites the red phosphors 191 so as to generate red light. That is, the portion of the output light of the first light emitting element 101, the output light of the second light emitting element 102, and the output light of the third light emitting element 103 constitutes the green component of light (for example, white light) from the light source device 13 by the green phosphors 181. A portion of the remainder of the output light of the first light emitting element 101, the output light of the second light emitting element 102, and the output light of the third light emitting element 103 constitutes the red component of the light (for example, white light) from the light source device 13 by the red phosphors 191.

If the peak wavelength of the output light of the third light emitting element 103 is provided in a wavelength region of longer than 440 nm and shorter than 460 nm, it is possible to maintain high emission efficiency of green light even in a case where the green phosphor 181 (for example, $Lu_3Al_5O_{12}:Ce^{3+}$, $Y_3Al_5O_{12}:Ce^{3+}$, or the like) which has difficulty in excitation by the output light of the first light emitting element 101 is used. Thus, it is possible to further improve emission efficiency of the light source device 13.

If it is possible to maintain high emission efficiency of green light even in a case where the green phosphor 181 (for example, $Lu_3Al_5O_{12}:Ce^{3+}$, $Y_3Al_5O_{12}:Ce^{3+}$, or the like) which has difficulty in excitation by the output light of the first light emitting element 101 is used, various known materials in the related art which have been used as the green phosphor can be used as the green phosphor 181 without limitation. Thus, a choice for the green phosphor 181 becomes wider. Accordingly, since the material of the green phosphor 181 can be selected in accordance with the purpose for using the light source device 13, performance of the light source device 13 is caused to be closer to the desired performance.

With the above descriptions, the lower limit value of the peak wavelength of the output light of the third light emitting element 103 is preferably longer than 440 nm and the upper limit value of the peak wavelength of the output light of the third light emitting element 103 is preferably shorter than 460 nm.

[Optical Characteristics of Light Source Device]

As described above, similarly to the light source device 11, the light source device 13 includes the first light emitting element 101 and the second light emitting element 102. Thus, it is possible to maintain the color rendering properties of the light source device 13 even in a case where the maximum intensity of the blue component included in light emitted by the light source device 13 is reduced to be small. Accordingly, it is possible to view a dark-blue or black irradiation target to be vividly dark-blue or black (see Embodiment 4). If clothes are irradiated with light emitted by the light source device 13, the fluorescent agent adhering to the clothes is excited to emit light. Thus, it is possible to view the clothes to be white more vividly (see Embodiment 4). With the above descriptions, if an irradiation target (for example, clothes or the like) is irradiated with light emitted by the light source device 13, it is possible to cause the white color, the dark-blue color, and the black color to simultaneously look vivid (see Embodiment 4).

Preferably, in a case where all of the light emitting elements mounted in the light source device 13 are caused to turn on in a state where the phosphor is not sealed by resin, it is preferable that the characteristics and the number of the light emitting elements and mounting arrangement of the light emitting elements are selected so as to satisfy Characteristic α and Characteristic β which are described above. Thus, it is easy to satisfy Characteristic A and Characteristic B, and it is possible to achieve causing the color of an irradiation target to look vivid, as the purpose of this application.

Preferably, the spectrum of light emitted by the light source device 13 has Characteristic A and Characteristic B, similarly to the spectrum of the light emitted by the light source device 11. Thus, if an irradiation target (for example, clothes or the like) is irradiated with light emitted by the light source device 13, it is possible to cause the white color, the dark-blue color, and the black color to simultaneously look more vivid (see Embodiment 4).

Additionally, in the embodiment, the light source device 13 further includes the third light emitting element 103. Thus, it is possible to maintain high emission efficiency of green light even in a case where the green phosphor 181 (for example, $Lu_3Al_5C_{12}:Ce^{3+}$, $Y_3Al_5O_{12}:Ce^{3+}$, or the like) which has difficulty in excitation by the output light of the first light emitting element 101 is used. Thus, it is possible to further improve emission efficiency of the light source device 13. Various known materials in the related art which have been used as the green phosphor can be used as the green phosphor 181 without limitation. Thus, since the choice for the green phosphor 181 becomes wider, it is possible to select the material of the green phosphor 181 in accordance with the purpose for using the light source device 13, and performance of the light source device 13 is caused to be closer to the desired performance.

[Evaluation Method of Light Source Device]

An evaluation method of the light source device 13 includes a process of determining whether or not the light source device 13 has Characteristic A and Characteristic B, a process of evaluating the light source device to have fair quality in a case where it is determined that the spectrum of light emitted by the light source device 13 has Characteristic A and Characteristic B. The light source device which is evaluated to have fair quality has Characteristic A and Characteristic B. Thus, if an irradiation target (for example, clothes and the like) is irradiated with light emitted by the light source device which is evaluated to have fair quality, it is possible to cause the white color, the dark blue color, and the black color to simultaneously look more vivid. (see Embodiment 4).

[Different Form of Light Source Device]

The light source device 13 may further include components as follows.

Figure 11:
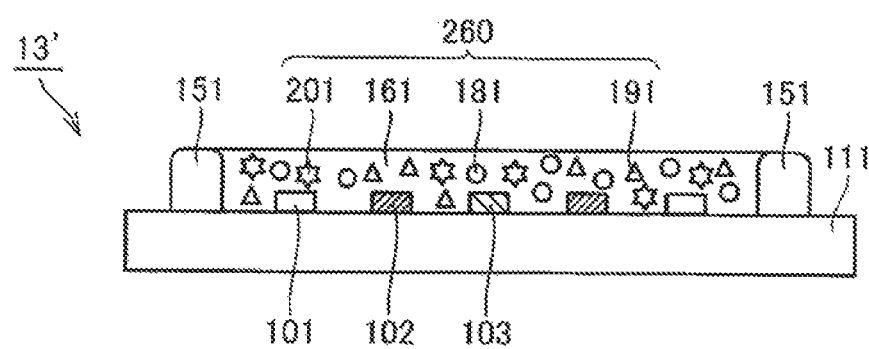
FIG. 11 is a cross-sectional view illustrating a light source device 13' of a modification example of Embodiment 6 illustrated in FIG. 10.

FIG. 11 is a cross-sectional view illustrating a light source device 13' of a modification example of Embodiment 6. The second phosphor-containing resin layer 260 which further includes the blue phosphor 201 in addition to the resin 161, the green phosphor 181, and the red phosphor 191 may be used instead of the first phosphor-containing resin layer 160 (FIG. 11). Thus, it is easy to improve the color rendering properties of the light source device 13' (see Embodiment 4).

The first light emitting element 101, the second light emitting element 102, and the third light emitting element 103 may be sealed by resin layers which are different from each other. Thus, at least one of the first light emitting element 101, the second light emitting element 102, and the third light emitting element 103 can be sealed by using a resin layer which includes a phosphor able to emit light by output light of the light emitting element with high efficiency. At least one of the remainders of the first light emitting element 101, the second light emitting element 102, and the third light emitting element 103 can be sealed by a resin layer (for example, transparent resin layer 170) which does not include a phosphor. As described above, it is possible to select the best material for the resin layer (resin layer for sealing the light emitting element) in accordance with the peak wavelength of the output light of each of the first light emitting element 101, the second light emitting element 102, and the third light emitting element 103. With the above descriptions, it is possible to further improve emission efficiency of the light source devices 13 and 13'.

For example, the second light emitting element 102 may be sealed by using a kneaded mixture which includes resin having high thixotropy or includes the resin having high thixotropy and the blue phosphor 201. The first light emitting element 101 and the third light emitting element 103 may be sealed by using the first phosphor-containing resin layer 160. Thus, the output light of the second light emitting element 102 is not used as excitation light for the green phosphor 181 and the red phosphor 191. Thus, it is possible to reduce the occurrence of stokes shift occurring by exciting the green phosphor 181 and emitting light, and to reduce the occurrence of stokes shift occurring by exciting the red phosphor 191 and emitting light. Accordingly, it is possible to further improve emission efficiency of the light source devices 13 and 13' (see Embodiment 5).

In addition, the second light emitting element 102 may be sealed by using resin which has high thixotropy. The third light emitting element 103 may be sealed by using a kneaded mixture which includes resin having high thixotropy and the green phosphor (phosphor having a garnet type crystal structure (see Embodiment 4)). The first light emitting element 101 may be sealed by using a kneaded mixture which includes resin and the red phosphor. Accordingly, it is possible to excite the green phosphor and emit light by the output light of the third light emitting element 103, with high efficiency. Thus, it is possible to further improve emission efficiency of the light source devices 13 and 13'.

[Application of Illumination Apparatus, Backlight Apparatus, or the Like to Light Emitting Apparatus]

Since the light source devices 13 and 13' have the optical characteristics, the light source devices 13 and 13' can be used as a light source of a light emitting apparatus. That is, the light emitting apparatus in the embodiment includes the light source devices 13 and 13'. Thus, it is possible to provide the light emitting apparatus such as an illumination apparatus or a backlight apparatus, which has the optical characteristics. In the illumination apparatus or the backlight apparatus in the embodiment, components other than a light source device can be used without being limited to a configuration of a known illumination apparatus or a known backlight apparatus in the related art.

Embodiment 7

In Embodiment 7 according to the present invention, an input circuit for a signal to the second light emitting element is different from an input circuit for a signal to a light emitting element (for example, first light emitting element, or first light emitting element and third light emitting element) having a different kind from that of the second light emitting element. In the following descriptions, differences from Embodiment 4 will be mainly described.

[Configuration of Light Source Device]

Figure 13:
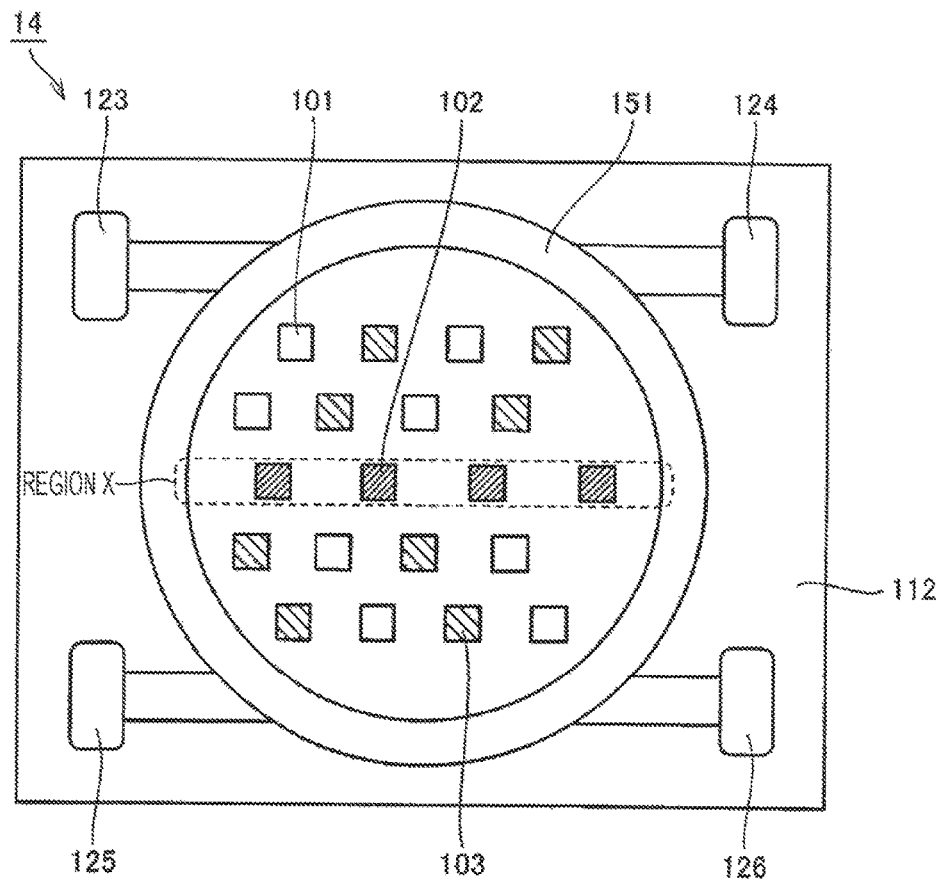
FIG. 13 is a plan view illustrating an arrangement form of light emitting elements on an upper surface of a substrate.

FIG. 12(a) is a plan view illustrating a light source device 14 according to Embodiment 7, and FIG. 12(b) is a cross-sectional view taken along line XIIB-XIIB' illustrated in FIG. 12(a). FIG. 13 is a plan view illustrating the arrangement form of the light emitting elements on the upper surface of the substrate.

A light source device 14 in the embodiment includes a substrate 112, the first light emitting element 101, the second light emitting element 102, the third light emitting element 103, the dam ring 151, the first phosphor-containing resin layer 160, and the transparent resin layer 170. The third light emitting element 103 is as described in Embodiment 6 and the transparent resin layer 170 is as described in Embodiment 5.

(Input Circuit for Signal in Light Source Device)

In the embodiment, the input circuit for a signal to the second light emitting element 102 is different from an input circuit for a signal to the first light emitting element 101 and the third light emitting element 103 (light emitting element having a different kind from that of the second light emitting element).

Specifically, a third electrode land 123, a fourth electrode land 124, a fifth electrode land 125, and a sixth electrode land 126 are provided on one surface (in the following descriptions, described as "an upper surface of the substrate 112") of the substrate 112. All of the third electrode land 123, the fourth electrode land 124, the fifth electrode land 125, and the sixth electrode land 126 are provided on an outside of the dam ring 151 on the upper surface of the substrate 112. Preferably, the electrode lands 123 to 126 are provided at the corners of the upper surface of the substrate 112. The surface of each of the third electrode land 123, the fourth electrode land 124, the fifth electrode land 125, and the sixth electrode land 126 is exposed, and thus the electrode lands are allowed to be connected to an external terminal. That is, the third electrode land 123 and the fifth electrode land 125 function as one of an anode electrode for external connection and a cathode electrode for external connection. The fourth electrode land 124 and the sixth electrode land 126 function as the other of the anode electrode for external connection and the cathode electrode for external connection.

Each of the first light emitting elements 101 and the third light emitting elements 103 is connected to the third electrode land 123 and the fourth electrode land 124 through a wire (not illustrated). Thus, external power applied from an external terminal to the third electrode land 123 or the fourth electrode land 124 is supplied to each of the first light emitting elements 101 and the third light emitting elements 103 through the wire. Accordingly, the first light emitting element 101 and the third light emitting element 103 emit light.

The second light emitting element 102 is connected to the fifth electrode land 125 and the sixth electrode land 126 by another wire (not illustrated). Thus, external power applied from an external terminal to the fifth electrode land 125 or the sixth electrode land 126 is supplied to the second light emitting element 102 through the wire. Accordingly, the second light emitting element 102 emits light.

In this specification, "the input circuit for a signal to the second light emitting element 102" includes the anode electrode for external connection (one of the fifth electrode land 125 and the sixth electrode land 126), the cathode electrode for external connection (the other of the fifth electrode land 125 and the sixth electrode land 126), a wire of connecting the anode electrode for external connection and the cathode electrode for external connection to the second light emitting element 102.

"The input circuit for a signal to the first light emitting element 101 and the third light emitting element 103" includes the anode electrode for external connection (one of the third electrode land 123 and the fourth electrode land 124), the cathode electrode for external connection (the other of the third electrode land 123 and the fourth electrode land 124), a wire of connecting the anode electrode for external connection and the cathode electrode for external connection to the first light emitting element 101, and a wire of connecting the anode electrode for external connection and the cathode electrode for external connection to the third light emitting element 103.

The phase that "the input circuit for a signal to the second light emitting element 102 is different from the input circuit for a signal to the first light emitting element 101 and the third light emitting element 103" means the following. The anode electrode for external connection, which is connected to the second light emitting element 102 is different from the anode electrode for external connection, which is connected to the first light emitting element 101, and the anode electrode for external connection, which is connected to the third light emitting element 103. The cathode electrode for external connection, which is connected to the second light emitting element 102 is different from the cathode electrode for external connection, which is connected to the first light emitting element 101 and the cathode electrode for external connection, which is connected to the third light emitting element 103.

(Light Emitting Element)

(Arrangement Form and Connection Form)

The arrangement form of the first light emitting elements 101, the second light emitting elements 102, and third light emitting elements 103 is not particularly limited. The connection form of the first light emitting element 101, the second light emitting element 102, and the third light emitting element 103 is not particularly limited. However, in the embodiment, the first light emitting element 101 and the third light emitting element 103 are sealed by the first phosphor-containing resin layer 160, and the second light emitting element 102 is sealed by the transparent resin layer 170. Thus, in the region surrounded by the dam ring 151 on the upper surface of the substrate 112, it is preferable that only the first light emitting elements 101 and the third light emitting elements 103 are arranged at an interval in a region portion (for example, region different from a region X in FIG. 13) of the above region, and it is preferable that only the second light emitting elements 102 are arranged at an interval in a region portion (for example, the region X in FIG. 13) of the remainder thereof.

It is preferable that the first light emitting elements 101 and the third light emitting elements 103 are alternately arranged at an equal interval in the region portion (for example, the region different from the region X in FIG. 13). It is preferable that the second light emitting elements are arranged at an equal interval in the region portion (for example, the region X in FIG. 13) of the remainder thereof. Thus, the mixing state (mixing state of colors) of the output light of the first light emitting element 101, the output light of the second light emitting element 102, and the output light of the third light emitting element 103 is easily uniformalized. Accordingly, it is possible to reduce the occurrence of the luminance irregularity. Accordingly, it is possible to maintain high optical characteristics of the source device 14.

As described above, the arrangement form of the first light emitting element 101, the second light emitting element 102, and the third light emitting element 103 is not particularly limited. However, it is necessary that the first light emitting element 101, the second light emitting element 102, and the third light emitting element 103 are arranged so as to show a peak in a wavelength region of 380 nm to 440 nm in the emission spectrum of the light source device 14.

[Optical Characteristics of Light Source Device]

As described above, similarly to the light source device 11, the light source device 14 includes the first light emitting element 101 and the second light emitting element 102. Thus, it is possible to maintain the color rendering properties of the light source device 14 even in a case where the maximum intensity of the blue component included in light emitted by the light source device 14 is reduced to be small. Accordingly, it is possible to view a dark-blue or black irradiation target to be vividly dark-blue or black (see Embodiment 4). If clothes are irradiated with light emitted by the light source device 14, the fluorescent agent adhering to the clothes is excited to emit light. Thus, it is possible to view the clothes to be white more vividly (see Embodiment 4). With the above descriptions, if an irradiation target (for example, clothes or the like) is irradiated with light emitted by the light source device 14, it is possible to cause the white color, the dark-blue color, and the black color to simultaneously look vivid (see Embodiment 4).

Preferably, in a case where all of the light emitting elements mounted in the light source device 14 are caused to turn on in a state where the phosphor is not sealed by resin, it is preferable that the characteristics and the number of the light emitting elements and mounting arrangement of the light emitting elements are selected so as to satisfy Characteristic α and Characteristic β which are described above. Thus, it is easy to satisfy Characteristic A and Characteristic B, and it is possible to achieve causing the color of an irradiation target to look vivid, as the purpose of this application.

Preferably, the spectrum of light emitted by the light source device 14 has Characteristic A and Characteristic B, similarly to the spectrum of the light emitted by the light source device 11. Thus, if an irradiation target (for example, clothes or the like) is irradiated with light emitted by the light source device 14, it is possible to cause the white color, the dark-blue color, and the black color to simultaneously look more vivid (see Embodiment 4).

The light source device 14 further includes the third light emitting element 103, similarly to the light source device 13. Thus, it is possible to maintain high emission efficiency of green light even in a case where the green phosphor 181 (for example, $Lu_3Al_5O_{12}:Ce^{3+}$, $Y_3Al_5O_{12}:Ce^{3+}$, or the like) which has difficulty in excitation by the output light of the first light emitting element 101 is used. Thus, it is possible to further improve emission efficiency of the light source device 14. Since the material of the green phosphor 181 can be selected in accordance with the purpose for using the light source device 14, performance of the light source device 14 is caused to be closer to the desired performance (see Embodiment 6).

Further, in the embodiment, the input circuit for a signal to the second light emitting element 102 is different from the input circuit for a signal to the first light emitting element 101 and the third light emitting element 103. Thus, it is possible to change a signal input to the second light emitting element 102 and a signal input to the first light emitting element 101 and the third light emitting element 103. For example, the value of a current input to the second light emitting element 102 and the value of a current input to the first light emitting element 101 and the third light emitting element 103 can be changed. Thus, it is possible to control the light emission intensity of the second light emitting element 102 separately from the light emission intensity of each of the first light emitting element 101 and the third light emitting element 103. That is, it is possible to adjust the ratio of the integrated intensity of light in the wavelength region of 380 nm to 430 nm to the integrated intensity of light in the wavelength region of 380 nm to 780 nm. Accordingly, it is possible to adjust vividness of the white color depending on an irradiation target.

It is possible to separately control the light emission intensity of the second light emitting element 102 and the light emission intensity of each of the first light emitting element 101 and the third light emitting element 103. Thus, it is possible to operate the first light emitting element 101, the second light emitting element 102, and the third light emitting element 103 in a state where optical performance thereof is excellent. Thus, it is possible to maintain the life span of each of the first light emitting element 101, the second light emitting element 102, and the third light emitting element 103 to be long. In addition, it is possible to maintain the high emission efficiency of each of the first light emitting element 101, the second light emitting element 102, and the third light emitting element 103.

[Evaluation Method of Light Source Device]

An evaluation method of the light source device 14 includes a process of determining whether or not the light source device 14 has Characteristic A and Characteristic B, a process of evaluating the light source device to have fair quality in a case where it is determined that the spectrum of light emitted by the light source device 14 has Characteristic A and Characteristic B. The light source device which is evaluated to have fair quality has Characteristic A and Characteristic B. Thus, if an irradiation target (for example, clothes and the like) is irradiated with light emitted by the light source device which is evaluated to have fair quality, it is possible to cause the white color, the dark-blue color, and the black color to simultaneously look more vivid (see Embodiment 4).

[Different Form of Light Source Device]

The light source device 14 may further include components as follows.

Resin having high thixotropy is preferably used as at least one of the resin 161 and the resin 171. Thus, it is possible to prevent mixing of the resin 161 and the resin 171 even though the dam is not formed between the first light emitting element 101 and the second light emitting element 102 Embodiment 5.

The first light emitting element 101 and the third light emitting element 103 may be sealed by using resin which has high thixotropy, in addition to the second light emitting element 102. The second light emitting element 102 may be sealed by using a resin which has low thixotropy, and the first light emitting element 101 and the third light emitting element 103 may be sealed by using a resin which has high thixotropy.

Figure 14:
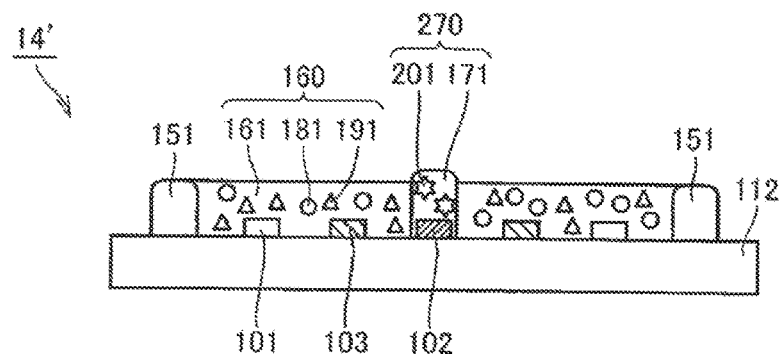
FIG. 14 is a cross-sectional view illustrating a light-source device 14' of a modification example of Embodiment 7 illustrated in FIG. 12.

FIG. 14 is a cross-sectional view illustrating a light source device 14' of a modification example of Embodiment 7. The third phosphor-containing resin layer 270 which includes the resin 171 and the blue phosphor 201 may be used instead of the transparent resin layer 170 (FIG. 14). Thus, light emitted by the blue phosphor 201 is included in light from a light source device 14'. Here, in the embodiment, it is possible to control the light emission intensity of the second light emitting element 102 separately from the light emission intensity of each of the first light emitting element 101 and the third light emitting element 103. Thus, it is possible to adjust a ratio of intensity of light emitted by the blue phosphor 201 to the light emission intensity of the first light emitting element 101, the light emission intensity of the third light emitting element 103, intensity of light emitted by the green phosphor 181, and intensity of light emitted by the red phosphor 191. Accordingly, it is possible to appropriately change the correlated color temperature of light emitted by the light source device 14'.

The input circuit for a signal to the first light emitting element 101 and the third light emitting element 103 may include a portion of the input circuit for a signal to the second light emitting element 102. Even in such a case, in the spectrum of light emitted by the light source device 14, it is preferable that integrated intensity of light in a wavelength region of 460 nm to 490 nm is larger than integrated intensity of light in a wavelength region of longer than 440 nm and shorter than 460 nm, and it is preferable that the input circuit for a signal is controlled to change integrated intensity of light in a wavelength region of 380 nm to 430 nm. Thus, it is possible to select vividness of the white color in accordance with an impression of an irradiation target in a certain scene, and it is possible to improve emission efficiency of white light while the vividness of the white color is reduced, in another scene.

[Application of Illumination Apparatus, Backlight Apparatus, or the Like to Light Emitting Apparatus]

Since the light source devices 14 and 14' have the optical characteristics, the light source devices 14 and 14' can be used as a light source of a light emitting apparatus. That is, the light emitting apparatus in the embodiment includes the light source devices 14 and 14'. Thus, it is possible to provide the light emitting apparatus such as an illumination apparatus or a backlight apparatus, which has the optical characteristics. In the illumination apparatus or the backlight apparatus in the embodiment, components other than a light source device can be used without being limited to a configuration of a known illumination apparatus or a known backlight apparatus in the related art.

Embodiment 8

In Embodiment 8 according to the present invention, the light source device 15 includes each of the first light emitting element 101 and the second light emitting element 102 which have emission peaks in two kinds of wavelength regions. The number of first light emitting elements 101 included in the light source device 15 or the number of second light emitting elements 102 included in the light source device 15 is at least one or more. In the following descriptions, a case where one first light emitting element 101 and one second light emitting element 102 are mounted will be described as an example.

Figure 15:
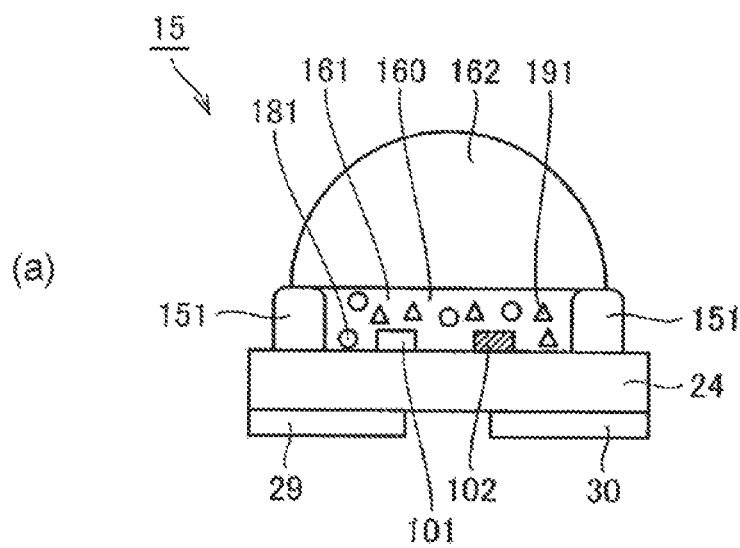
FIG. 15(a) is a cross-sectional view illustrating a light source device 15 according to Embodiment 8 of the present invention.
FIG. 15(b) is a cross-sectional view illustrating a light source device 15' of a modification example of Embodiment 8 illustrated in FIG. 15(a).

As illustrated in FIG. 15, one first light emitting element 101 and one second light emitting element 102 are mounted on the substrate 24 in a light source device 15 in the embodiment. The first phosphor-containing resin layer 160 is provided around the first light emitting element 101 and the second light emitting element 102 so as to cover the first light emitting element 101 and the second light emitting element 102. In the first phosphor-containing resin layer 160, the green phosphors 181 and the red phosphors 191 are dispersed or precipitated in the resin 161. In a case of the light source device 15 illustrated in FIG. 15(a), the transparent silicone resin layer 162 is provided so as to cover the first phosphor-containing resin layer 160 and to have a lens shape which protrudes in a direction of being separated from the substrate 24. Thus, the light source device 15 in the example illustrated in FIG. 15(a) has a package in which the first light emitting element 101 and the second light emitting element 102 are doubly sealed on the substrate 24 by the first phosphor-containing resin layer 160 and the silicone resin layer 162.

The substrate 24 is formed of a ceramic base material, for example. Thus, it is possible to provide the substrate 24 having high heat-dissipation performance.

The electrodes 29 and 30 are provided on the back surface of the substrate 24. Thus, the first light emitting element 101 and the second light emitting element 102 mounted on the substrate 24 are connected to the electrodes 29 and 30 through a through electrode (not illustrated) for a supply of power. However, it is not necessarily limited to the through electrode. For example, the electrodes 29 and 30 may be formed on side surfaces of the substrate 24.

As described above, in the light source device 15 in the embodiment, the phosphor-containing resin layer 160 in which the green phosphors 181 and the red phosphors 191 are dispersed or precipitated is provided so as to cover the first light emitting element 101 and the second light emitting element 102. In the phosphor-containing resin layer 160, the resin 161 in which the green phosphors 181 and the red phosphors 191 are dispersed or precipitated is formed of transparent silicone resin.

The first light emitting element 101, the second light emitting element 102, the dam ring 151, and the first phosphor-containing resin layer 160 are provided on one surface of the substrate 24 (in the following descriptions, described as "an upper surface of the substrate 24"). The first phosphor-containing resin layer 160 seals the first light emitting element 101 and is provided in a region surrounded by the dam ring 151 on the upper surface of the substrate 24.

The inner circumferential surface of the dam ring 151 may be perpendicular to the upper surface of the substrate 24. However, the inner circumferential surface of the dam ring 151 is preferably inclined from the upper surface of the substrate 24, so as to cause the diameter of an opening of the dam ring 151 to be increased from the upper surface of the substrate 24 toward the upper surface of the first phosphor-containing resin layer 160. Thus, it is possible to extract light with high efficiency.

The dam ring 151 may not be provided. For example, if resin having high thixotropy is used as the resin 161, it is possible to prevent flowing of the resin 161 toward the peripheral edge of the upper surface of the substrate 24 even though the dam ring 151 is not provided. A surface mount type light source unit may be configured by using not the substrate (FIG. 15(a)) having a shape of a rectangle in plan view, but a substrate (for example, lead frame substrate) having a bathtub shape, as the substrate 24.

[Optical Characteristics of Light Source Device]

As described above, similarly to the light source device 11, the light source devices 15 and 15' include the first light emitting element 101 or the second light emitting element 102. Thus, it is possible to maintain the color rendering properties of the light source devices 15 and 15' even in a case where the maximum intensity of the blue component included in light emitted by the light source devices 15 and 15' is reduced to be small. Accordingly, it is possible to view a dark-blue or black irradiation target to be vividly dark-blue or black (see Embodiment 4). If clothes are irradiated with light emitted by the light source devices 15 and 15', the fluorescent agent adhering to the clothes is excited to emit light. Thus, it is possible to view the clothes to be white more vividly (see Embodiment 4). With the above descriptions, if an irradiation target (for example, clothes or the like) is irradiated with light emitted by the light source devices 15 and 15', it is possible to cause the white color, the dark-blue color, and the black color to simultaneously look vivid (see Embodiment 4).

Preferably, in a case where all of the light emitting elements mounted in the light source devices 15 and 15' are caused to turn on in a state where the phosphor is not sealed by resin, it is preferable that the characteristics and the number of the light emitting elements and mounting arrangement or the light emitting elements are selected so as to satisfy Characteristic α and Characteristic β which are described above. Thus, it is easy to satisfy Characteristic A and Characteristic B, and it is possible to achieve causing the color of as irradiation target to look vivid, as the purpose of this application.

Preferably, the spectrum of light emitted by the light source devices 15 and 15' has Characteristic A and Characteristic B, similarly to the spectrum of the light emitted by the light source devices 11, 11', 12, and 12'. Thus, if an irradiation target (for example, clothes or the like) is irradiated with light emitted by the light source devices 15 and 15', it is possible to cause the white color, the dark-blue color, and the black color to simultaneously look more vivid (see Embodiment 4).

[Evaluation Method of Light Source Device]

An evaluation method of the light source devices 15 and 15' includes a process of determining whether or not the light source devices 15 and 15' have Characteristic A and Characteristic B, a process of evaluating the light source device to have fair quality in a case where it is determined that the spectrum of light emitted by the light source devices 15 and 15' has Characteristic A and Characteristic B. The light source device which is evaluated to have fair quality has Characteristic A and Characteristic B. Thus, if an irradiation target (for example, clothes and the like) is irradiated with light emitted by the light source device which is evaluated to have fair quality, it is possible to cause the white color, the dark-blue color, and the black color to simultaneously look more vivid (see Embodiment 4).

[Different Form of Light Source Device]

The light source devices 15 and 15' may further include components as follows.

The third light emitting element 103 may be used in addition to the first light emitting element 101 and the second light emitting element 102. The third light emitting element 103 has an emission peak in a wavelength region of longer than 440 nm and shorter than 460 nm. Thus, a variety of combination of the light emitting elements is increased and choice for the phosphor becomes wider. More specifically, it is possible to maintain high emission efficiency of green light even in a case where resin including the green phosphor 181 (for example, $Lu_3Al_5O_{12}:Ce^{3+}$, $Y_3Al_5O_{12}:Ce^{3+}$, or the like) which has difficulty in excitation by the output light of the light emitting element 101 is used. Thus, it is possible to further improve emission efficiency of the light source devices 15 and 15'. Thus, it is possible to realize various emission spectra. Accordingly, it is possible to improve the degree of freedom for the design of the emission spectrum, and thus it is easier to obtain a desired emission spectrum in the light source devices 15 and 15'.

The transparent silicone resin layer 162 may not be disposed (FIG. 15(b)). The transparent silicone resin layer 162 is provided, and thus a lens effect is obtained. Accordingly, it is possible to expect improved light extraction efficiency or to narrow an angle of alignment characteristics in emission of light. In a case where the process is desired to be more simplified or the alignment characteristics in emission of light are desired to have a wide angle, it is desirable that the transparent silicone resin layer 162 is not disposed. In addition, in a case where the silicone resin layer 162 is assumed to simultaneously include the green phosphors 181 or the red phosphors 191 in addition to the blue phosphors 201, it is also possible to change the alignment characteristics in emission of light. As described above, it is possible to improve the degree of freedom for the design of the light source devices 15 and 15' in accordance with whether or not the transparent silicone resin layer 162 is disposed or whether or not the silicone resin layer 162 contains the phosphor. Thus, it is easier to obtain desired light emission characteristics in the light source devices 15 and 15'.

[Application of Illumination Apparatus, Backlight Apparatus, or the Like to Light Emitting Apparatus]

Since the light source devices 15 and 15' have the optical characteristics, the light source devices 15 and 15' can be used as a light source of a light emitting apparatus. That is, the light emitting apparatus in the embodiment includes the light source devices 15 and 15'. Thus, it is possible to provide the light emitting apparatus such as an illumination apparatus or a backlight apparatus, which has the optical characteristics. In the illumination apparatus or the backlight apparatus in the embodiment, components other than a light source device can be used without being limited to a configuration of a known illumination apparatus or a known backlight apparatus in the related art.

Embodiment 9

In Embodiment 9 according to the present invention, the light source device 16 includes each of the first light emitting element 101 and the second light emitting element 102 which have emission peaks in two kinds of wavelength regions. The number of first light emitting elements 101 included in the light source device 16 or the number of second light emitting elements 102 included in the light source device 16 is at least one or more. In the following descriptions, a case where one first light emitting element 101 and one second light emitting element 102 are mounted will be described as an example.

Figure 16:
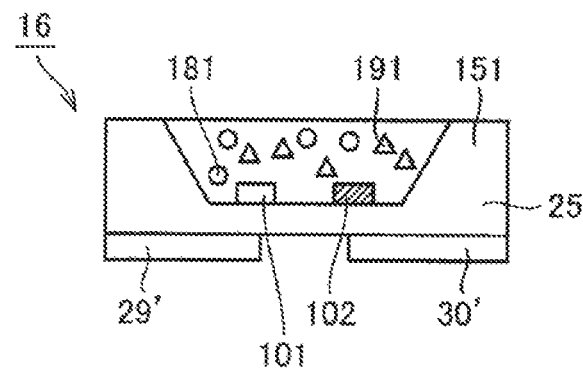
FIG. 16 is a cross-sectional view illustrating a light source device 16 according to Embodiment 9 of the present invention.

As illustrated in FIG. 16, one first light emitting element 101 and one second light emitting element 102 are mounted on a frame 25 in a light source device 16 in the embodiment. The phosphor-containing resin layer 160 is provided around the first light emitting element 101 and the second light emitting element 102 so as to cover the first light emitting element 101 and the second light emitting element 102. In the phosphor-containing resin layer 160, the green phosphors 181 and the red phosphors 191 are dispersed or precipitated in the resin 161.

The frame 25 is formed of a base resin of white resin. Thus, it is possible to provide the frame 25 which has visible-light reflection characteristics, that is, high light extraction efficiency.

Electrodes 29' and 30' are provided on the frame 25. Thus, the first light emitting element 101 and the second light emitting element 102 mounted on the frame 25 are connected to the electrodes 29' and 30' through a through electrode (not illustrated) for the supply of power. However, it is not necessarily limited to the through electrode. For example, the electrodes 29' and 30' may be formed on side surfaces of the substrate 25.

As described above, in the light source device 16 in the embodiment, the first phosphor-containing resin layer 160 in which the green phosphors 181 and the red phosphors 191 are dispersed or precipitated is provided so as to cover the first light emitting element 101 and the second light emitting element 102. In the first phosphor-containing resin layer 160, the resin 161 in which the green phosphors 181 and the red phosphors 191 are dispersed or precipitated is formed of transparent silicone resin.

The first light emitting element 101, the second light emitting element 102, and the first phosphor-containing resin layer 160 are provided on one surface of the frame 25 (in the following descriptions, described as "an upper surface of the frame 25"). The first phosphor-containing resin layer 160 seals the first light emitting element 101 and is provided in a region surrounded by a frame wall surface on the upper surface of the frame 25.

An inner circumferential surface of the wall surface of the frame 25 may be perpendicular to the upper surface of the frame 25. However, the inner circumferential surface of the frame wall surface is preferably inclined from the upper surface of the frame 25, so as to cause the diameter of an opening to be increased from the upper surface of the frame 25 toward the upper surface of the first phosphor-containing resin layer 160. Thus, it is possible to extract light with high efficiency.

The frame wall surface may not be provided. For example, if resin having high thixotropy is used as the resin 161, it is possible to prevent flowing of the resin 161 toward the peripheral edge of the upper surface of the frame 25 even though the frame wall surface is not provided. A surface mount type light source unit may be configured by using a substrate (for example, a flat substrate formed of ceramics) which has a shape of a rectangle in plan view and is different from the frame, for example, which has a recess portion illustrated in FIG. 16, as the frame 25.

[Optical Characteristics of Light Source Device]

As described above, similarly to the light source devices 15 and 15', the light source device 16 includes the first light emitting element 101 or the second light emitting element 102. Thus, it is possible to maintain the color rendering properties of the light source device 16 even in a case where the maximum intensity of the blue component included in light emitted by the light source device 16 is reduced to be small. Accordingly, it is possible to view a dark-blue or black irradiation target to be vividly dark-blue or black (see Embodiment 4). If clothes are irradiated with light emitted by the light source device 16, the fluorescent agent adhering to the clothes is excited to emit light. Thus, it is possible to view the clothes to be white more vividly (see Embodiment 4). With the above descriptions, if an irradiation target (for example, clothes or the like) is irradiated with light emitted by the light source device 16, it is possible to cause the white color, the dark blue color, and the black color to simultaneously look vivid (see Embodiment 4).

Preferably, in a case where all of the light emitting elements mounted in the light source device 16 are caused to turn on in a state where the phosphor is sealed by resin, it is preferable that the characteristics and the number of the light emitting elements and mounting arrangement of the light emitting elements are selected so as to satisfy Characteristic α and Characteristic β which are described above. Thus, it is easy to satisfy Characteristic A and Characteristic B, and it is possible to achieve causing the color of an irradiation target to look vivid, as the purpose of this application.

Preferably, the spectrum of light emitted by the light source device 16 has Characteristic A and Characteristic B, similarly to the spectrum of the light emitted by the light source devices 15 and 15'. Thus, if an irradiation target (for example, clothes or the like) is irradiated with light emitted by the light source device 16, it is possible to cause the white color, the dark-blue color, and the black color to simultaneously look more vivid (see Embodiment 4).

[Evaluation Method of Light Source Device]

An evaluation method of the light source device 16 includes a process of determining whether or not the light source device 16 has Characteristic A and Characteristic B, a process of evaluating the light source device to have fair quality in a case where it is determined that the spectrum of light emitted by the light source device 16 has Characteristic A and Characteristic B. The light source device which is evaluated to have fair quality has Characteristic A and Characteristic B. Thus, if an irradiation target (for example, clothes and the like) is irradiated with light emitted by the light source device which is evaluated to have fair quality, it is possible to cause the white color, the dark-blue color, and the black color to simultaneously look more vivid (see Embodiment 4).

[Different Form of Light Source Device]

The light source device 16 may further include components as follows.

The third light emitting element 103 may be used in addition to the first light emitting element 101 and the second light emitting element 102. The third light emitting element 108 has an emission peak in a wavelength region of longer than 440 nm and shorter than 460 nm. Thus, a variety of combination of the light emitting elements is increased and choice for the phosphor becomes wider. More specifically, it is possible to maintain high emission efficiency of green light even in a case where resin including the green phosphor 181 (for example, $Lu_3Al_5O_{12}:Ce^{3+}$, $Y_3Al_5O_{12}:Ce^{3+}$, $Y_3Al_5O_{12}:Ce^{3+}$, or the like) which has difficulty in excitation by the output light of the light emitting-element 101 is used. Thus, it is possible to further improve emission efficiency of the light source device 16. Thus, it is possible to realize various emission spectra. Accordingly, it is possible to improve the degree of freedom for the design of the emission spectrum, and thus it is easier to obtain a desired emission spectrum in the light source device 16.

[Application of Illumination Apparatus, Backlight Apparatus, or the Like to Light Emitting Apparatus]

Since the light source device 16 has the optical characteristics, the light source device 16 can be used as a light source of a light emitting apparatus. That is, the light emitting apparatus in the embodiment includes the light source device 16. Thus, it is possible to provide the light emitting apparatus such as an illumination apparatus or a backlight apparatus, which has the optical characteristics. In the illumination apparatus or the backlight apparatus in the embodiment, components other than a light source device can be used without being limited to a configuration of a known illumination apparatus or a known backlight apparatus in the related art.

Embodiment 10

In Embodiment 10 according to the present invention, the light source device 17 includes each of the first light emitting element 101, the second light emitting element 102, and the third light emitting element 103. The number of first light emitting elements 101 included in the light source device 17, the number of second light emitting elements 102 included in the light source device 17, or the number of third light emitting elements 103 included in the light source device 17 is at least one or more. In the following descriptions, a case where one first light emitting element 101, one second light emitting element 102, and one third light emitting element 103 are mounted will be described as an example.

Figure 17:
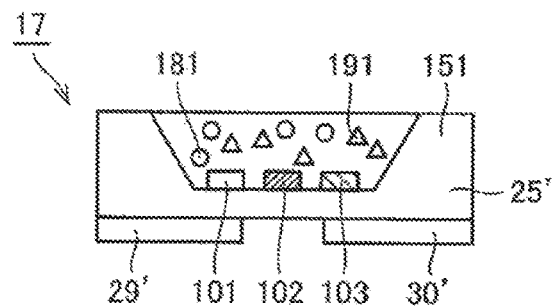
FIG. 17 is a cross-sectional view illustrating a light source device 17 according to Embodiment 10 of the present invention.

As illustrated in FIG. 17, one first light emitting element 101, one second light emitting element 102, and one third light emitting element 103 are mounted on a frame 25' in a light source device 17 in the embodiment. The phosphor-containing resin layer 160 is provided around the first light emitting element 101, the second light emitting element 102, and the third light emitting element 103 so as to cover the first light emitting element. 101, the second light emitting element 102, and the third light emitting element 103. In the phosphor-containing resin layer 160, the green phosphors 181 and the red phosphors 191 are dispersed or precipitated in the resin 161.

The frame 25' is formed of a base resin of white resin. Thus, it is possible to provide the frame 25' which has visible-light reflection characteristics, that is, high light extraction efficiency.

Electrodes 29' and 30' are provided on the frame 25'. Thus, the first light emitting element 101, the second light emitting element 102, and the third light emitting element 103 mounted on the frame 25' are connected to the electrodes 29' and 30' through a through electrode (not illustrated) for a supply of power. However, it is not necessarily limited to the through electrode. For example, the electrodes 29' and 30' may be formed on side surfaces of the frame 25'.

As described above, in the light source device 17 in the embodiment, the first phosphor-containing resin layer 160 in which the green phosphors 181 and the red phosphors 191 are dispersed or precipitated is provided so as to cover the first light emitting element 101, the second light emitting element 102, and the third light emitting element 103. In the first phosphor-containing resin layer 160, the resin 161 in which the green phosphors 181 and the red phosphors 191 are dispersed or precipitated is formed of transparent silicone resin.

The first light emitting element 101, the second light emitting element 102, the third light emitting element 103, and the first phosphor-containing resin layer 160 are provided on one surface of the frame 25' (in the following descriptions, described as "an upper surface of the frame 25'"). The first phosphor-containing resin layer 160 seals the first light emitting element 101 and is provided in a region surrounded by a frame wall surface on the upper surface of the frame 25'.

An inner circumferential surface of the wall surface of the frame 25' may be perpendicular to the upper surface of the frame 25'. However, the inner circumferential surface of the frame wall surface is preferably inclined from the upper surface of the frame 25', so as to cause the diameter of an opening to be increased from the upper surface of the frame 25' toward the upper surface of the first phosphor-containing resin layer 160. Thus, it is possible to extract light with high efficiency.

The frame wall surface may not be provided. For example, if resin having high thixotropy is used as the resin 161, it is possible to prevent flowing of the resin 161 toward the peripheral edge of the upper surface of the frame 25' even though the frame wall surface is not provided. A surface mount type light source unit may be configured by using a substrate (flat substrate formed of ceramics) which has a shape of a rectangle in plan view and is different from the frame, for example, which has a recess portion illustrated in FIG. 17, as the frame 25'.

[Optical Characteristics of Light Source Device]

As described above, the light source device 17 includes the first light emitting element 101, the second light emitting element 102, and the third light emitting element 103. Thus, it is possible to maintain the color rendering properties of the light source device 17 even in a case where the maximum intensity of the blue component included in light emitted by the light source device 17 is reduced to be small. Accordingly, it is possible to view a dark-blue or black irradiation target to be vividly dark-blue or black (see Embodiment 4). If clothes are irradiated with light emitted by the light source device 17, the fluorescent agent adhering to the clothes is excited to emit light. Thus, it is possible to view the clothes to be white more vividly (see Embodiment 4). With the above descriptions, if an irradiation target (for example, clothes or the like) is irradiated with light emitted by the light source device 17, it is possible to cause the white color, the dark-blue color, and the black color to simultaneously look vivid (see Embodiment 4).

The light source device 17 includes the third light emitting element 103 and the third light emitting element 103 has an emission peak in a wavelength region of longer than 440 nm and shorter than 460 nm. Thus, a variety of combination of the light emitting elements is increased and choice for the phosphor becomes wider. More specifically, it is possible to maintain the high emission efficiency of green light even in a case where resin including the green phosphor 181 (for example, $Lu_3Al_5C_{12}:Ce^{3+}$, $Y_3Al_5O_{12}:Ce^{3+}$, or the like) which has difficulty in excitation by the output light of the first light emitting element 101 is used. Thus, it is possible to further improve emission efficiency of the light source device 17. Thus, it is possible to realize various emission spectra. Accordingly, it is possible to improve the degree of freedom for the design of the emission spectrum, and thus it is easier to obtain a desired emission spectrum in the light source device 17.

Preferably, in a case where all of the light emitting elements mounted in the light source device 17 are caused to turn on in a state where the phosphor is not sealed by resin, it is preferable that the characteristics and the number of the light emitting elements and mounting arrangement of the light emitting elements are selected so as to satisfy Characteristic α and Characteristic β which are described above. Thus, it is easy to satisfy Characteristic A and Characteristic B, and it is possible to achieve causing the color of an irradiation target to look vivid, as the purpose of this application.

Preferably, the spectrum of light emitted by the light source device 17 has Characteristic A and Characteristic B, similarly to the spectrum of the light emitted by the light source devices 15 and 16. Thus, if an irradiation target (for example, clothes or the like) is irradiated with light emitted by the light source device 17, it is possible to cause the white color, the dark-blue color, and the black color to simultaneously look more vivid (see Embodiment 4).

[Evaluation Method of Light Source Device]

An evaluation method of the light source device 17 includes a process of determining whether or not the light source device 17 has Characteristic A and Characteristic B, a process of evaluating the light source device to have fair quality in a case where it is determined that the spectrum of light emitted by the light source device 17 has Characteristic A and Characteristic B. The light source device which is evaluated to have fair quality has Characteristic A and Characteristic B. Thus, if an irradiation target (for example, clothes and the like) is irradiated with light emitted by the light source device which is evaluated to have fair quality, it is possible to cause the white color, the dark-blue color, and the black color to simultaneously look more vivid (see Embodiment 4).

[Application or Illumination Apparatus, Backlight Apparatus, or the Like to Light Emitting Apparatus]

Since the light source device 17 has the optical characteristics, the light source device 17 can be used as a light source of a light emitting apparatus. That is, the light emitting apparatus in the embodiment includes the light source device 17. Thus, it is possible to provide the light emitting apparatus such as an illumination apparatus or a backlight apparatus, which has the optical characteristics. In the illumination apparatus or the backlight apparatus in the embodiment, components other than a light source device can be used without being limited to a configuration of a known illumination apparatus or a known backlight apparatus in the related art.

Embodiment 11

In Embodiment 11 according to the present invention, a light source device includes two or more light source units. In the following descriptions, differences from Embodiment 4 will be mainly described.

Figure 18:
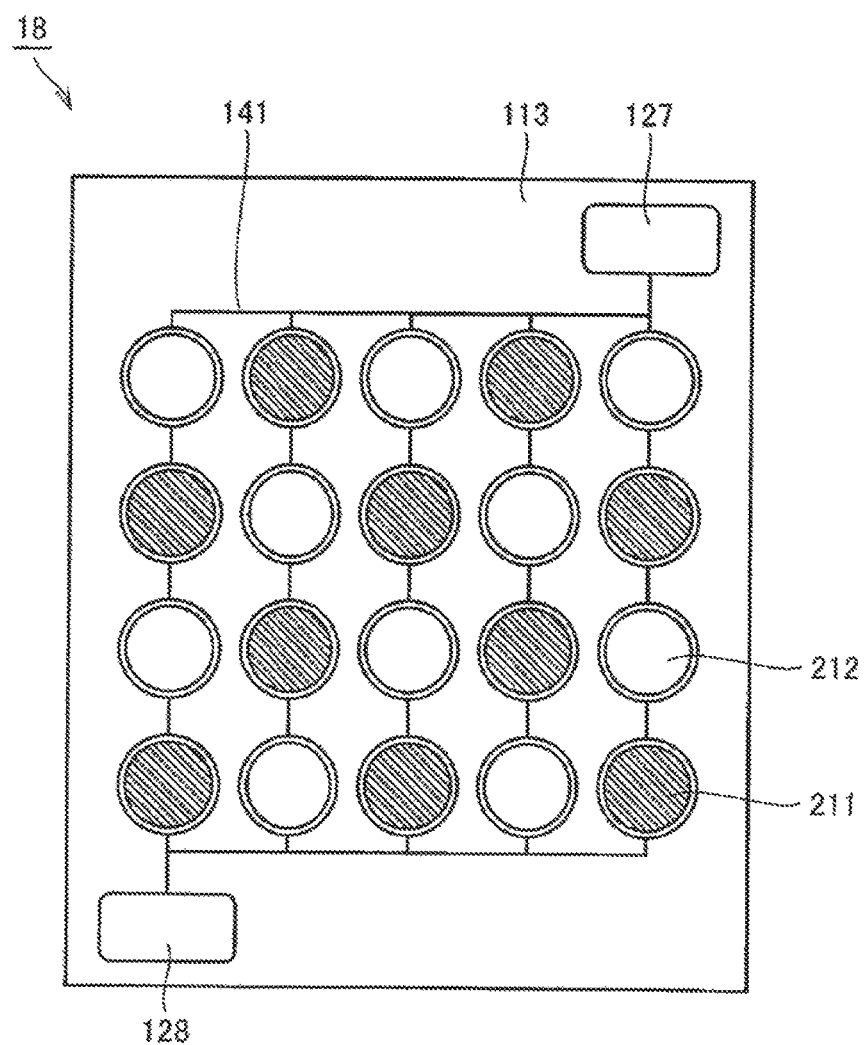
FIG. 18 is a plan view illustrating a light source device 18 according to Embodiment 11 of the present invention.

FIG. 18 is a plan view schematically illustrating a configuration of a light source device 18 in the embodiment. The light source device 18 in the embodiment includes a substrate 113, a first light source unit 211, and a second light source unit 212.

(Substrate)

The substrate 113 is a substrate for mounting the first light source unit 211 and the second light source unit 212 thereon. The substrate 113 may be formed of ceramics such as aluminum oxide or aluminum nitride, or may be formed of metal such as aluminum or copper. The substrate 113 preferably has a shape of a rectangle in plan view. The first light source unit 211 and the second light source unit 212 are provided on one surface of the substrate 113 (in the following descriptions, described as "an upper surface of the substrate 113").

The arrangement form of first light source units 211 and second light source units 212 is not particularly limited. However, it is preferable that the first light source units 211 and the second light source units 212 are alternately arranged at an equal interval on the upper surface of the substrate 113. Thus, the mixing state (mixing state of colors) of the output light of the first light source unit 211 and the output light of the second light source unit 212 is easily uniformalized. Accordingly, it is possible to reduce the occurrence of the luminance irregularity. Accordingly, it is possible to maintain high optical characteristics of the light source device 15.

Further, a seventh electrode land 127, an eighth electrode land 128, and a wire 141 are provided on the upper surface of the substrate 113. The seventh electrode land 127 and the eighth electrode land 128 are provided on an outside (circumference side) of the first light source unit 211 and the second light source unit 212 on the upper surface of the substrate 113. The electrode lands 127 and 128 are preferably provided at the corners of the upper surface of the substrate 113, and more preferably provided on a diagonal line of the upper surface of the substrate 113. The surface of each of the seventh electrode land 127 and the eighth electrode land 128 is exposed, and thus the seventh electrode land 127 and the eighth electrode land 128 are allowed to be connected to an external terminal. That is, one of the seventh electrode land 127 and the eighth electrode land 128 functions as an anode electrode for external connection and the other of the seventh electrode land 127 and the eighth electrode land 128 functions as a cathode electrode for the external connection.

The wire 141 connects the seventh electrode land 127 to the first light source unit 211 and the second light source unit 212, connects the eighth electrode land 128 to the first light source unit 211 and the second light source unit 212, and connects the first light source unit 211 and the second light source unit 212.

(First Light Source Unit)

Figure 19:
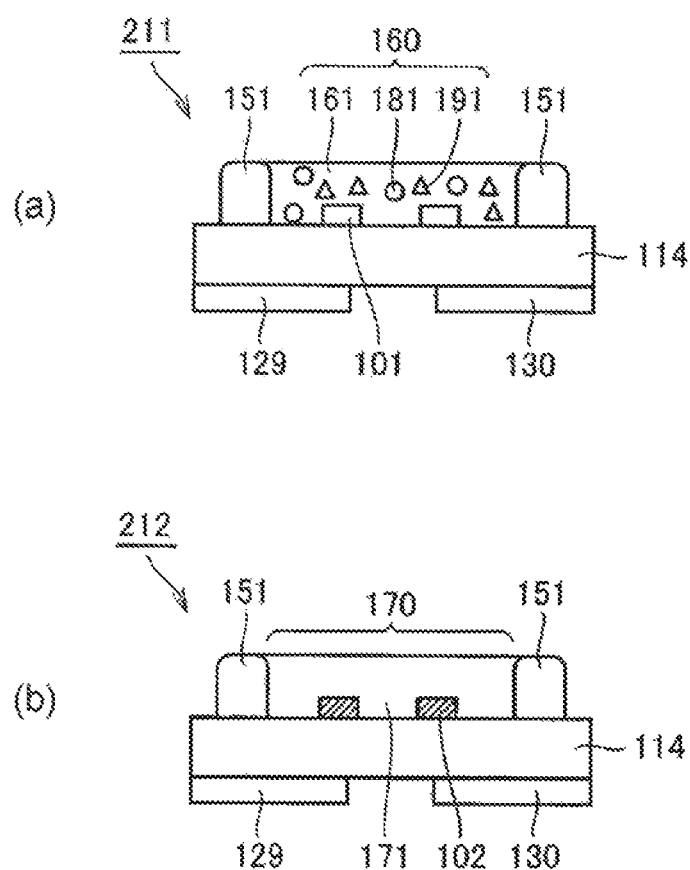
FIG. 19(a) is a cross-sectional view illustrating a first light source unit 211 of the light source device 18 illustrated in FIG. 18.
FIG. 19(b) is a cross-sectional view illustrating a second light source unit 212 of the light source device 18 illustrated in FIG. 18.

FIG. 19(a) is a cross-sectional view illustrating a configuration of the first light source unit 211. The first light source unit 211 includes a substrate 114, the first light emitting element 101, the dam ring 151, and the first phosphor-containing resin layer 160.

The first light emitting element 101, the dam ring 151, and the first phosphor-containing resin layer 160 are provided on one surface of the substrate 114 (in the following descriptions, described as "an upper surface of the substrate 114"). The first phosphor-containing resin layer 160 seals the first light emitting element 101 and is provided in a region surrounded by the dam ring 151 on the upper surface of the substrate 114.

A ninth electrode land 129 and a tenth electrode land 130 are provided on the other surface (in the following descriptions, described as "a lower surface of the substrate 114") of the substrate 114. The ninth electrode land 129 and the tenth electrode land 130 are provided at the corners of the lower surface of the substrate 114. The surface of each of the ninth electrode land 129 and the tenth electrode land 130 is exposed, and thus the ninth electrode land 129 and the tenth electrode land 130 are allowed to be connected to an external terminal. That is, one of the ninth electrode land 129 and the tenth electrode land 130 functions as an anode electrode for external connection and the other of the ninth electrode land 129 and the tenth electrode land 130 functions as a cathode electrode for the external connection.

The first light emitting element 101 is preferably connected to the ninth electrode land 129 and the tenth electrode land 130 through a wire (not illustrated). Thus, external power applied from an external terminal to the ninth electrode land 129 or the tenth electrode land 130 is supplied to the first light emitting element 101 through the wire. Accordingly, the first light emitting element 101 emits light.

The first light source unit 211 may include at least one of the second light emitting element 102 and the third light emitting element 103 instead of the first light emitting element 101, and may further include at least one of the second light emitting element 102 and the third light emitting element 103. The number of light emitting elements included in the first light source unit 211 is not particularly limited. For example, the first light source unit 211 may include two first light emitting elements 101 and two third light emitting elements 103. Thus, the light source device 15 is manufactured by using a light source unit which has various emission spectra. Accordingly, the light source device 15 is manufactured by combining light source units which have different emission spectra, in accordance with the purpose of a use of the light source device 15. Thus, it is possible to improve the degree of freedom for the design of the emission spectrum of the first light source unit 211, and thus it is easier to obtain a desired emission spectrum in the light source device 15.

The inner circumferential surface of the dam ring 151 may be perpendicular to the upper surface of the substrate 114. However, the inner circumferential surface of the dam ring 151 is preferably inclined from the upper surface of the substrate 114, so as to cause the diameter of an opening of the dam ring 151 to be increased from the upper surface of the substrate 114 toward the upper surface of the first phosphor-containing resin layer 160. Thus, it is possible to extract light from the first light source unit 211 with high efficiency. This is similarly applied to the second light source unit 212.

The dam ring 151 may not be provided. For example, if resin having high thixotropy is used as the resin 161, it is possible to prevent flowing of the resin 161 toward the peripheral edge of the upper surface of the substrate 114 even though the dam ring 151 is not provided. A surface mount type light source unit may be configured not by using the substrate (FIG. 19(a)) having a shape of a rectangle in plan view, but a substrate (for example, lead frame substrate) having a bathtub shape, as the substrate 114. This is similarly applied to the second light source unit 212.

If the first light emitting element 101 is allowed to be connected to the ninth electrode land 129 and the tenth electrode land 130 through the wire (not illustrated), the position of each of the ninth electrode land 129 and the tenth electrode land 130 on the lower surface of the substrate 114 is not limited to the position illustrated in FIG. 19(a). The ninth electrode land 129 and the tenth electrode land 130 may be provided on the upper surface of the substrate 114 or the side surface of the substrate 114. This is similarly applied to the second light source unit 212.

(Second Light Source Unit)

FIG. 19(b) is a cross-sectional view illustrating a configuration of the second light source unit 212. The second light source unit 212 includes the substrate 114, the second light emitting element 102, the dam ring 151, and the transparent resin layer 170.

The second light emitting element 102, the dam ring 151, and the transparent resin layer 170 are provided on the upper surface of the substrate 114. The transparent resin layer 170 seals the second light emitting element 102 and is provided in a region surrounded by the dam ring 151 on the upper surface of the substrate 114.

The ninth electrode land 129 and the tenth electrode land 130 are provided on the lower surface of the substrate 114. The ninth electrode land 129 and the tenth electrode land 130 are preferably provided at the corners of the lower surface of the substrate 114. The surface of each of the ninth electrode land 129 and the tenth electrode land 130 is exposed, and thus the ninth electrode land 129 and the tenth electrode land 130 are allowed to be connected to an external terminal. That is, one of the ninth electrode land 129 and the tenth electrode land 130 functions as an anode electrode for external connection and the other of the ninth electrode land 129 and the tenth electrode land 130 functions as a cathode electrode for the external connection.

The second light emitting element 102 is preferably connected to the ninth electrode land 129 and the tenth electrode land 130 through a wire (not illustrated). Thus, external power applied from an external terminal to the ninth electrode land 129 or the tenth electrode land 130 is supplied to the second light emitting element 102 through the wire. Accordingly, the second light emitting element 102 emits light.

The second light source unit 212 may include at least one of the first light emitting element 101 and the third light emitting element 103 instead of the second light emitting element 102. The second light source unit 212 may further include at least one of the first light emitting element 101 and the third light emitting element 103. The number of light emitting elements included in the second light source unit 212 is not particularly limited. If the second light source unit 212 includes two kinds or more of light emitting elements, a variety of combination of the light emitting elements is increased and choice for the phosphor becomes wider. Thus, it is possible to realize various emission spectra. Accordingly, it is possible to improve the degree of freedom for the design of the emission spectrum of the second light source unit 212, and thus it is easier to obtain a desired emission spectrum in the light source device 18.

[Optical Characteristics of Light Source Device]

As described above, similarly to the light source device 11, the light source device 18 includes the first light emitting element 101 and the second light emitting element 102. Thus, it is possible to maintain the color rendering properties of the light source device 18 even in a case where the maximum intensity of the blue component included in light emitted by the light source device 18 is reduced to be small. Accordingly, it is possible to view a dark-blue or black irradiation target to be vividly dark-blue or black (see Embodiment 4). If clothes are irradiated with light emitted by the light source device 18, the fluorescent agent adhering to the clothes is excited to emit light. Thus, it is possible to view the clothes to be white more vividly (see Embodiment 4). With the above descriptions, if an irradiation target (for example, clothes or the like) is irradiated with light emitted by the light source device 18, it is possible to cause the white color, the dark-blue color, and the black color to simultaneously look vivid (see Embodiment 4).

Preferably, in a case where all of the light emitting elements mounted in the light source device 18 are caused to turn on in a state where the phosphor is not sealed by resin, it is preferable that the characteristics and the number of the light emitting elements and mounting arrangement of the light emitting elements are selected so as to satisfy Characteristic α and Characteristic β which are described above. Thus, it is easy to satisfy Characteristic A and Characteristic B, and it is possible to achieve causing the color of an irradiation target to look vivid, as the purpose of this application.

Preferably, the spectrum of light emitted by the light source device 18 has Characteristic A and Characteristic B, similarly to the spectrum of the light emitted by the light source device 11. Thus, if an irradiation target (for example, clothes or the like) is irradiated with light emitted by the light source device 18, it is possible to cause the white color, the dark-blue color, and the black color to simultaneously look more vivid (see Embodiment 4).

[Evaluation Method of Light Source Device]

An evaluation method of the light source device 18 includes a process of determining whether or not the light source device 18 has Characteristic A and Characteristic B, a process of evaluating the light source device to have fair quality in a case where it is determined that the spectrum of light emitted by the light source device 18 has Characteristic A and Characteristic B. The light source device which is evaluated to have fair quality has Characteristic A and Characteristic B. Thus, if an irradiation target (for example, clothes and the like) is irradiated with light emitted by the light source device which is evaluated to have fair quality, it is possible to cause the white color, the dark-blue color, and the black color to simultaneously look more vivid (see Embodiment 4).

[Different Form of Light Source Device]

The light source device 18 may further include components as follows.

The light source device 18 may further include a third light source unit which includes the third light emitting element 103. Thus, in the third light source unit, it is possible to maintain the high emission efficiency of green light even in a case where the third light emitting element 103 is sealed by using resin including the green phosphor 181 (for example, $Lu_3Al_5O_{12}:Ce^{3+}$, $Y_3Al_5O_{12}:Ce^{3+}$, or the like) which has difficulty in excitation by the output light of the first light emitting element 101. Thus, it is possible to further improve emission efficiency of the light source device 18. Since the material of the green phosphor 181 can be selected in accordance with the purpose for using the light source device 18, performance of the light source device 18 is caused to be closer to the desired performance (see Embodiment 6).

An input circuit for a signal to the first light source unit 211 may be different from an input circuit for a signal to the second light source unit 212. Thus, a ratio of intensity of light from the first light source unit 211 and intensity of light from the second light source unit 212 can be changed. Accordingly, it is possible to provide light in accordance with the necessary scene. For example, it is possible to view an irradiation target to be more vividly white in a certain scene, and it is possible to improve emission efficiency of white light in another scene while vividness of the white color is suppressed (see Embodiment 7). It is possible to appropriately change the correlated color temperature of light emitted by the light source device 18 (see Embodiment 7).

[Application of Illumination Apparatus, Backlight Apparatus, or the Like to Light Emitting Apparatus]

Since the light source device 18 has the optical characteristics, the light source device 18 can be used as a light source of a light emitting apparatus. That is, the light emitting apparatus in the embodiment includes the light source device 18. Thus, it is possible to provide the light emitting apparatus such as an illumination apparatus or a backlight apparatus, which has the optical characteristics. In the illumination apparatus or the backlight apparatus in the embodiment, components other than a light source device can be used without being limited to a configuration of a known illumination apparatus or a known backlight apparatus in the related art.

Embodiment 12

Figure 20:
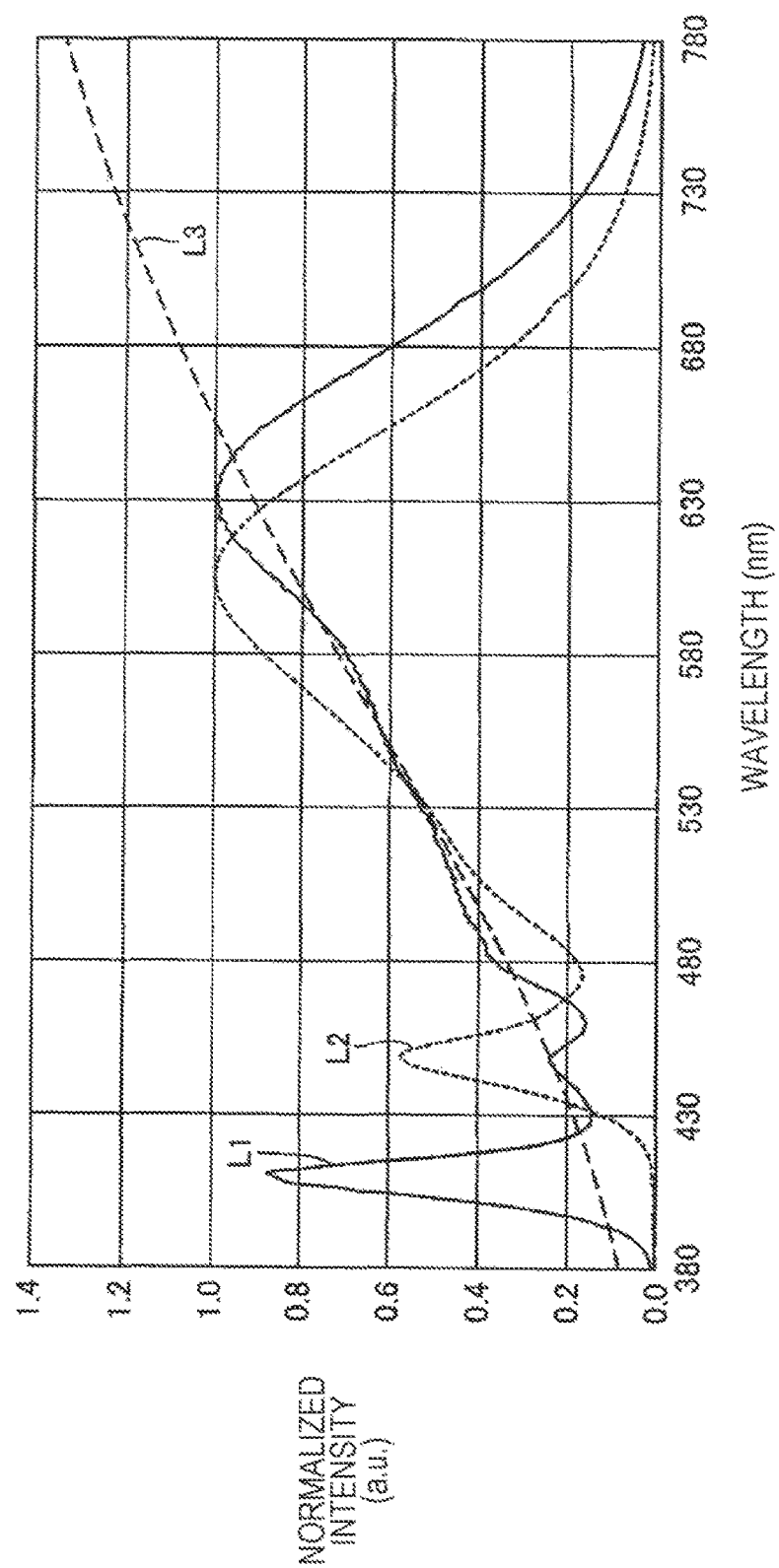
FIG. 20 is a graph illustrating optical characteristics of light emitted by the light source device in Embodiment 6 of the present invention.

In Embodiment 12 according to the present invention, the optical characteristics of the light source device in Embodiment 6 (in the following descriptions, described as "the light source device in an example") are confirmed. FIG. 20 is a graph illustrating the optical characteristics of light emitted by the light source device in the example. In FIG. 20, L1 indicates the spectrum of light emitted by the light source device in the example. L2 indicates the emission spectrum of a light source device (in the following descriptions, described as "a light source device in a reference example") in a case where a light emitting element in which a peak wavelength of output light is 450 nm is used as an excitation light source. L3 indicates the spectrum of light emitted by a halogen bulb. All of L1 to L3 are spectra in a case where the correlated color temperature of light emitted by the light source device is 3000 K. Table 1 shows a ratio of the integrated intensity of light in the wavelength region of 380 nm to 430 nm to the integrated intensity of light in the wavelength region of 380 nm to 780 nm, and a ratio of the integrated intensity of light in the wavelength region of 460 nm to 490 nm to the integrated intensity of light in the wavelength region of longer than 440 nm and shorter than 460 nm, in three emission spectra illustrated in FIG. 20.

TABLE 1

|  | (Integrated intensity of light in wavelength region of 380 nm to 430 nm)/ (integrated intensity of light in wavelength region of 380 nm to 780 nm) × 100 [%] | (Integrated intensity of light in wavelength region of 460 nm to 490 nm)/ (integrated intensity of light in wavelength region of longer than 440 nm and shorter than 460 nm) × 100 [%] |
|---|---|---|
| Light source device in example (L1 in FIG. 20) | 8.6 (satisfying Characteristic A) | 212.1 (satisfying Characteristic B) |
| Light source device in reference example (L2 in FIG. 20) | 1.8 (not satisfying Characteristic A) | 54.4 (not satisfying Characteristic B) |
| Halogen bulb (L3 in FIG. 20) | 1.7 (not satisfying Characteristic A) | 204.3 (satisfying Characteristic B) |

The light source device in the example includes a first light emitting element (peak wavelength of output light is 470 nm), a second light emitting element (peak wavelength of output light is 405 nm), and a third light emitting element (peak wavelength of output light is 450 nm). The light source device in the example and a light source device in the reference example include $Lu_3Al5O12:Ce^{3+}$ as the green phosphor and $Sr_xCa_{1-x}AlSiN:Eu^{2+}$ as the red phosphor.

As understood from FIG. 20 and Table 1, regarding the ratio of the integrated intensity of light in the wavelength region of 460 nm to 490 nm to the integrated intensity of light in the wavelength region of longer than 440 nm and shorter than 460 nm, the light source device in the example is higher than the light source device in the reference example, and the light source device in the example and the halogen bulb are not changed much. Thus, in a case where light emitted by the light source device in the example is used, it is considered that a dark-blue or black irradiation target is viewed to be dark-blue or black more vividly than that in a case where light emitted by the light source device in the reference example is used.

As understood from FIG. 20 and Table 1, regarding the ratio of the integrated intensity of light in the wavelength region of 380 nm to 430 nm to the integrated intensity of light in the wavelength region of 380 nm to 780 nm, the light source device in the example is higher than the light source device in the reference example and the halogen bulb. Thus, the light emitted by the light source device in the example has high capability of exciting the fluorescent agent adhering to clothes in comparison to the light emitted by the light source device in the reference example and light emitted by the halogen bulb. Accordingly, it is considered that an irradiation target is viewed to be more vividly white.

As understood from FIG. 20 and Table 1, even though the light emitted by the light source device in the example, the light emitted by the light source device in the reference example, and the light emitted by the halogen bulb have the same correlated color temperature, only the light source device in the example satisfies Characteristic A and Characteristic B. The light source device in the reference example and the halogen bulb are not able to simultaneously satisfy Characteristic A and Characteristic B. Thus, the light emitted by the light source device in the example causes an irradiation target to look more vivid white, dark-blue, or black than that of the light emitted by the light source device in the reference example and that of the light emitted by the halogen bulb.

Embodiment 13

In Embodiment 13 according to the present invention, a manufacturing method of the light source device in Embodiments 4 to 7 will be described. The first light source unit and the second light source unit in Embodiment 11 can be manufactured in accordance h with a similar method.

The manufacturing method of the light source device includes a process of mounting a light emitting element on a substrate, a process of forming a dam ring, and a process of sealing with resin. The manufacturing method of a light source device which includes 20 light emitting elements will be described.

<Mounting of Light Emitting Element>

In the process of mounting a light emitting element on a substrate, light emitting elements (for example, at least two or more light emitting elements among the first light emitting element 101, the second light emitting element 102, and the third light emitting element 103) are mounted on the upper surface of a substrate (for example, substrate 111 or substrate 112). In the following descriptions, a face-up type light emitting element which includes both of an anode electrode and a cathode electrode on the upper surface of the substrate will be described as an example of the light emitting element. The process of mounting the light emitting element on a substrate will be described. Examples of the light emitting element include a face-up type light emitting element, a light emitting element in which one of an anode electrode and a cathode electrode is provided on an upper surface and the other of the anode electrode and the cathode electrode is provided on a lower surface, and a flip chip type light emitting element. In a case where a light emitting element other than the face-up type light emitting element is used as the light emitting element, details of the process of mounting a light emitting element on a substrate are different from the following descriptions.

Specifically, firstly, for example, 20 light emitting elements are die-bonded on a substrate by using an adhesive resin such as silicon resin. At this time, it is preferable that the 20 light emitting elements are die-bonded in a region to be surrounded by a dam ring on the upper surface of the substrate. It is preferable that one element row is formed by alternately arranging 4 light emitting elements at an interval. That is, 5 element rows are preferably formed.

The light emitting element to be used is preferably an LED chip (for example, thickness of 100 to 180 μm) which has an appearance shape of a rectangle in plan view. One set or two sets of anode chip electrodes and cathode chip electrodes are preferably provided on the upper surface of the light emitting element. It is preferable that the anode chip electrode opposes the cathode chip electrode.

Then, wire bonding is performed. At this time, wire bonding is performed on a conductive wire and the chip electrode for the light emitting element which is disposed to be adjacent to the conductive wire. For the light emitting elements other than the above light emitting element, wire bonding is performed on the chip electrode of one light emitting element and the chip electrode of another light emitting element. Thus, in an element row, the 4 light emitting elements are connected to each other in series, and element rows are connected in parallel with each other.

<Forming of Dam Ring>

In the process of forming a dam ring, a dam ring is formed on the upper surface of the substrate so as to cover the conductive wire.

Specifically, firstly, for example, silicon resin (liquid state) including an alumina filler is drawn at predetermined positions on the upper surface of the substrate while the silicon resin is discharged from an opening portion (shape: circle) of a nozzle of a resin discharge apparatus. Then, the silicon resin is cured by heating (curing temperature: for example, 120° C., curing time: for example, 1 hour), thereby the dam ring is formed.

The width of the formed dam ring is preferably 0.3 mm to 2.0 mm, and more preferably 0.5 mm to 1.2 mm, for example, 0.9 mm. It is preferable that the top portion of the dam ring is positioned at a position which is higher than the upper surface of the light emitting element (position far from the upper surface of the substrate), and is positioned at a position which is higher than the wire (wire loop) that connects the light emitting elements. Thus, the resin layer (for example, first phosphor-containing resin layer 160, transparent resin layer 170, second phosphor-containing resin layer 260, and third phosphor-containing resin layer 270) can be formed so as to cause the light emitting elements and wires not to be exposed. Accordingly, it is possible to protect the light emitting element and the wires.

Some or all of the wires connected to the conductive wire can also be covered by the dam ring. Thus, it is possible to reduce or suppress an occurrence of exfoliation of the wire.

The shape of the opening portion of the nozzle in the resin discharge apparatus is not limited to a circle, and may be, for example, a drawn shape (for example, annular shape) of the dam ring. Thus, it is possible to form the dam ring with one discharge from the opening portion of the nozzle, and thus it is possible to manufacture the dam having no joint, within a short period of time. If a joint is provided on the dam ring, the dam ring may be expanded at the joint. Thus, the dam ring is easily broken at the joint. However, if the joint is not provided on the dam ring, it is possible to prevent breaking of the dam ring. Thus, it is possible to prevent leakage of the resin layer from a broken position of the dam ring.

<Sealing with Resin>

In the process of sealing with resin, resin (for example, resin 171) or a kneaded mixture (for example, kneaded mixture of the resin 161 and at least two kinds of phosphors among the green phosphor 181, the red phosphor 191, and the blue phosphor 201, or kneaded mixture of the resin 171 and at least two kinds of phosphors among the green phosphor 181, the red phosphor 191, and the blue phosphor 201) is provided on the upper surface of the substrate.

Specifically, firstly, the kneaded mixture is injected so as to cause a region surrounded by the dam ring on the upper surface of the substrate to be filled with the kneaded mixture. Then, resin included in the kneaded mixture is cured at a predetermined temperature for a predetermined time. Thus, the light emitting elements and the wires are covered by the resin layer, and thus the light emitting elements and the wires are protected. Even in a case of using resin which does not include the phosphor, the sealing can be performed by a similar method.

An example of the manufacturing method of the light source device in Embodiments 1 to 7 and an example of the manufacturing method of the first light source unit and the second light source unit in Embodiment 11 will be described below.

(Example of Manufacturing Method of Light Source Devices 1, 1', 2, 2', 3, and 3' in Embodiments 1 to 3)

In the process of mounting the light emitting elements on the substrate, at least any of the light emitting elements 51 and 61 is mounted on the upper surface of the substrate 111 or toe substrate 24. In the process of sealing with resin, at least any of the light emitting elements 51 and 61 is sealed by using a kneaded mixture which includes the resin 161, the green phosphor 181, and the red phosphor 191. Further, if necessary, the transparent silicone resin layer 162 is disposed (FIG. 5(*a*)).

(Example of Manufacturing Method of Light Source Device 11 in Embodiment 4)

In the process of mounting the light emitting elements on the substrate, the first light emitting element 101 and the second light emitting element 102 are mounted on the upper surface of the substrate 111. In the process of sealing with resin, the first light emitting element 101 and the second light emitting element 102 are sealed by using a kneaded mixture which includes the resin 161, the green phosphor 181, and the red phosphor 191.

(Example of Manufacturing Method of Light Source Device 12 in Embodiment 5)

In the process of mounting the light emitting elements on the substrate, the first light emitting element 101 and the second light emitting element 102 are mounted on the upper surface of the substrate 111. In the process of sealing with resin, the first light emitting element 101 is sealed by using a kneaded mixture which includes the resin 161, the green phosphor 181, and the red phosphor 191, and the second light emitting element 102 is sealed by using the resin 171.

(Example of Manufacturing Method of Light Source Device 13 in Embodiment 6)

In the process of mounting the light emitting elements on the substrate, the first light emitting element 101, the second light emitting element 102, and the third light emitting element 103 are mounted on the upper surface of the substrate 111. In the process of sealing with resin, the first light emitting element 101, the second light emitting element 102, and the third light emitting element 103 are sealed by using a kneaded mixture which includes the resin 161, the green phosphor 181, and the red phosphor 191.

(Example of Manufacturing Method of Light Source Device 14 in Embodiment 7)

In the process of mounting the light emitting elements on the substrate, the first light emitting element 101 and the second light emitting element 102 are mounted on the upper surface of the substrate 112. Wire bonding is performed on the first light emitting element 101, the second light emitting element 102, and the third light emitting element 103 so as to cause the input circuit for a signal to the first light emitting element 101 and the third light emitting element 103 to be different from the input circuit for a signal to the second light emitting element 102.

In the process of sealing with resin, firstly, the second light emitting element 102 is sealed by using a resin which has high thixotropy, in accordance with a method similar to the drawing method of silicon resin including an alumina filler in the process of forming the dam ring 151. Then, the resin is preliminarily cured by curing (curing temperature: for example, 100° C., curing time: for example, 10 minutes). Then, the first light emitting element 101 and the third light emitting element 103 are sealed by using the kneaded mixture which includes the resin 161, the green phosphor 181, and the red phosphor 191. At this time, the kneaded mixture is injected to a region which is a portion of the region surrounded by the dam ring on the upper surface of the substrate and is divided by the resin which has been preliminarily cured. Alter that, resin having high thixotropy and the resin included in the kneaded mixture are cured.

(Example of Manufacturing Method of Light Source Device 18 in Embodiment 11)

In a case where the first light source unit 211 in Embodiment 11 is manufactured, in the process of mounting the light emitting elements on the substrate, the first light emitting element 101 is mounted on the upper surface of the substrate 114. In the process of sealing with resin, the first light emitting element 101 is sealed by using a kneaded mixture which includes the resin 161, the green phosphor 181, and the red phosphor 191.

In a case where the second light source unit 212 in Embodiment 11 is manufactured, in the process of mounting the light emitting elements on the substrate, the second light emitting element 102 is mounted on the upper surface of the substrate 114. In the process of sealing with resin, the second light emitting element 102 is sealed by using the resin 171.

If the first light source unit 211 and the second light source unit 212 which are obtained in a manner as described above are mounted on the upper surface of the substrate 113, the light source device 18 in Embodiment 11 is obtained.

Other Embodiments

A combination of two or more of the light source devices in Embodiments 1 to 11 may be used as the light source of a light emitting apparatus.

Conclusion of Embodiments 4 to 7 and 11

The light source devices 11, 12, 13, 14, and 18 include two kinds or more of light emitting elements 101, 102, and 103 having peak wavelengths of output light, which are different from each other, and two kinds or more of phosphors 181, 191, and 201 which are excited by output light of at least one kind of light emitting elements 101, 102, and 103 so as to emit light. The two kinds or more of light emitting elements 101, 102, and 103 include one kind or more of light emitting elements 101 and 103 having a peak wavelength of output light in the first wavelength region of longer than 440 nm and 490 nm or shorter, and one kind or more of light emitting elements 102 having a peak wavelength of output light in the second wavelength region of 380 nm to 440 nm. Thus, it is possible to cause the white color, the dark-blue color, and the black color to simultaneously look vivid when an irradiation target is irradiated.

One kind or more of light emitting elements having a peak wavelength of output light in the first wavelength region preferably includes the light emitting element (first light emitting element) 101 which has a peak of output light in the wavelength region of 460 nm to 490 nm. More preferably, the one kind or more of light emitting elements include the light emitting element (first light emitting element) 101 which has a peak of output light in the wavelength region of 460 nm to 490 nm, and the light emitting element (third light emitting element) 103 which has a peak of output light in the wavelength region of longer than 440 nm and shorter than 460 nm. Thus, it is easy to realize the light source devices 11, 12, 13, 14, and 18 (realize the light source device which is able to cause the white color, the dark-blue color, and the black color to simultaneously look vivid when an irradiation target is irradiated).

It is preferable that the two kinds or more of light emitting elements 101, 102, and 103 are sealed by the resin layers 160, 260, and 270 which include at least one kind of phosphors 181, 191, and 201. Thus, the light source devices 11, 12, 13, 14, and 18 are easily manufactured.

At least one kind of light emitting elements 101 and 103 among the two kinds or more of light emitting elements 101, 102, and 103 are preferably sealed by the resin layers 160, 260, and 270 which include at least one kind of phosphors 181, 191, and 201. At least one kind of light emitting elements 102 among the remaining light emitting elements are preferably sealed by the resin layer 170 which does not include the phosphor. Thus, it is possible to excite the phosphors 181, 191, and 201 by using the light emitting element which has high excitation efficiency for the phosphors 181, 191, and 201. Thus, it is possible to further improve emission efficiency of the light source devices 11, 12, 13, 14, and 18.

The input circuit for a signal to the second light emitting element 102 is preferably different from the input circuit for a signal to the light emitting element having a different kind from that of the second light emitting element 102. Thus, it is possible to adjust vividness of the white color depending on an irradiation target. It is possible to maintain the life span of each of the light emitting elements to be long and to maintain the emission efficiency of each of the light emitting elements.

It is preferable that the spectrum of light emitted by the light source devices 11, 12, 13, 14, and 18 has Characteristic A and Characteristic B. Thus, it is possible to cause the white color, the dark-blue color, and the black color to simultaneously look more vivid when an irradiation target is irradiated.

It is preferable that a light emitting apparatus includes the light source devices 11, 12, 13, 14, and 18 as the light source.

An evaluation method of the light source devices 11, 12, 13, 14, and 18 includes processes as follows: a process of determining whether or not the spectrum of light emitted by the light source devices 11, 12, 13, 14, and 15 which include two or more kinds of light emitting elements 101, 102, and 103 having different peak wavelengths of output light, and two or more kinds of phosphors 181, 191, and 201 which are excited by output light of at least one kind of light emitting elements 101, 102, and 103 so as to emit light has Characteristic A and Characteristic B; and a process of evaluating the light source device to have fair quality in a case where it is determined that the spectrum of light emitted by the light source devices 11, 12, 13, 14, and 15 has Characteristic A and Characteristic B. Thus, it is possible to cause the white color, the dark-blue color, and the black color to simultaneously look more vivid when an irradiation target is irradiated.

It should be considered that the embodiments and the examples described herein are just an example in all of the above-described points and it is not limited thereto. The scope of the present invention is not shown by the above descriptions but by claims, and it is intended that all changes are included in the meaning and the range which are equivalent to the claims.

REFERENCE SIGNS LIST

1, 1', 2, 2', 3, 3', 11, 11', 12, 12', 13, 13', 14, 14', 15, 15', 16, 17, 18 LIGHT SOURCE DEVICE
24 SUBSTRATE
25, 25' FRAME
29, 29', 30, 30' ELECTRODE
51, 61 LIGHT EMITTING ELEMENT
101 FIRST LIGHT EMITTING ELEMENT
102 SECOND LIGHT EMITTING ELEMENT
103 THIRD LIGHT EMITTING ELEMENT
111, 112, 113, 114 SUBSTRATE
121 FIRST ELECTRODE LAND
122 SECOND ELECTRODE LAND
123 THIRD ELECTRODE LAND
124 FOURTH ELECTRODE LAND
125 FIFTH ELECTRODE LAND
126 SIXTH ELECTRODE LAND
127 SEVENTH ELECTRODE LAND
128 EIGHTH ELECTRODE LAND
129 NINTH ELECTRODE LAND
130 TENTH ELECTRODE LAND
141 WIRE
151 DAM RING
160 FIRST PHOSPHOR-CONTAINING RESIN LAYER
161, 171 RESIN
170 TRANSPARENT RESIN LAYER
181 GREEN PHOSPHOR
191 RED PHOSPHOR
201 BLUE PHOSPHOR
211 FIRST LIGHT SOURCE UNIT
212 SECOND LIGHT SOURCE UNIT
260 SECOND PHOSPHOR-CONTAINING RESIN LAYER
270 THIRD PHOSPHOR-CONTAINING RESIN LAYER

The invention claimed is:

1. A light source device comprising:
   one kind of light emitting element having two kinds or more of different peak wavelengths, of which the number is one or more; and
   a phosphor to be excited by output light of the light emitting element,
   wherein the light source device has a peak wavelength of output light in a first wavelength region of longer than 440 nm and 490 nm or shorter, and has a peak wavelength of output light in a second wavelength region of 380 nm to 410 nm, and
   a spectrum of light emitted by the light source device has characteristics A and B,
   A: a ratio of integrated intensity of light in a wavelength region of 380 nm to 430 nm to integrated intensity of light in a wavelength region of 380 nm to 780 nm is equal to or greater than 2% and
   B: a ratio of integrated intensity of light in a wavelength region of 460 nm to 490 nm to integrated intensity of light in a wavelength region of longer than 440 nm and shorter than 460 nm is equal to or greater than 100%.

2. The light source device according to claim 1, wherein a spectrum of light emitted by the light source device in the state where the phosphor is not sealed with a resin has characteristics α and β,
   α: integrated intensity of light in a wavelength region of 380 nm to 440 nm is 3% to 200% with respect to integrated intensity of light in a wavelength region of longer than 440 nm and 490 nm or shorter and
   β: a ratio of integrated intensity of light in a wavelength region of 460 nm to 490 nm to integrated intensity of light in a wavelength region of longer than 440 nm and shorter than 460 nm is 20% to 200%.

3. The light source device according to claim 1, wherein the light source device has one or more peak wavelengths of output light in each of the two wavelength regions which include a wavelength region of longer than 440 nm and shorter than 460 nm and a wavelength region of 460 nm to 490 nm, in the first wavelength region which is longer than 440 nm and 490 nm or shorter.

4. The light source device according to claim 1, wherein the light emitting element has one or more peak wavelengths of output light in a first wavelength region of longer than 440 nm and 490 nm or shorter, and has one or more peak wavelengths of output light in a second wavelength region of 380 nm to 410 nm.

5. The light source device according to claim 1, wherein the light emitting element has an emission peak in each of wavelength ranges which include the first wavelength region of longer than 440 nm and 490 nm or shorter and the second wavelength region of 380 nm to 410 nm.

6. A light emitting apparatus or an illumination apparatus comprising:
the light source device according to claim 1.

* * * * *